United States Patent
Stanley et al.

(10) Patent No.: US 11,693,488 B2
(45) Date of Patent: *Jul. 4, 2023

(54) VOICE-CONTROLLED ELECTRONIC DEVICE

(71) Applicant: APPLE INC., Cupertino, CA (US)

(72) Inventors: Craig M. Stanley, Campbell, CA (US); Simon K. Porter, San Jose, CA (US); John H. Sheerin, Santa Clara, CA (US); Glenn K. Trainer, San Francisco, CA (US); Ethan L. Huwe, Davis, CA (US); Sean T. McIntosh, Cupertino, CA (US); Jason C. Della Rosa, Campbell, CA (US); Christopher J. Stringer, Woodside, CA (US); Molly J. Anderson, San Francisco, CA (US); Erik L. Wang, Redwood City, CA (US)

(73) Assignee: APPLE INC., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/649,586

(22) Filed: Feb. 1, 2022

(65) Prior Publication Data

US 2022/0155876 A1    May 19, 2022

Related U.S. Application Data

(63) Continuation of application No. 16/803,858, filed on Feb. 27, 2020, now Pat. No. 11,256,338, which is a
(Continued)

(51) Int. Cl.
*G06F 3/02*    (2006.01)
*G06F 3/01*    (2006.01)
(Continued)

(52) U.S. Cl.
CPC .............. *G06F 3/0202* (2013.01); *F21V 3/00* (2013.01); *F21V 5/007* (2013.01);
(Continued)

(58) Field of Classification Search
None
See application file for complete search history.

(56) References Cited

U.S. PATENT DOCUMENTS

| 2,831,051 | A | 4/1958 | Teikowski |
| 3,054,856 | A | 9/1962 | Arany |

(Continued)

FOREIGN PATENT DOCUMENTS

| AU | 2017202861 | 7/2017 |
| AU | 2017332547 | 6/2018 |

(Continued)

OTHER PUBLICATIONS

First Examination Report issued in Australia Application No. AU2021261922, dated Sep. 8, 2022 in 2 pages.
(Continued)

*Primary Examiner* — Duc Nguyen
*Assistant Examiner* — Assad Mohammed
(74) *Attorney, Agent, or Firm* — Kilpatrick, Townsend and Stockton LLP

(57) ABSTRACT

A voice-controlled electronic device that includes a device housing having a longitudinal axis bisecting opposing top and bottom surfaces and a side surface extending between the top and bottom surfaces. The device can further include one or more microphones disposed within the device housing and distributed radially around the longitudinal axis; a processor configured to execute computer instructions stored in a computer-readable memory for interacting with a user and processing voice commands received by the one or more microphones and first transducer and second trans-
(Continued)

ducers configured to generate sound waves within different frequency ranges.

20 Claims, 36 Drawing Sheets

Related U.S. Application Data continuation of application No. 16/375,735, filed on Apr. 4, 2019, now Pat. No. 10,728,652, which is a continuation of application No. 15/613,054, filed on Jun. 2, 2017, now Pat. No. 10,609,473.

(60) Provisional application No. 62/507,007, filed on May 16, 2017, provisional application No. 62/399,229, filed on Sep. 23, 2016, provisional application No. 62/399,165, filed on Sep. 23, 2016, provisional application No. 62/399,288, filed on Sep. 23, 2016, provisional application No. 62/399,293, filed on Sep. 23, 2016, provisional application No. 62/399,262, filed on Sep. 23, 2016.

(51) Int. Cl.
| | | |
|---|---|---|
| *H04R 1/02* | (2006.01) | |
| *H04R 1/26* | (2006.01) | |
| *H04R 1/30* | (2006.01) | |
| *H04R 5/02* | (2006.01) | |
| *H04R 31/00* | (2006.01) | |
| *H03K 17/96* | (2006.01) | |
| *H05K 1/02* | (2006.01) | |
| *G06F 3/041* | (2006.01) | |
| *G06F 3/0354* | (2013.01) | |
| *H04R 3/00* | (2006.01) | |
| *H04R 7/12* | (2006.01) | |
| *H04R 7/18* | (2006.01) | |
| *H04R 9/02* | (2006.01) | |
| *H04R 9/06* | (2006.01) | |
| *H04R 1/40* | (2006.01) | |
| *H04R 3/12* | (2006.01) | |
| *H04R 1/28* | (2006.01) | |
| *G06F 3/16* | (2006.01) | |
| *F21V 3/00* | (2015.01) | |
| *F21V 5/00* | (2018.01) | |
| *F21V 23/04* | (2006.01) | |
| *F21V 33/00* | (2006.01) | |
| *H01H 13/02* | (2006.01) | |
| *H05K 1/14* | (2006.01) | |
| *G06F 3/044* | (2006.01) | |

(52) U.S. Cl.
CPC ...... *F21V 23/0485* (2013.01); *F21V 33/0056* (2013.01); *G06F 3/01* (2013.01); *G06F 3/016* (2013.01); *G06F 3/03547* (2013.01); *G06F 3/041* (2013.01); *G06F 3/165* (2013.01); *H01H 13/023* (2013.01); *H03K 17/962* (2013.01); *H04R 1/025* (2013.01); *H04R 1/026* (2013.01); *H04R 1/26* (2013.01); *H04R 1/2811* (2013.01); *H04R 1/2826* (2013.01); *H04R 1/2888* (2013.01); *H04R 1/30* (2013.01); *H04R 1/403* (2013.01); *H04R 3/00* (2013.01); *H04R 3/12* (2013.01); *H04R 5/02* (2013.01); *H04R 7/12* (2013.01); *H04R 7/127* (2013.01); *H04R 7/18* (2013.01); *H04R 9/022* (2013.01); *H04R 9/025* (2013.01); *H04R 9/06* (2013.01); *H04R 31/006* (2013.01); *H05K 1/0274* (2013.01); *G06F 3/044* (2013.01); *H03K 2217/960785* (2013.01); *H04R 2201/028* (2013.01); *H04R 2201/34* (2013.01); *H04R 2201/401* (2013.01); *H04R 2400/03* (2013.01); *H04R 2400/13* (2013.01); *H04R 2420/07* (2013.01); *H05K 1/141* (2013.01); *H05K 2201/09063* (2013.01); *H05K 2201/10106* (2013.01); *H05K 2201/10378* (2013.01)

(56) References Cited

U.S. PATENT DOCUMENTS

| | | |
|---|---|---|
| 3,105,113 A | 9/1963 | Olson |
| 3,500,953 A | 3/1970 | Lahti |
| 3,653,191 A | 4/1972 | Nelson et al. |
| 3,815,707 A | 6/1974 | Burhoe |
| 3,816,672 A | 6/1974 | Gefvert et al. |
| 3,818,138 A | 6/1974 | Sperrazza, Jr. |
| 3,931,867 A | 1/1976 | Janszen |
| 4,006,308 A | 2/1977 | Pönsgen |
| 4,051,919 A | 10/1977 | Buettner |
| 4,073,365 A | 2/1978 | Johnson |
| 4,223,760 A | 9/1980 | LeTourneau |
| 4,348,549 A | 9/1982 | Berlant |
| 4,369,949 A | 1/1983 | Zopf |
| 4,574,906 A | 3/1986 | White et al. |
| 4,673,057 A | 6/1987 | Glassco |
| 4,733,749 A | 3/1988 | Newman et al. |
| 4,796,009 A | 1/1989 | Biersach |
| 4,810,997 A | 3/1989 | Kudo et al. |
| 4,916,675 A | 4/1990 | Hoering |
| 4,923,031 A | 5/1990 | Carlson |
| 5,123,500 A | 6/1992 | Malhoit et al. |
| 5,146,508 A | 9/1992 | Bader et al. |
| 5,226,326 A | 7/1993 | Polen et al. |
| 5,227,591 A | 7/1993 | Tarkkonen |
| 5,451,726 A | 9/1995 | Haugum |
| 5,502,772 A | 3/1996 | Felder |
| 5,526,456 A | 6/1996 | Heinz |
| 5,590,214 A | 12/1996 | Nakamura |
| 5,704,578 A | 1/1998 | Fischer |
| 5,872,339 A | 2/1999 | Hanson |
| 5,875,255 A | 2/1999 | Campbell |
| 5,886,304 A | 3/1999 | Schlenzig et al. |
| 5,975,236 A | 11/1999 | Yamamoto et al. |
| 5,995,634 A | 11/1999 | Zwolski |
| 6,005,478 A | 12/1999 | Boreham et al. |
| 6,356,642 B1 | 3/2002 | Nakamura et al. |
| 6,393,131 B1 | 5/2002 | Rexroat |
| 6,411,718 B1 | 6/2002 | Danley et al. |
| 6,415,036 B1 | 7/2002 | Ritter et al. |
| 6,431,308 B1 | 8/2002 | Vollmer et al. |
| 6,570,494 B1 | 5/2003 | Leftridge, Sr. |
| 6,666,296 B1 | 12/2003 | Mathis et al. |
| 6,795,557 B1 | 9/2004 | Makivirta et al. |
| 7,046,816 B2 | 5/2006 | Vandersteen |
| 7,360,499 B1 | 4/2008 | O'Neill |
| 7,388,963 B2 | 6/2008 | Han et al. |
| 7,433,483 B2 | 10/2008 | Fincham |
| 7,506,721 B2 | 3/2009 | Moore |
| 7,760,899 B1 | 7/2010 | Graber |
| 7,835,536 B2 | 11/2010 | Inagaki et al. |
| 7,837,006 B1 | 11/2010 | Graber |
| 7,876,274 B2 | 1/2011 | Hobson et al. |
| 7,997,772 B2 | 8/2011 | Avtzon et al. |
| 8,027,500 B2 | 9/2011 | Fincham |
| 8,111,585 B1 | 2/2012 | Graber |
| 8,175,304 B1 | 5/2012 | North |
| 8,457,340 B2 | 6/2013 | Fincham |
| 8,462,976 B2 | 6/2013 | Tamaru |
| 8,577,048 B2 | 11/2013 | Chaikin et al. |
| 8,750,540 B2 | 6/2014 | Tan |
| 8,913,755 B2 | 12/2014 | Tracy |
| 9,036,858 B1 | 5/2015 | Reeves et al. |
| 9,049,504 B2 | 6/2015 | Ishibashi |
| 9,060,224 B1 | 6/2015 | List |
| 9,060,226 B2 | 6/2015 | Suzuki et al. |
| 9,224,096 B2 † | 12/2015 | Oppenheimer |

(56) References Cited

U.S. PATENT DOCUMENTS

| | | | |
|---|---|---|---|
| 9,294,860 B1 | 3/2016 | Carlson | |
| 9,304,736 B1* | 4/2016 | Whiteley | G06F 3/167 |
| 9,319,760 B2 | 4/2016 | Goel et al. | |
| 9,319,782 B1 | 4/2016 | Crump et al. | |
| 9,338,537 B2 | 5/2016 | Kircher | |
| 9,437,188 B1 | 9/2016 | Medina et al. | |
| 9,479,852 B2 | 10/2016 | Yang et al. | |
| 9,536,527 B1 | 1/2017 | Carlson | |
| 9,640,179 B1* | 5/2017 | Hart | G10L 21/0208 |
| 9,696,405 B1 | 7/2017 | Succi et al. | |
| 9,706,306 B1 | 7/2017 | List | |
| 9,838,789 B2 | 12/2017 | Merz | |
| 9,930,444 B1 | 3/2018 | Stanley et al. | |
| 9,947,333 B1 | 4/2018 | David | |
| 9,961,433 B2 | 5/2018 | Chawan et al. | |
| 9,967,650 B2 | 5/2018 | Chawan et al. | |
| 9,967,653 B2 | 5/2018 | Huwe et al. | |
| 10,015,584 B2 | 7/2018 | Johnson et al. | |
| 10,021,479 B1 | 7/2018 | Craig et al. | |
| 10,206,474 B2 | 2/2019 | Brzezinski et al. | |
| 10,210,885 B1 | 2/2019 | Carlson | |
| 10,257,608 B2 | 4/2019 | Della Rosa et al. | |
| 10,390,594 B2 | 8/2019 | Brzezinski et al. | |
| 10,524,044 B2 | 12/2019 | Sheerin et al. | |
| 10,587,950 B2 | 3/2020 | Huwe et al. | |
| 10,609,473 B2 | 3/2020 | Stanley et al. | |
| 10,631,071 B2 | 4/2020 | Wu et al. | |
| 10,652,650 B2 | 5/2020 | Johnson et al. | |
| 10,728,652 B2 | 7/2020 | Stanley et al. | |
| 10,834,497 B2 | 11/2020 | Stanley et al. | |
| 10,911,863 B2 | 2/2021 | Trainer et al. | |
| 11,256,338 B2 | 2/2022 | Stanley et al. | |
| 11,290,805 B2 | 3/2022 | Johnson et al. | |
| RE49,437 E | 2/2023 | Stanley et al. | |
| 2002/0057819 A1 | 5/2002 | Czerwinski et al. | |
| 2002/0118858 A1 | 8/2002 | White et al. | |
| 2002/0136423 A1 | 9/2002 | Fukuda | |
| 2003/0076969 A1 | 4/2003 | Han et al. | |
| 2003/0215099 A1* | 11/2003 | Daly | G10K 11/17833 |
| | | | 381/86 |
| 2003/0215107 A1 | 11/2003 | Werner | |
| 2004/0131199 A1 | 7/2004 | Moeller et al. | |
| 2004/0213429 A1 | 10/2004 | Seidler | |
| 2005/0008173 A1 | 1/2005 | Suzuki et al. | |
| 2005/0036645 A1 | 2/2005 | Carver | |
| 2005/0058300 A1 | 3/2005 | Suzuki et al. | |
| 2005/0081783 A1 | 4/2005 | Hong | |
| 2005/0129258 A1 | 6/2005 | Fincham | |
| 2005/0259841 A1 | 11/2005 | Caron et al. | |
| 2006/0147075 A1 | 7/2006 | Vu et al. | |
| 2006/0262941 A1 | 11/2006 | Tanase | |
| 2007/0041599 A1 | 2/2007 | Gauthier et al. | |
| 2007/0061409 A1 | 3/2007 | Rydenhag | |
| 2007/0133837 A1 | 6/2007 | Suzuki et al. | |
| 2007/0152977 A1 | 7/2007 | Ng et al. | |
| 2007/0269071 A1* | 11/2007 | Hooley | H04R 1/403 |
| | | | 381/335 |
| 2008/0025549 A1 | 1/2008 | Avera | |
| 2008/0110692 A1 | 5/2008 | Moore | |
| 2008/0143495 A1 | 6/2008 | Haase | |
| 2008/0207123 A1 | 8/2008 | Andersen | |
| 2008/0260178 A1 | 10/2008 | Tanaka | |
| 2009/0003630 A1 | 1/2009 | Kuroda et al. | |
| 2009/0147980 A1 | 6/2009 | Fincham | |
| 2009/0169041 A1 | 7/2009 | Zurek et al. | |
| 2009/0192638 A1 | 7/2009 | Van Leest et al. | |
| 2009/0245535 A1 | 10/2009 | Van Dijk | |
| 2009/0290358 A1 | 11/2009 | Nakamura | |
| 2009/0316947 A1 | 12/2009 | Liu | |
| 2010/0002899 A1 | 1/2010 | Tamaru | |
| 2010/0022285 A1 | 1/2010 | Randall et al. | |
| 2010/0057233 A1* | 3/2010 | Suzuki | H04W 52/0241 |
| | | | 700/94 |
| 2010/0097346 A1* | 4/2010 | Sleeman | G06F 3/0412 |
| | | | 345/174 |
| 2010/0135505 A1 | 6/2010 | Graebener et al. | |
| 2010/0254565 A1 | 10/2010 | Saitou et al. | |
| 2011/0018360 A1 | 1/2011 | Baarman et al. | |
| 2011/0019867 A1 | 1/2011 | Inagaki et al. | |
| 2011/0069856 A1 | 3/2011 | Blore et al. | |
| 2011/0168480 A1 | 7/2011 | Sterling et al. | |
| 2011/0211725 A1 | 9/2011 | Takewa et al. | |
| 2011/0235287 A1 | 9/2011 | Hou | |
| 2011/0249857 A1 | 10/2011 | Fletcher | |
| 2012/0033843 A1 | 2/2012 | Ouweltjes et al. | |
| 2012/0106747 A1 | 5/2012 | Crockett et al. | |
| 2012/0218211 A1 | 8/2012 | McRae et al. | |
| 2012/0219173 A1 | 8/2012 | Yukawa | |
| 2012/0281854 A1 | 11/2012 | Ishibashi et al. | |
| 2012/0319647 A1 | 12/2012 | Itabashi et al. | |
| 2013/0039523 A1 | 2/2013 | Van Dijk | |
| 2013/0058505 A1 | 3/2013 | Munch et al. | |
| 2013/0113423 A1 | 5/2013 | Baarman et al. | |
| 2013/0142371 A1 | 6/2013 | Martin et al. | |
| 2013/0181535 A1 | 7/2013 | Muratov et al. | |
| 2013/0204085 A1 | 8/2013 | Alexander et al. | |
| 2013/0223668 A1 | 8/2013 | Yang et al. | |
| 2013/0257366 A1 | 10/2013 | Scholz et al. | |
| 2013/0294638 A1* | 11/2013 | Huseby | H04R 1/02 |
| | | | 381/394 |
| 2014/0003645 A1 | 1/2014 | Silver et al. | |
| 2014/0055015 A1 | 2/2014 | Crippa et al. | |
| 2014/0064550 A1 | 3/2014 | Wiggins | |
| 2014/0091758 A1 | 4/2014 | Hidaka et al. | |
| 2014/0122059 A1 | 5/2014 | Patel et al. | |
| 2014/0126761 A1 | 5/2014 | Pham | |
| 2014/0140556 A1 | 5/2014 | Yim et al. | |
| 2014/0197782 A1 | 7/2014 | Graf et al. | |
| 2014/0203771 A1 | 7/2014 | Hsu et al. | |
| 2014/0205126 A1 | 7/2014 | Faranda et al. | |
| 2014/0219491 A1 | 8/2014 | Ludlum et al. | |
| 2014/0270225 A1 | 9/2014 | Gether | |
| 2014/0270269 A1 | 9/2014 | Hsieh | |
| 2014/0270270 A1 | 9/2014 | Ito | |
| 2014/0330560 A1* | 11/2014 | Venkatesha | G06F 3/167 |
| | | | 704/235 |
| 2014/0334659 A1 | 11/2014 | Decanio | |
| 2014/0341399 A1 | 11/2014 | Dusse et al. | |
| 2014/0341419 A1 | 11/2014 | Risberg et al. | |
| 2014/0348330 A1 | 11/2014 | Mosgaard | |
| 2014/0355806 A1 | 12/2014 | Graff | |
| 2014/0363035 A1 | 12/2014 | Zhao et al. | |
| 2015/0002088 A1 | 1/2015 | D'Agostino | |
| 2015/0012604 A1 | 1/2015 | Lee et al. | |
| 2015/0018992 A1* | 1/2015 | Griffiths | G11B 20/10527 |
| | | | 700/94 |
| 2015/0086044 A1 | 3/2015 | Zamir | |
| 2015/0086057 A1 | 3/2015 | Christner et al. | |
| 2015/0104054 A1 | 4/2015 | Adams | |
| 2015/0135108 A1* | 5/2015 | Pope | G06F 3/04897 |
| | | | 715/767 |
| 2015/0154976 A1 | 6/2015 | Mutagi | |
| 2015/0162767 A1 | 6/2015 | Oh et al. | |
| 2015/0245127 A1 | 8/2015 | Shaffer | |
| 2015/0270058 A1 | 9/2015 | Golko et al. | |
| 2015/0276914 A1 | 10/2015 | Mizutani | |
| 2015/0279387 A1 | 10/2015 | List | |
| 2015/0288067 A1 | 10/2015 | Kwon et al. | |
| 2015/0290373 A1 | 10/2015 | Rudser et al. | |
| 2015/0319515 A1 | 11/2015 | Devantier et al. | |
| 2015/0358734 A1 | 12/2015 | Butler et al. | |
| 2015/0365748 A1 | 12/2015 | Lee | |
| 2016/0021462 A1 | 1/2016 | Tomizawa et al. | |
| 2016/0069540 A1 | 3/2016 | Kjeldsen et al. | |
| 2016/0080845 A1 | 3/2016 | Williams et al. | |
| 2016/0127831 A1 | 5/2016 | Merz | |
| 2016/0198247 A1 | 7/2016 | Cheney et al. | |
| 2016/0241940 A1 | 8/2016 | Yang et al. | |
| 2016/0336902 A1 | 11/2016 | Waller, Jr. | |
| 2016/0345086 A1 | 11/2016 | Chamberlin et al. | |
| 2016/0372948 A1 | 12/2016 | Kvols | |
| 2017/0070820 A1 | 3/2017 | Behringer | |
| 2017/0070821 A1 | 3/2017 | Arknaes-Pedersen | |
| 2017/0093198 A1 | 3/2017 | Graham et al. | |

(56) References Cited

U.S. PATENT DOCUMENTS

| | | |
|---|---|---|
| 2017/0093454 A1 | 3/2017 | Chawan et al. |
| 2017/0110031 A1 | 4/2017 | Bariska, Jr. et al. |
| 2017/0238090 A1 | 8/2017 | Johnson et al. |
| 2017/0257705 A1 | 9/2017 | Guo et al. |
| 2017/0265006 A1 | 9/2017 | Cardas |
| 2017/0280231 A1 | 9/2017 | Johnson et al. |
| 2017/0289673 A1 | 10/2017 | Johnson et al. |
| 2017/0328170 A1 | 11/2017 | Hallundbaek et al. |
| 2018/0064224 A1 | 3/2018 | Brzezinski et al. |
| 2018/0087767 A1 | 3/2018 | Trainer et al. |
| 2018/0091878 A1 | 3/2018 | Della Rosa et al. |
| 2018/0091879 A1 | 3/2018 | Stanley et al. |
| 2018/0091888 A1 | 3/2018 | Huwe et al. |
| 2018/0091889 A1 | 3/2018 | Huwe et al. |
| 2018/0091894 A1 | 3/2018 | Sheerin et al. |
| 2018/0091896 A1 | 3/2018 | Stanley et al. |
| 2018/0091897 A1 | 3/2018 | Stanley et al. |
| 2018/0091901 A1 | 3/2018 | Stanley et al. |
| 2018/0220213 A1 | 8/2018 | Wu et al. |
| 2018/0227664 A9 | 8/2018 | Stanley et al. |
| 2019/0230434 A1 | 7/2019 | Stanley et al. |
| 2020/0204909 A1 | 6/2020 | Stanley et al. |

FOREIGN PATENT DOCUMENTS

| | | |
|---|---|---|
| AU | 2018204401 | 7/2018 |
| AU | 2018204493 | 7/2018 |
| AU | 2018204500 | 7/2018 |
| AU | 2017202861 | 11/2018 |
| AU | 2016219550 | 12/2018 |
| CN | 2137848 | 7/1993 |
| CN | 1089772 | 7/1994 |
| CN | 2580716 | 10/2003 |
| CN | 1606382 | 4/2005 |
| CN | 1620195 | 5/2005 |
| CN | 2703374 | 6/2005 |
| CN | 2757483 | 2/2006 |
| CN | 1799283 | 7/2006 |
| CN | 101395562 | 3/2009 |
| CN | 201345722 | 11/2009 |
| CN | 101790124 | 7/2010 |
| CN | 201813501 | 4/2011 |
| CN | 201814129 | 5/2011 |
| CN | 102257835 | 11/2011 |
| CN | 102655614 | 9/2012 |
| CN | 102845078 | 12/2012 |
| CN | 102868949 | 1/2013 |
| CN | 102981647 | 3/2013 |
| CN | 101331793 | 4/2013 |
| CN | 103069842 | 4/2013 |
| CN | 202931513 | 5/2013 |
| CN | 103262569 | 8/2013 |
| CN | 203273823 | 11/2013 |
| CN | 203340246 | 12/2013 |
| CN | 203399249 | 1/2014 |
| CN | 103574514 | 2/2014 |
| CN | 203423797 | 2/2014 |
| CN | 104301814 | 1/2015 |
| CN | 104604258 | 5/2015 |
| CN | 204408597 | 6/2015 |
| CN | 204482026 | 7/2015 |
| CN | 204539430 | 8/2015 |
| CN | 204618933 | 9/2015 |
| CN | 204697267 | 10/2015 |
| CN | 204707231 | 10/2015 |
| CN | 204887419 | 12/2015 |
| CN | 204929156 | 12/2015 |
| CN | 204993788 | 1/2016 |
| CN | 205017495 | 2/2016 |
| CN | 205039996 | 2/2016 |
| CN | 105407431 | 3/2016 |
| CN | 205195949 | 4/2016 |
| CN | 205249460 | 5/2016 |
| CN | 205265897 | 5/2016 |
| CN | 105679232 | 6/2016 |
| CN | 205305097 | 6/2016 |
| CN | 205596264 | 9/2016 |
| CN | 205945252 | 2/2017 |
| CN | 106558920 | 4/2017 |
| CN | 107113495 | 8/2017 |
| CN | 107872741 | 4/2018 |
| CN | 107872748 | 4/2018 |
| CN | 107872749 | 4/2018 |
| CN | 107872750 | 4/2018 |
| CN | 107872757 | 4/2018 |
| CN | 107872749 | 9/2019 |
| CN | 107872748 | 12/2019 |
| DE | 3623092 | 2/1988 |
| DE | 4422500 | 3/1995 |
| EP | 0252337 | 1/1988 |
| EP | 0762801 | 3/1997 |
| EP | 0767801 | 4/1997 |
| EP | 1071308 | 1/2001 |
| EP | 0762801 | 6/2001 |
| EP | 1137318 | 9/2001 |
| EP | 1965603 | 9/2008 |
| EP | 2493210 | 8/2012 |
| EP | 2613563 | 7/2013 |
| EP | 2645521 | 10/2013 |
| EP | 3151366 | 4/2017 |
| EP | 3202159 | 8/2017 |
| EP | 3399768 | 11/2018 |
| EP | 3151366 | 12/2018 |
| FR | 2627341 | 8/1989 |
| FR | 2632801 | 12/1989 |
| GB | 492098 | 9/1938 |
| GB | 2435207 | 8/2007 |
| GB | 2480226 | 11/2011 |
| GB | 2482204 | 1/2012 |
| JP | 5136931 | 3/1976 |
| JP | 5249324 | 12/1977 |
| JP | 02218295 | 8/1990 |
| JP | 03284096 | 12/1991 |
| JP | 04329799 | 11/1992 |
| JP | 5249324 | 4/1997 |
| JP | 09271095 | 10/1997 |
| JP | 10191572 | 7/1998 |
| JP | 2006109345 | 4/2006 |
| JP | 2006304189 | 11/2006 |
| JP | 2007027838 | 2/2007 |
| JP | 2007173922 | 7/2007 |
| JP | 2007174271 | 7/2007 |
| JP | 2008035133 | 2/2008 |
| JP | 2008042260 | 2/2008 |
| JP | 2008542798 | 11/2008 |
| JP | 2010099197 | 5/2010 |
| JP | 2010179735 | 8/2010 |
| JP | 2012004692 | 1/2012 |
| JP | 2012514967 | 6/2012 |
| JP | 2012531809 | 12/2012 |
| JP | 2013016984 | 1/2013 |
| JP | 2013062580 | 4/2013 |
| JP | 2013070606 | 4/2013 |
| JP | 5249324 | 7/2013 |
| JP | 2013141258 | 7/2013 |
| JP | 2013215079 | 10/2013 |
| JP | 2014131096 | 7/2014 |
| JP | 2015109705 | 6/2015 |
| JP | 2017070191 | 4/2017 |
| JP | 2017536001 | 11/2017 |
| JP | 2018123987 | 8/2018 |
| JP | 2018123988 | 8/2018 |
| JP | 6526185 | 6/2019 |
| JP | 6584596 | 10/2019 |
| JP | 6637112 | 12/2019 |
| JP | 6657323 | 2/2020 |
| KR | 20030075605 A | 9/2003 |
| KR | 20130055649 | 5/2013 |
| KR | 1020130069362 | 6/2013 |
| KR | 1020130080463 | 7/2013 |
| KR | 20140007794 | 1/2014 |
| KR | 20160033577 | 3/2016 |
| KR | 20160070838 | 6/2016 |
| KR | 20170093788 | 8/2017 |

(56) References Cited

FOREIGN PATENT DOCUMENTS

| | | |
|---|---|---|
| KR | 20180071406 | 6/2018 |
| KR | 20180071407 | 6/2018 |
| KR | 20180075657 | 7/2018 |
| KR | 20180080367 | 7/2018 |
| KR | 1020180080366 | 7/2018 |
| KR | 101973488 | 4/2019 |
| KR | 101987237 | 6/2019 |
| KR | 102045697 | 11/2019 |
| KR | 102048649 | 11/2019 |
| KR | 102049052 | 11/2019 |
| TW | 201714382 | 4/2017 |
| TW | I631788 | 8/2018 |
| WO | 0234006 | 4/2002 |
| WO | 2004030408 | 4/2004 |
| WO | 2006016156 | 2/2006 |
| WO | 2007149303 | 12/2007 |
| WO | 2010058211 | 5/2010 |
| WO | 2010104347 | 9/2010 |
| WO | 2011095222 | 8/2011 |
| WO | 2011096569 | 8/2011 |
| WO | 2012157114 | 11/2012 |
| WO | 2013093922 | 6/2013 |
| WO | 2013097850 | 7/2013 |
| WO | 2013124883 | 8/2013 |
| WO | 2014151857 | 9/2014 |
| WO | 2015073994 | 5/2015 |
| WO | 2015134278 | 9/2015 |
| WO | 2015198454 | 12/2015 |
| WO | 2016054100 | 4/2016 |
| WO | 2016089049 | 6/2016 |
| WO | 2018057146 | 3/2018 |

OTHER PUBLICATIONS

Non-Final Office Action issued in U.S. Appl. No. 15/965,552, dated Jul. 19, 2022 in 4 pages.
First Examination Report issued in India Application No. IN202018035197, dated Jul. 14, 2022 in 6 pages.
Notice of Decision to Grant issued in China Application No. CN202010198926.1, dated Aug. 18, 2022 in 2 pages.
Office Action issued in China Application No. CN202010198926.1, dated May 20, 2022 in 7 pages.
Office Action issued in European Application No. EP18187449.6, dated Jun. 2, 2022 in 9 pages.
Office Action European Application No. EP18187453.8, dated Jun. 2, 2022 in 7 pages.
Article entitled, "BT Monaural Speaker", LBT-SPP500 Series, Available online at: https://www.elecom.co.jp/products/LBT-SPP500BU.html, https://www. elecom.co.jp/support/manual/avd/speaker/lbt-spp500/lbt-spp500_v1.pdf, 2014 in 8 pages (of-record in parent application).
Article entitled, "UE Boom Wireless Speaker", Good Gear Guide, Accessed from Internet on: Dec. 11, 2019 in 8 pages (of-record in parent application).
Advisory Action issued in U.S. Appl. No. 14/871,890, dated Apr. 17, 2018 in 5 pages (of-record in parent application).
Final Office Action issued in U.S. Appl. No. 14/871,890, dated Jan. 11, 2018 in 18 pages (of-record in parent application).
Non-Final Office Action issued in U.S. Appl. No. 14/871,890, dated Jun. 5, 2017 in 17 pages (of-record in parent application).
Non-Final Office Action issued in U.S. Appl. No. 14/871,890, dated Sep. 28, 2018 in 19 pages (of-record in parent application).
Notice of Allowance issued in U.S. Appl. No. 14/871,890, dated May 9, 2019 in 9 pages (of-record in parent application).
Corrected Notice of Allowability issued in U.S. Appl. No. 15/513,955, dated Apr. 1, 2020 in 2 pages (of-record in parent application).
Corrected Notice of Allowability issued in U.S. Appl. No. 15/513,955, dated Feb. 13, 2020 in 2 pages (of-record in parent application).
Corrected Notice of Allowability issued in U.S. Appl. No. 15/513,955, dated Mar. 19, 2020 in 2 pages (of-record in parent application).
Final Office Action issued in U.S. Appl. No. 15/513,955, dated Apr. 11, 2019 in 20 pages (of-record in parent application).
Non-Final Office Action issued in U.S. Appl. No. 15/513,955, dated Aug. 26, 2019 in 18 pages (of-record in parent application).
Non-Final Office Action issued in U.S. Appl. No. 15/513,955, dated Oct. 23, 2018 in 23 pages (of-record in parent application).
Notice of Allowance issued in U.S. Appl. No. 15/513,955, dated Jan. 8, 2020 in 14 pages (of-record in parent application).
Corrected Notice of Allowability issued in U.S. Appl. No. 15/613,003, dated Jan. 30, 2019 in 4 pages (of-record in parent application).
Non-Final Office Action issued in U.S. Appl. No. 15/613,003, dated Jun. 1, 2018 in 14 pages (of-record in parent application).
Notice of Allowance issued in U.S. Appl. No. 15/613,003, dated Dec. 12, 2018 in 7 pages (of-record in parent application).
Non-Final Office Action issued in U.S. Appl. No. 15/613,054, dated Sep. 5, 2019 in 18 pages (of-record in parent application).
Non-Final Office Action issued in U.S. Appl. No. 15/613,054, dated Jul. 11, 2018 in 22 pages (of-record in parent application).
Notice of Allowance issued in U.S. Appl. No. 15/613,054, dated Feb. 27, 2019 in 7 pages (of-record in parent application).
Notice of Allowance issued in U.S. Appl. No. 15/613,054, dated Nov. 20, 2019 in 9 pages (of-record in parent application).
Supplemental Notice of Allowability issued in U.S. Appl. No. 15/613,054, dated Mar. 29, 2019 in 4 pages (of-record in parent application).
Supplemental Notice of Allowability issued in U.S. Appl. No. 15/613,054, dated May 8, 2019 in 4 pages (of-record in parent application).
Supplemental Notice of Allowability issued in U.S. Appl. No. 15/613,054, dated Dec. 30, 2019 in 5 pages (of-record in parent application).
Supplemental Notice of Allowability issued in U.S. Appl. No. 15/613,054, dated Feb. 26, 2020 in 5 pages (of-record in parent application).
Non-Final Office Action issued in U.S. Appl. No. 15/613,060, dated May 31, 2019 in 20 pages (of-record in parent application).
Notice of Allowance issued in U.S. Appl. No. 15/613,060, dated Oct. 21, 2019 in 8 pages (of-record in parent application).
Corrected Notice of Allowability issued in U.S. Appl. No. 15/613,063, dated Oct. 18, 2019 in 2 pages (of-record in parent application).
Corrected Notice of Allowability issued in U.S. Appl. No. 15/613,063, dated Oct. 29, 2019 in 2 pages (of-record in parent application).
Final Office Action issued in U.S. Appl. No. 15/613,063, dated Jan. 7, 2019 in 15 pages (of-record in parent application).
Non-Final Office Action issued in U.S. Appl. No. 15/613,063, dated Aug. 9, 2018 in 11 pages (of-record in parent application).
Non-Final Office Action issued in U.S. Appl. No. 15/613,063, dated Apr. 4, 2019 in 18 pages (of-record in parent application).
Notice of Allowance issued in U.S. Appl. No. 15/613,063, dated Aug. 26, 2019 in 11 pages (of-record in parent application).
Non-Final Office Action issued in U.S. Appl. No. 15/613,066, dated Dec. 2, 2019 in 12 pages (of-record in parent application).
Non-Final Office Action issued in U.S. Appl. No. 15/613,066, dated May 17, 2019 in 12 pages (of-record in parent application).
Notice of Allowance issued in U.S. Appl. No. 15/613,066, dated May 21, 2020 in 8 pages (of-record in parent application).
Corrected Notice of Allowability issued in U.S. Appl. No. 15/613,073, dated Jan. 6, 2021 in 2 pages (of-record in parent application).
Non-Final Office Action issued in U.S. Appl. No. 15/613,073, dated Jan. 27, 2020 in 9 pages (of-record in parent application).
Notice of Allowance issued in U.S. Appl. No. 15/613,073, dated Sep. 21, 2020 in 9 pages (of-record in parent application).
Advisory Action issued in U.S. Appl. No. 15/613,079, dated Feb. 7, 2020 in 5 pages (of-record in parent application).
Corrected Notice of Allowability issued in U.S. Appl. No. 15/613,079, dated Aug. 24, 2020, 2 pages.
Corrected Notice of Allowability issued in U.S. Appl. No. 15/613,079, dated Sep. 14, 2020, 2 pages.
Final Office Action issued in U.S. Appl. No. 15/613,079, dated Nov. 22, 2019 in 11 pages (of-record in parent application).
Non-Final Office Action issued in U.S. Appl. No. 15/613,079, dated Mar. 9, 2020 in 11 pages (of-record in parent application).

(56) References Cited

OTHER PUBLICATIONS

Non-Final Office Action issued in U.S. Appl. No. 15/613,079, dated Mar. 7, 2019 in 9 pages (of-record in parent application).
Notice of Allowance issued in U.S. Appl. No. 15/613,079, dated Jul. 14, 2020 in 7 pages (of-record in parent application).
Non-Final Office Action issued in U.S. Appl. No. 15/623,028, dated Jul. 24, 2017 in 8 pages (of-record in parent application).
Notice of Allowance issued in U.S. Appl. No. 15/623,028, dated Jun. 6, 2018 in 4 pages (of-record in parent application).
Notice of Allowance issued in U.S. Appl. No. 15/623,028, dated Nov. 7, 2017 in 5 pages (of-record in parent application).
Notice of Allowance issued in U.S. Appl. No. 15/623,028, dated Feb. 28, 2018 in 7 pages (of-record in parent application).
Corrected Notice of Allowability issued in U.S. Appl. No. 15/649,521, dated Apr. 26, 2018 in 5 pages (of-record in parent application).
First Action Interview Pilot Program Pre-Interview Communication issued in U.S. Appl. No. 15/649,521, dated Aug. 31, 2017 in 4 pages (of-record in parent application).
Notice of Allowance issued in U.S. Appl. No. 15/649,521, dated Nov. 9, 2017 in 15 pages (of-record in parent application).
Supplemental Notice of Allowability issued in U.S. Appl. No. 15/649,521, dated Dec. 26, 2017 in 2 pages (of-record in parent application).
Examiner-Initiated Interview Summary issued in U.S. Appl. No. 15/649,527, dated Feb. 14, 2018 in 1 page (of-record in parent application).
Non-Final Office Action issued in U.S. Appl. No. 15/649,527, dated Sep. 8, 2017 in 17 pages (of-record in parent application).
Notice of Allowance issued in U.S. Appl. No. 15/649,527, dated Jan. 9, 2018 in 9 pages (of-record in parent application).
Non-Final Office Action issued in U.S. Appl. No. 15/697,315, dated Jul. 3, 2018 in 10 pages (of-record in parent application).
Notice of Allowability issued in U.S. Appl. No. 15/697,315, dated Dec. 12, 2018 in 4 pages (of-record in parent application).
Notice of Allowance issued in U.S. Appl. No. 15/697,315, dated Nov. 6, 2018 in 5 pages (of-record in parent application).
Corrected Notice of Allowability issued in U.S. Appl. No. 15/937,587, dated Dec. 13, 2019 in 2 pages (of-record in parent application).
Corrected Notice of Allowability issued in U.S. Appl. No. 15/937,587, dated Nov. 8, 2019 in 2 pages (of-record in parent application).
Corrected Notice of Allowability issued in U.S. Appl. No. 15/937,587, dated Oct. 23, 2019 in 2 pages (of-record in parent application).
Non-Final Office Action issued in U.S. Appl. No. 15/937,587, dated Feb. 25, 2019 in 7 pages (of-record in parent application).
Notice of Allowance issued in U.S. Appl. No. 15/937,587, dated Sep. 11, 2019 in 5 pages (of-record in parent application).
Supplemental Notice of Allowability issued in U.S. Appl. No. 15/937,587, dated Mar. 23, 2020, 2 pages (of-record in parent application).
Non-Final Office Action issued in U.S. Appl. No. 15/965,552, dated Sep. 8, 2021 in 10 pages (of-record in parent application).
Non-Final Office Action issued in U.S. Appl. No. 16/228,573, dated Feb. 25, 2019 in 10 pages (of-record in parent application).
Notice of Allowance issued in U.S. Appl. No. 16/228,573, dated Jun. 12, 2019 in 5 pages (of-record in parent application).
Non-Final Office Action issued in U.S. Appl. No. 16/375,735, dated Dec. 23, 2019 in 36 pages (of-record in parent application).
Notice of Allowance issued in U.S. Appl. No. 16/375,735, dated Apr. 15, 2020 in 13 pages (of-record in parent application).
Non-Final Office Action issued in U.S. Appl. No. 16/512,261, dated Sep. 4, 2019 in 10 pages (of-record in parent application).
Notice of Allowance issued in U.S. Appl. No. 16/512,261, dated Dec. 31, 2019 in 5 pages (of-record in parent application).
Advisory Action issued in U.S. Appl. No. 16/733,841, dated Oct. 4, 2021 in 4 pages (of-record in parent application).
Final Office Action issued in U.S. Appl. No. 16/733,841, dated Jul. 16, 2021 in 9 pages (of-record in parent application).
First Action Interview Office Action Summary issued in U.S. Appl. No. 16/733,841, dated Aug. 6, 2020 in 5 pages (of-record in parent application).
First Action Interview Pilot Program Pre-Interview Communication issued in U.S. Appl. No. 16/733,841, dated Apr. 16, 2020 in 4 pages (of-record in parent application).
Non-Final Office Action issued in U.S. Appl. No. 16/733,841, dated Jan. 11, 2021 in 7 pages (of-record in parent application).
Corrected Notice of Allowability issued in U.S. Appl. No. 16/803,858, dated Dec. 10, 2021 in 2 pages (of-record in parent application).
Corrected Notice of Allowability issued in U.S. Appl. No. 16/803,858, dated Nov. 8, 2021 in 2 pages (of-record in parent application).
Final Office Action issued in U.S. Appl. No. 16/803,858, dated Aug. 2, 2021 in 27 pages (of-record in parent application).
Non-Final Office Action issued in U.S. Appl. No. 16/803,858, dated Mar. 25, 2021 in 23 pages (of-record in parent application).
Notice of Allowance issued in U.S. Appl. No. 16/803,858, dated Oct. 27, 2021 in 12 pages (of-record in parent application).
Corrected Notice of Allowability issued in U.S. Appl. No. 16/822,474, dated Dec. 3, 2021 in 2 pages (of-record in parent application).
First Action Interview Pilot Program Pre-Interview Communication issued in U.S. Appl. No. 16/822,474, dated Aug. 24, 2021 in 5 pages (of-record in parent application).
Notice of Allowance issued in U.S. Appl. No. 16/822,474, dated Nov. 18, 2021 in 10 pages (of-record in parent application).
First Examination Report issued in Australian Application No. AU2016219550, dated Aug. 21, 2017 in 4 pages (of-record in parent application).
Notice of Acceptance issued in Australian Application No. AU2016219550, dated Aug. 15, 2018 in 3 pages (of-record in parent application).
Second Examination Report issued in Australian Application No. AU2016219550, dated May 18, 2018 in 8 pages (of-record in parent application).
First Examination Report issued in Australian Application No. AU2017202861, dated Feb. 6, 2018 in 4 pages (of-record in parent application).
Notice of Acceptance issued in Australian Application No. AU2017202861, dated Oct. 26, 2018 in 3 pages (of-record in parent application).
First Examination Report issued in Australian Application No. AU2017332547, dated Apr. 4, 2019 in 4 pages (of-record in parent application).
First Examination Report issued in Australian Application No. AU2018204401, dated May 29, 2019 in 7 pages (of-record in parent application).
First Examination Report issued in Australian Application No. AU2018204493, dated Jun. 12, 2019, 7 pages (of-record in parent application).
Second Examination Report issued in Australian Application No. AU2018204493, dated Dec. 17, 2019 in 3 pages (of-record in parent application).
First Examination Report issued in Australian Application No. AU2018204500, dated Jun. 19, 2019 in 7 pages (of-record in parent application).
First Examination Report issued in Australian Application No. AU2020201609, dated Feb. 12, 2021 in 8 pages (of-record in parent application).
Notice of Acceptance issued in Australian Application No. AU2020201609, dated Jul. 27, 2021 in 3 pages (of-record in parent application).
First Examination Report issued in Australian Application No. AU2020203363, dated Feb. 26, 2021 in 7 pages (of-record in parent application).
Second Examination Report issued in Australian Application No. AU2020203363, dated Jul. 19, 2021 in 3 pages (of-record in parent application).
Notice of Decision to Grant issued in China Application No. CN201580064006.8, dated Jan. 6, 2020 in 2 pages (of-record in parent application).
Office Action issued in China Application No. CN201580064006.8, dated Jul. 17, 2019 in 10 pages (of-record in parent application).
Office Action issued in China Application No. CN201580064006.8, dated Nov. 22, 2018 in 9 pages (of-record in parent application).
Office Action issued in China Application No. CN201610751099.8, dated Mar. 7, 2019 in 15 pages (of-record in parent application).

(56) References Cited

OTHER PUBLICATIONS

Office Action issued in China Application No. CN201610751099.8, dated Aug. 28, 2018 in 17 pages (of-record in parent application).
Notice of Decision to Grant issued in China Application No. CN201620969264.2, dated Jan. 4, 2017 in 6 pages (of-record in parent application).
Notice of Decision to Grant issued in China Application No. CN201710766835.1, dated Jun. 12, 2020 in 4 pages (of-record in parent application).
Office Action issued in China Application No. CN201710766835.1, dated Feb. 3, 2019 in 32 pages (of-record in parent application).
Office Action issued in China Application No. CN201710766835.1, dated Mar. 9, 2020 in 5 pages (of-record in parent application).
Office Action issued in China Application No. CN201710766835.1, dated Sep. 11, 2019 in 8 pages (of-record in parent application).
Notice of Decision to Grant issued in China Application No. CN201710766846.X, dated Oct. 10, 2019 in 2 pages (of-record in parent application).
Office Action issued in China Application No. CN201710766846.X, dated Mar. 5, 2019 in 27 pages (of-record in parent application).
Notice of Decision to Grant issued in China Application No. CN201710766851.0 , dated Jul. 10, 2019 in 2 pages (of-record in parent application).
Office Action issued in China Application No. CN201710766851.0, dated Feb. 15, 2019 in 9 pages (of-record in parent application).
Notice of Decision to Grant issued in China Application No. CN201710766852.5, dated Mar. 20, 2020 in 2 pages (of-record in parent application).
Office Action issued in China Application No. CN201710766852.5, dated Jul. 31, 2019 in 9 pages (of-record in parent application).
Notice of Decision to Grant issued in China Application No. CN201710766853.X, dated Apr. 2, 2020 in 2 pages (of-record in parent application).
Office Action issued in China Application No. CN201710766853.X, dated Dec. 3, 2019 in 13 pages (of-record in parent application).
Office Action issued in China Application No. CN201710766853.X, dated Mar. 4, 2019 in 18 pages (of-record in parent application).
Notice of Decision to Grant issued in China Application No. CN201810753858.3, dated Jan. 10, 2020 in 4 pages (of-record in parent application).
Office Action issued in China Application No. CN201810753858.3, dated May 31, 2019 in 10 pages (of-record in parent application).
Notice of Decision to Grant issued in China Application No. CN201810753859.8, dated Jan. 10, 2020 in 2 pages (of-record in parent application).
Office Action issued in China Application No. CN201810753859.8, dated Jun. 6, 2019 in 7 pages (of-record in parent application).
Office Action issued in China Application No. CN202010198926.1, dated Oct. 11, 2021 in 6 pages (of-record in parent application).
Office Action issued in China Application No. CN202010344068.7, dated Jan. 6, 2021 in 27 pages (of-record in parent application).
Office Action issued in China Application No. CN202010344068.7, dated Aug. 17, 2021 in 8 pages (of-record in parent application).
Notice of Decision to Grant issued in Europe Application No. EP15778540.3, dated Jul. 9, 2020 in 2 pages (of-record in parent application).
Office Action issued in European Application No. EP15778540.3, dated Mar. 28, 2019 in 5 pages (of-record in parent application).
Extended European Search Report issued in European Application No. EP16185100.1, dated Feb. 24, 2017 in 8 pages (of-record in parent application).
Notice of Decision to Grant issued in European Application No. EP16185100.1, dated Nov. 22, 2018 in 2 pages (of-record in parent application).
Notice of Decision to Grant issued in European Application No. EP17755393.0, dated Mar. 26, 2020 in 2 pages (of-record in parent application).
Office Action issued in European Application No. EP17755393.0, dated Mar. 21, 2019 in 7 pages (of-record in parent application).
Extended European Search Report issued in European Application No. EP18178222.8, dated Oct. 4, 2018 in 9 pages (of-record in parent application).
Notice of Decision to Grant issued in European Application No. EP18178222.8, dated Jan. 21, 2021 in 3 pages (of-record in parent application).
Office Action issued in European Application No. EP18178222.8, dated Nov. 22, 2019 in 4 pages (of-record in parent application).
Extended European Search Report issued in European Application No. EP18178229.3, dated Oct. 4, 2018 in 8 pages (of-record in parent application).
Notice of Decision to Grant issued in European Application No. EP18178229.3, dated Feb. 11, 2021 in 3 pages (of-record in parent application).
Office Action issued in European Application No. EP18178229.3, dated Nov. 28, 2019 in 6 pages (of-record in parent application).
Extended European Search Report issued in European Application No. EP18178238.4, dated Oct. 10, 2018 in 8 pages (of-record in parent application).
Notice of Decision to Grant issued in European Application No. EP18178238.4, dated Jan. 21, 2021 in 3 pages (of-record in parent application).
Office Action issued in European Application No. EP18178238.4, dated Nov. 22, 2019 in 5 pages (of-record in parent application).
Extended European Search Report issued in European Application No. EP18178244.2, dated Oct. 2, 2018 in 13 pages (of-record in parent application).
Office Action issued in European Application No. EP18178244.2, dated May 12, 2021 in 7 pages (of-record in parent application).
Extended European Search Report issued in European Application No. EP18187449.6, dated Sep. 6, 2018 in 7 pages (of-record in parent application).
Office Action issued in European Application No. EP18187449.6, dated Jan. 15, 2021 in 6 pages (of-record in parent application).
Extended European Search Report issued in European Application No. EP18187453.8, dated Sep. 5, 2018 in 7 pages (of-record in parent application).
Office Action issued in Europe Application No. EP18187453.8, dated Jan. 12, 2021 in 5 pages (of-record in parent application).
First Examination Repor issued in India Application No. IN201817019963, dated Feb. 27, 2020 in 6 pages (of-record in parent application).
Office Action issued in Japan Application No. JP2016-166626, dated Mar. 5, 2018 in 5 pages (of-record in parent application).
Office Action issued in Japan Application No. JP2016-166626, dated Nov. 6, 2017 in 8 pages (of-record in parent application).
Notice of Decision to Grant issued in Japan Application No. JP2017-517245, dated Apr. 1, 2019 in 2 pages (of-record in parent application).
Office Action issued in Japan Application No. JP2017-517245, dated Aug. 6, 2018 in 12 pages (of-record in parent application).
Notice of Decision to Grant issued in Japan Application No. JP2018-107757, dated May 20, 2019 in 2 pages (of-record in parent application).
Office Action issued in Japan Application No. JP2018-107757, dated Apr. 1, 2019 in 2 pages (of-record in parent application).
Notice of Allowance issued in Japan Application No. JP2018-109632, dated Sep. 11, 2020 in 3 pages (of-record in parent application).
Office Action issued in Japan Application No. JP2018-109632, dated Apr. 10, 2020 in 12 pages (of-record in parent application).
Office Action issued in Japan Application No. JP2018-109632, dated Dec. 20, 2019 in 14 pages (of-record in parent application).
Office Action issued in Japan Application No. JP2018-109632, dated Jun. 10, 2019, 6 pages (of-record in parent application).
Notice of Allowance issued in Japan Application No. JP2018-109633, dated Nov. 29, 2019 in 3 pages (of-record in parent application).
Office Action issued in Japan Application No. JP2018-109633, dated Jun. 7, 2019 in 5 pages (of-record in parent application).
Notice of Decision to Grant issued in Japan Application No. JP2018-123987, dated Jan. 6, 2020 in 2 pages (of-record in parent application).

(56) References Cited

OTHER PUBLICATIONS

Office Action issued in Japan Application No. JP2018-123987, dated Aug. 5, 2019 in 4 pages (of-record in parent application).
Notice of Decision to Grant issued in Japan Application No. JP2018-123988, dated Aug. 5, 2019 in 1 page (of-record in parent application).
Notice of Decision to Grant issued in Japan Application No. JP2018-528044, dated Mar. 6, 2020 in 3 pages (of-record in parent application).
Office Action issued in Japan Application No. JP2018-528044, dated May 10, 2019 in 3 pages (of-record in parent application).
Office Action issued in Japan Application No. JP2020-017664, dated Dec. 22, 2021 in 11 pages (of-record in parent application).
Office Action issued in Japan Application No. JP2020-017664, dated Mar. 4, 2021 in 15 pages (of-record in parent application).
Office Action issued in Japan Application No. JP2020-135928, dated Oct. 4, 2021 in 4 pages (of-record in parent application).
Kim et al., "A Comparison of Analysis and Measurements of the Electromagnetic Shielding Material for Wireless Charging Devices", Journal of 2015 Summer Conference, The Korean Institute of Electrical Engineers, Jul. 17, 2015, pp. 856-857 (of-record in parent application).
Office Action issued in Korea Application No. KR10-2016-0110481, dated Mar. 27, 2018 in 16 pages (of-record in parent application).
Office Action issued in Korea Application No. KR10-2016-0110481, dated Feb. 20, 2019 in 8 pages (of-record in parent application).
Notice of Decision to Grant issued in Korea Application No. KR10-2017-7011927, dated Jan. 22, 2019 in 2 pages (of-record in parent application).
Office Action issued in Korea Application No. KR10-2017-7011927, dated Jul. 20, 2018 in 15 pages (of-record in parent application).
Notice of Decision to Grant issued in Korea Application No. KR10-2018-7015370, dated Aug. 20, 2019 in 4 pages (of-record in parent application).
Office Action issued in Korea Application No. KR10-2018-7015370, dated Jan. 31, 2019 in 12 pages (of-record in parent application).
Notice of Decision of Grant issued in Korea Application No. KR10-2018-7017050, dated Aug. 20, 2019 in 4 pages (of-record in parent application).
Office Action issued in Korea Application No. KR10-2018-7017050, dated Mar. 29, 2019 in 12 pages (of-record in parent application).
Office Action issued in Korea Application No. KR10-2018-7017058, dated Mar. 29, 2019 in 13 pages (of-record in parent application).
Notice of Decision to Grant issued in Korea Application No. KR10-2018-7018986, dated Aug. 20, 2019, 2 pages (of-record in parent application).
Office Action issued in Korea Application No. KR10-2018-7018986, dated Sep. 28, 2018 in 13 pages (of-record in parent application).
Office Action issued in Korea Application No. KR10-2018-7018986, dated May 30, 2019 in 5 pages (of-record in parent application).
Notice of Decision to Grant issued in Korea Application No. KR10-2018-7018988, dated Feb. 28, 2019 in 2 pages (of-record in parent application).
Office Action issued in Korea Application No. KR10-2018-7018988, dated Sep. 18, 2018 in 13 pages (of-record in parent application).
Notice of Decision to Grant issued in Korea Application No. KR10-2019-7033942, dated Apr. 28, 2020 in 4 pages (of-record in parent application).
Office Action issued in Korea Application No. KR10-2019-7033942, dated Dec. 30, 2019 in 11 pages (of-record in parent application).
Notice of Decision to Grant issued in Korea Application No. KR10-2019-7034281, dated Mar. 31, 2020 in 3 pages (of-record in parent application).
Office Action issued in Korea Application No. KR10-2019-7034281, dated Dec. 30, 2019 in 15 pages (of-record in parent application).
Notice of Decision to Grant issued in Korea Application No. KR10-2020-7020670, dated Jan. 28, 2021 in 4 pages (of-record in parent application).
Office Action issued in Korea Application No. KR10-2020-7020670, dated Oct. 15, 2020 in 12 pages (of-record in parent application).
Office Action issued in Korea Application No. KR10-2021-7013021, dated Jul. 19, 2021 in 6 pages (of-record in parent application).
International Preliminary Report on Patentability issued in PCT Application No. PCT/US2015/053025, dated Apr. 13, 2017 in 9 pages (of-record in parent application).
International Search Report and Written Opinion issued in PCT Application No. PCT/US2015/053025, dated Dec. 22, 2015 in 11 pages (of-record in parent application).
International Preliminary Report on Patentability issued in PCT Application No. PCT/US2017/046536, dated Apr. 4, 2019 in 15 pages (of-record in parent application).
International Search Report and Written Opinion issued in PCT Application No. PCT/US2017/046536, dated Mar. 9, 2018 in 22 pages (of-record in parent application).
Invitation to Pay Additional Fees and, Where Applicable, Protest Fee issued in PCT Application No. PCT/US2017/046536, dated Nov. 22, 2017 in 15 pages (of-record in parent application).
Notice of Decision to Grant issued in Taiwan Application No. TW105127677, dated Apr. 24, 2018 in 3 pages (of-record in parent application).
Office Action issued in Taiwan Application No. TW105127677, dated Jun. 1, 2017 in 6 pages (of-record in parent application).
Ex Parte Quayle Action issued in U.S. Appl. No. 15/965,552, dated Mar. 15, 2022 in 10 pages.
Corrected Notice of Allowability issued in U.S. Appl. No. 16/822,474, dated Feb. 15, 2022 in 2 pages.
Notice of Acceptance issued in Australia Application No. AU2020203363, dated Feb. 17, 2022 in 3 pages.
Office Action issued in China Application No. CN202010344068.7, dated Feb. 7, 2022 in 9 pages.
Office Action issued in Korea Application No. KR10-2022-7001888, dated Feb. 28, 2022 in 4 pages.
Non-Final Office Action issued in U.S. Appl. No. 17/649,582, dated Oct. 17, 2022 in 44 pages.
Office Action issued in Korean Application No. KR10-2022-7001888, dated Sep. 23, 2022 in 2 pages.
Notice of Allowance issued in U.S. Appl. No. 15/965,552, dated Dec. 22, 2022 in 9 pages.
Notice of Allowance issued in U.S. Appl. No. 17/649,586, dated Feb. 22, 2023 in 16 pages.
Non-Final Office Action issued in U.S. Appl. No. 17/651,563, dated Mar. 29, 2023 in 19 pages.
Notice of Acceptance issued in Australia Application No. AU2021261922, dated Mar. 30, 2023 in 3 pages.

\* cited by examiner
† cited by third party

*C-C*

VOICE-CONTROLLED ELECTRONIC DEVICE

CROSS-REFERENCES TO RELATED APPLICATIONS

This application is a continuation of U.S. application Ser. No. 16/803,858, filed Feb. 27, 2020, which is a continuation of U.S. application Ser. No. 16/375,735, filed Apr. 4, 2019, which is a continuation of U.S. application Ser. No. 15/613, 054, filed Jun. 2, 2017, which claims priority to U.S. Provisional Patent Application No. 62/399,165, filed on Sep. 23, 2016, U.S. Provisional Patent Application No. 62/399, 229, filed Sep. 23, 2016, U.S. Provisional Patent Application No. 62/399,262 filed on Sep. 23, 2016, U.S. Provisional Patent Application No. 62/399,293 filed on Sep. 23, 2016, U.S. Provisional Patent Application No. 62/399,288 filed on Sep. 23, 2016, and U.S. Provisional Patent Application No. 62/507,007 filed on May 16, 2017. This application is also a Continuation-in-Part of U.S. application Ser. No. 15/513, 955, filed Mar. 23, 2017, which is a 371 National Stage Application of PCT/US2015/053025, filed Sep. 29, 2015, which claims the benefit of U.S. Provisional Patent Application No. 62/057,992, filed Sep. 30, 2014. Each and every one of the above patent applications is hereby incorporated by reference in its entirety for all purposes.

FIELD

This disclosure applies generally to speakers. In particular, an array of speakers housed within a cylindrical housing is described.

BACKGROUND

Conventional speakers are generally directional in nature, which can have the effect of leaving dead spots within a room. Often a large array of speakers is distributed around a room to achieve a substantially uniform level of audio performance throughout the room. Conventional speakers can also be subject to vibratory excursions in certain playback regimes. For example, a subwoofer can cause substantial buzzing and or motion of a speaker depending on the volume and frequency of the music being played back. Consequently, improvements in speaker design are desirable.

SUMMARY

This disclosure describes various embodiments that relate to an electronic device that incorporates a speaker or array of speakers.

An array speaker is disclosed and includes the following: an axisymmetric device housing; a number of audio driver assemblies distributed radially about an interior of the axisymmetric device housing; and a power supply unit positioned between two or more of the audio driver assemblies.

An electronic device is disclosed and includes a device housing; and audio driver assemblies arranged in a circular configuration within the device housing, diaphragms of each audio driver assembly arranged so that audio waves generated by the diaphragms are initially oriented toward a central region of the circular configuration.

An electronic device is disclosed and includes an axisymmetric housing; an array of audio driver assemblies disposed within the axisymmetric housing at a regular radial interval, each of the audio driver assemblies being configured to generate audio waves that exit the substantially axisymmetric housing through acoustic vents defined by a downward facing end of the axisymmetric housing.

An electronic device is disclosed and includes a subwoofer having a diaphragm, a coil coupled to the diaphragm and configured to emit a changing magnetic field, and a permanent magnet configured to interact with the changing magnetic field generated by the coil to move the diaphragm axially, the permanent magnet including lobes protruding radially therefrom.

A speaker is disclosed and includes a device housing, a subwoofer disposed within the device housing and having a diaphragm configured to oscillate in a direction aligned with a longitudinal axis of the device housing, the subwoofer including a permanent magnet comprising a plurality of protrusions distributed at a regular radial interval about the longitudinal axis of the device housing.

An electronic device is disclosed and includes: a device housing; a subwoofer disposed within the device housing and including a permanent magnet having lobes protruding radially therefrom; an audio driver assembly disposed within the device housing; and a capacitor configured to supply power to the audio driver assembly and positioned between two of the lobes.

An audio driver is disclosed and includes the following: a driver housing defining an audio exit opening; a diaphragm disposed within the driver housing; and a phase plug assembly disposed between the diaphragm and the audio exit opening. The diaphragm and phase plug assembly separate a front volume from a back volume and a portion of the back volume extends toward the audio exit opening and past the diaphragm.

An array speaker is disclosed and includes the following: a first audio driver assembly disposed between a second audio driver assembly and a third audio driver assembly, the first audio driver assembly comprising: a driver housing defining an audio exit opening; a diaphragm disposed within the driver housing; and a phase plug disposed between the diaphragm and the audio exit opening, the phase plug separating a front volume from a back volume, a portion of the back volume extending toward the audio exit opening and past the diaphragm.

An audio driver assembly is disclosed and includes the following: a driver housing defining an audio exit opening; a phase plug separating a front volume from a back volume, a portion of the back volume extending toward the audio exit opening; a U-cup engaged with the phase plug to define an interior volume; a diaphragm disposed within the interior volume and coupled with an electrically conductive coil configured to generate a changing magnetic field; and a driver magnet coupled to the U-cup and configured to interact with the changing magnetic field. The interaction between the changing magnetic field and a portion of a magnetic field disposed within an air gap positioned between a top plate and an interior-facing wall of the U-cup causes the diaphragm to oscillate within the interior volume.

A speaker is disclosed and includes the following: a device housing; a user interface assembly disposed at an end of the device housing; a printed circuit board (PCB) secured to an interior facing surface of the user interface assembly; and a subwoofer configured to push air toward the PCB during operation of the speaker.

An electronic device is disclosed and includes the following: a device housing; a user interface assembly; a printed circuit board (PCB) secured to an interior facing surface of the user interface assembly; and an audio component having a diaphragm configured to push air toward the PCB during operation of the electronic device.

An array speaker is disclosed and includes the following: an array of audio driver assemblies arranged in a circular geometry; a speaker housing defining an audio exit channel for each of the audio driver assemblies; and a foot supporting the speaker housing, the foot having a smaller diameter than the speaker housing, a surface of the foot cooperating with a surface of the speaker housing to define an outlet region for each of the audio exit channels, a first distance from a periphery of the foot to an outer edge of the speaker housing being greater than a second distance from a distal end of the foot to a downward facing surface of the speaker housing.

An electronic device is disclosed and includes the following: an axisymmetric device housing; audio driver assemblies disposed within the axisymmetric device housing; and a foot having a substantially smaller diameter than the axisymmetric device housing, the foot cooperating with a downward-facing surface of the axisymmetric device housing to define an audio exit region shaped to spread audio waves generated by the audio driver assemblies as the audio waves exit the axisymmetric device housing.

An electronic device is disclosed and includes the following: a device housing comprising an upper housing component and a lower housing component; an annular support member engaged with threading defined by the lower housing component; a subwoofer coupled to the annular support member; and a fastener extending through an opening defined by the upper housing component and engaging the annular support member.

An electronic device is disclosed and includes the following: a device housing, including first and second housing components cooperating to define an interior volume; an annular support member disposed within the interior volume and engaged with threading arranged along an interior-facing surface of the first housing component; and an audio component coupled to the annular support member, the audio component comprising a diaphragm configured to oscillate in a direction aligned with the longitudinal axis of the device housing.

A speaker device is disclosed and includes the following: an axisymmetric device housing comprising an upper housing component and a lower housing component coupled to the upper housing component; a support structure engaged with threading disposed along an interior facing surface of the lower housing component, the support structure including: a first annular member, and a second annular member coupled to the first annular member; a subwoofer coupled to the support structure and filling a central opening defined by the support structure; and a fastener extending through an opening defined by the upper housing component and engaging the annular support member.

A user interface is disclosed and includes the following: an exterior surface configured to receive touch inputs; light sources configured to direct light toward the exterior surface and arranged in a lens pattern; and a single piece lens array disposed between the light sources and the exterior surface, the lens array including lenses arranged in the lens pattern, each of the lenses protruding from a transparent substrate and having a surface facing a respective one of the light sources.

An electronic device is disclosed and includes the following: a device housing; and a user interface arranged along an exterior surface at a first end of the device housing, the user interface including: light sources configured to illuminate a region of the exterior surface, and a single piece lens array, including: lenses arranged in a lens pattern, each of the lenses protruding from a transparent substrate and having a concave surface facing a respective one of the light sources.

A speaker device is disclosed and includes the following: a device housing; a speaker driver assembly disposed within the device housing; and a user interface, including: a cosmetic surface configured to receive touch input and arranged along an exterior surface of the device housing; light sources configured to emit light toward the cosmetic surface; and a lens array disposed between the light sources and the cosmetic surface, the lens array including lenses arranged in a lens pattern, each of the lenses protruding from a transparent substrate and having a concave surface facing a respective one of the light sources.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
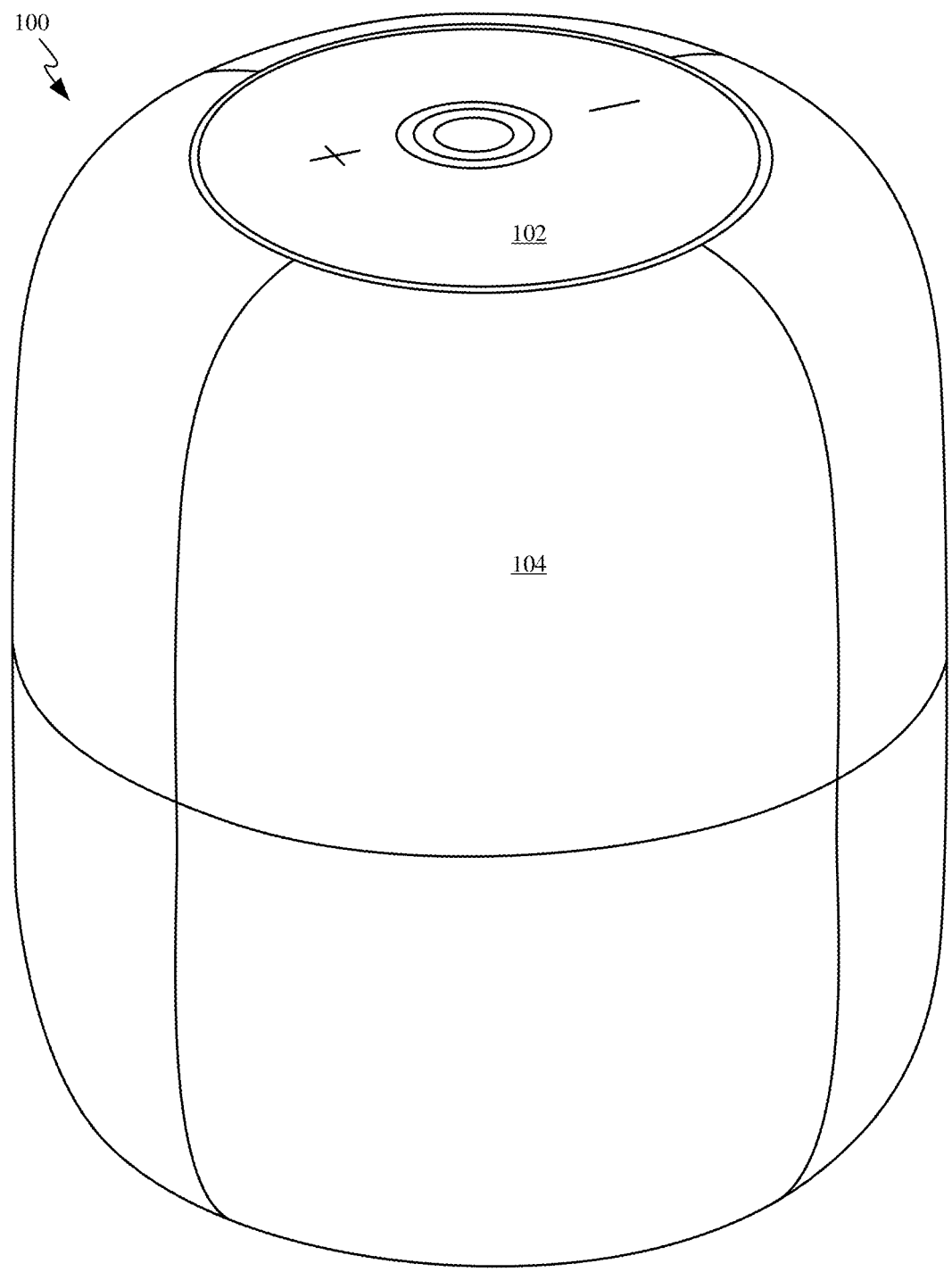
FIG. 1 shows a perspective view of an array speaker.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Speaker configurations tend to be overly large when high quality audio playback is desired and the audio output can be very directional in nature. This often requires a user to be positioned in one particular location to get a desired quality level of audio content generated by the speakers. For example, a multi-channel speaker setup could require speakers to be mounted in multiple different corners of a room to achieve a substantially uniform distribution of sound within the room.

One way to reduce the size of a speaker configuration and simplify speaker setup while maintaining an even distribution of sound within a room, is to package multiple mid to high frequency drivers into a single housing. The drivers can be distributed within the speaker device so that audio exit channels associated with the drivers are distributed at a regular radial interval along a periphery of the speaker device. In some embodiments, beamforming techniques can be applied to improve audio performance by, adjusting audio exiting from adjacent audio exit openings in order to generate constructively interference. In one particular embodiment, the drivers can be positioned in a circular arrangement within a cylindrical housing to achieve an even radial distribution of sound. Destructive interference caused by reflections from the support surface on which the device is positioned can be prevented by orienting the audio exit openings next to the support surface.

In some embodiments, the size of the speaker device can be reduced by packaging the various internal components in close proximity. For example, a power supply unit can be positioned within a central recess defined by a circular arrangement of drivers. In some embodiments, capacitors can be located between a centrally located subwoofer and sidewalls of a device housing of the speaker device. In one particular embodiment, a magnet of the subwoofer can be shaped specifically to accommodate larger capacitors between the subwoofer and the sidewalls of the speaker device.

When the speaker device also includes processing components, heat rejection can also be important. In some embodiments, a main logic board of the speaker device can be positioned in front of the subwoofer so that air pushed by the subwoofer can convectively dissipate heat from heat emitting components of the main logic board.

Packaging a subwoofer within the speaker device can generate vibrations that could cause undesirable buzzing within or motion of the speaker device. In some embodiments, the subwoofer can be attached to mounting brackets within the device housing using a fastener with an elastomeric grommet. The elastomeric grommet can reduce the amount of vibrations imparted to the rest of the speaker device by the subwoofer.

In some embodiments, the mounting brackets can take the form of an annular support structure that is positioned within a device housing of the speaker device by rotating the annular support structure along threading arranged along an interior surface of the device housing. The mounting bracket can be configured to receive fasteners associated with an upper housing component of the device housing and the subwoofer. In some embodiments, the annular support structure can be formed of two separate rings that are compressed together by a series of fasteners.

In some embodiments, the speaker device can include a touch-based user interface positioned on a top surface of the speaker device. The touch-based user interface can include lighting that illuminates different regions of the touch-based user interface. For example, a central portion of the user interface could be illuminated with a shifting pattern of colors in response to a voice command being received or processed. The shifting pattern of colors could be produced by an array of LEDs embedded beneath an exterior surface of the touch-based user interface. Other illuminated controls on the touch-based user interface can include volume controls. The touch-based user interface can utilize a capacitive touch sensor or other touch sensor suitable for detecting gesture-based touch inputs.

These and other embodiments are discussed below with reference to FIGS. 1-23; however, those skilled in the art will readily appreciate that the detailed description given herein with respect to these figures is for explanatory purposes only and should not be construed as limiting.

FIG. 1 shows a perspective view of an array speaker 100. Array speaker 100 can have an unbroken, aesthetically pleasing exterior surface and a symmetric substantially cylindrical geometry. As used herein, the term "substantially cylindrical geometry" refers to a geometry that is completely cylindrical (i.e., a geometry that includes straight parallel sides and has a circular or oval cross-section) as well as a geometry in which the sides of the top and/or bottom edges are tapered and rounded more than an actual cylinder. Array speaker 100 can also have different geometries. For example, a device housing for array speaker could have many different axisymmetric shapes that allows audio device assemblies to be distributed radially within the device housing. An axisymmetric geometry refers to a shape having symmetry around at least one axis. In the described embodiments, the device housing exhibits an axisymmetric geometry that has symmetry about a longitudinal axis of the device housing. It should also be noted that the term axisymmetric may also be construed to cover shapes that are substantially symmetric about one axis. For example, a small recess or protrusion would not preclude the housing from being described as having an axisymmetric geometry for the purpose of the following description.

An upper portion of array speaker 100 can include a user interface 102. User interface 102 can allow a user to adjust settings for array speaker 100. For example, track selection and changes in volume can be handled by interacting with user interface 102. In some embodiments, user interface 102 can take the form of a touch sensitive surface. User interface 102 can include one or more light sources that illuminate various regions of user interface 102 to help a user interact with user interface 102. A majority of array speaker 100 can be covered by acoustic fabric 104. Acoustic fabric 104 can give array speaker 100 a consistent exterior surface. Some audio exit ports can be concealed by acoustic fabric 104 in a manner that results in minimal impact on the volume and/or quality of audio exiting array speaker 100.

Figure 2A:
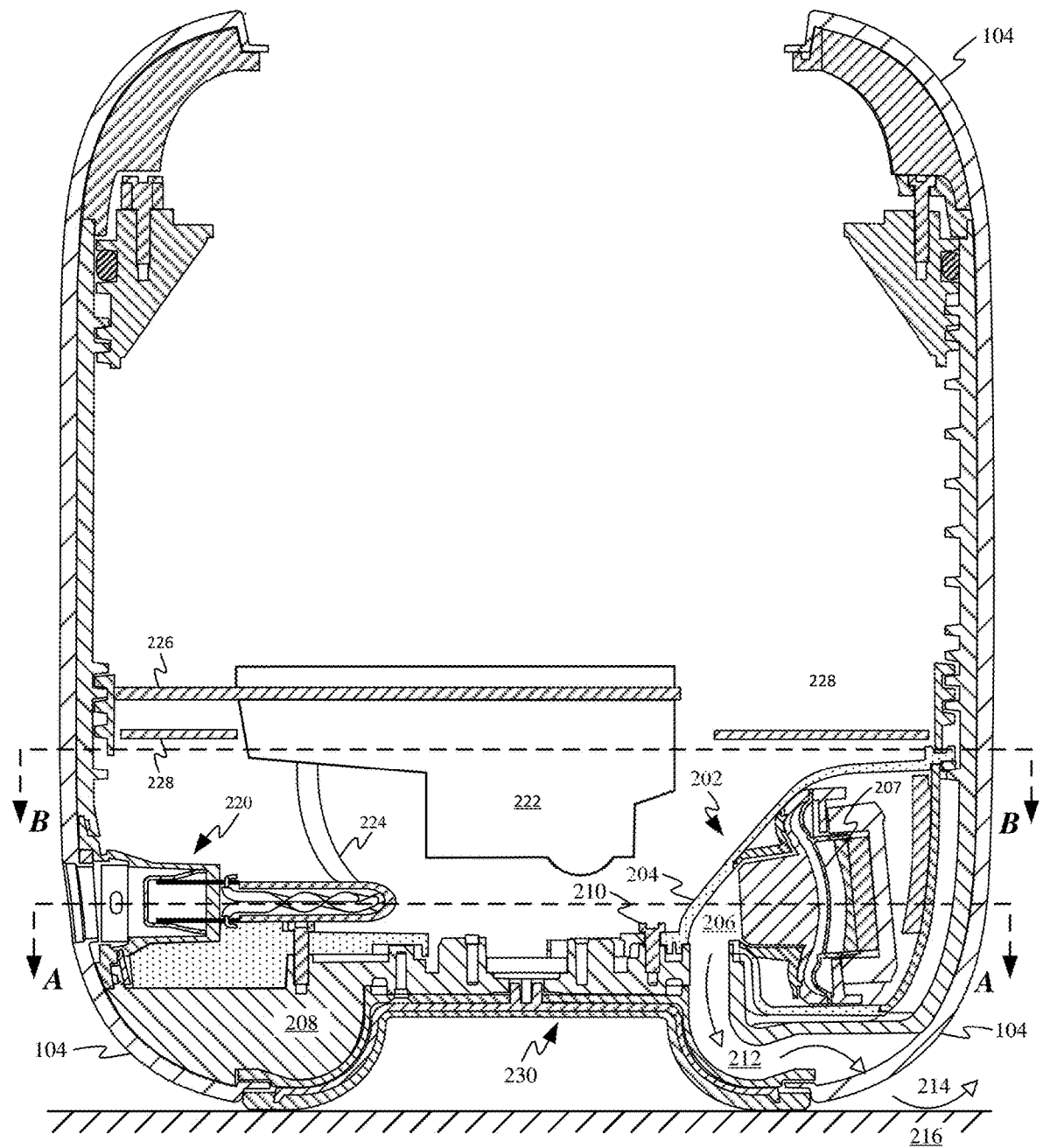
FIG. 2A shows a cross-sectional view of the array speaker that includes only components disposed within the lower third of the array speaker.

FIG. 2A shows a cross-sectional view of array speaker 100 that includes only components disposed within the lower third of array speaker 100. In particular, the cross-section of one audio driver assembly 202 is depicted. Audio driver assembly 202 can include driver housing 204, which surrounds the audio components making up audio driver assembly 202 and defines a rectangular channel 206 for allowing the audio generated by diaphragm 207 of audio driver assembly 202 to exit driver housing 204. Audio driver assembly 202 can be fastened to lower housing component 208 by fastener 210. Driver housing 204 can be rotated so that rectangular channel 206 aligns with audio exit channel 212 defined by lower housing component 208. Audio waves 214 exiting audio exit channel 212 pass through acoustic fabric 104 and travel along a supporting surface 216 upon which array speaker 100 rests due to the exit geometry of audio exit channel 212. In some embodiments, acoustic fabric 104 can have a pattern designed to conceal components or features positioned beneath acoustic fabric 104.

FIG. 2A also shows power receptacle 220. Power receptacle 220 can extend between two adjacent audio driver assemblies 202 to route power to various components within array speaker 100. Power receptacle 220 can be electrically coupled to power supply unit 222 by electrically conductive cable 224. In some embodiments, power supply unit 222 can be coupled to power supply board 226, which is in turn coupled to lower housing component 208. Power supply unit 222 extends into a recess defined by audio driver assemblies 202. Audio driver assemblies 202 are distributed radially at a regular interval about array speaker 100. In this way, power supply unit 222 utilizes the space available within the recess defined by audio driver assemblies 202. In some embodiments, amplifier board 228 and the components distributed thereon can also be electrically coupled to power supply unit 222 and power receptacle 220 by way of electrically conductive cable 224. FIG. 2A also depicts cantilevered foot 230, which supports the weight of array speaker 100 atop supporting surface 216. Cantilevered foot 230 can be formed of damping material such as silicone configured to minimize the amount of vibration transferred from array speaker 100 to supporting surface 216. Cantilevered foot 230 can be configured to dissipate forces transmitted in Z as well as moments acting about the X and/or Y axes. The wide aspect and symmetric footprint of cantilevered foot 230 also helps prevent rocking of the speaker due to moments acting about the X and/or Y axes.

Figure 2B:
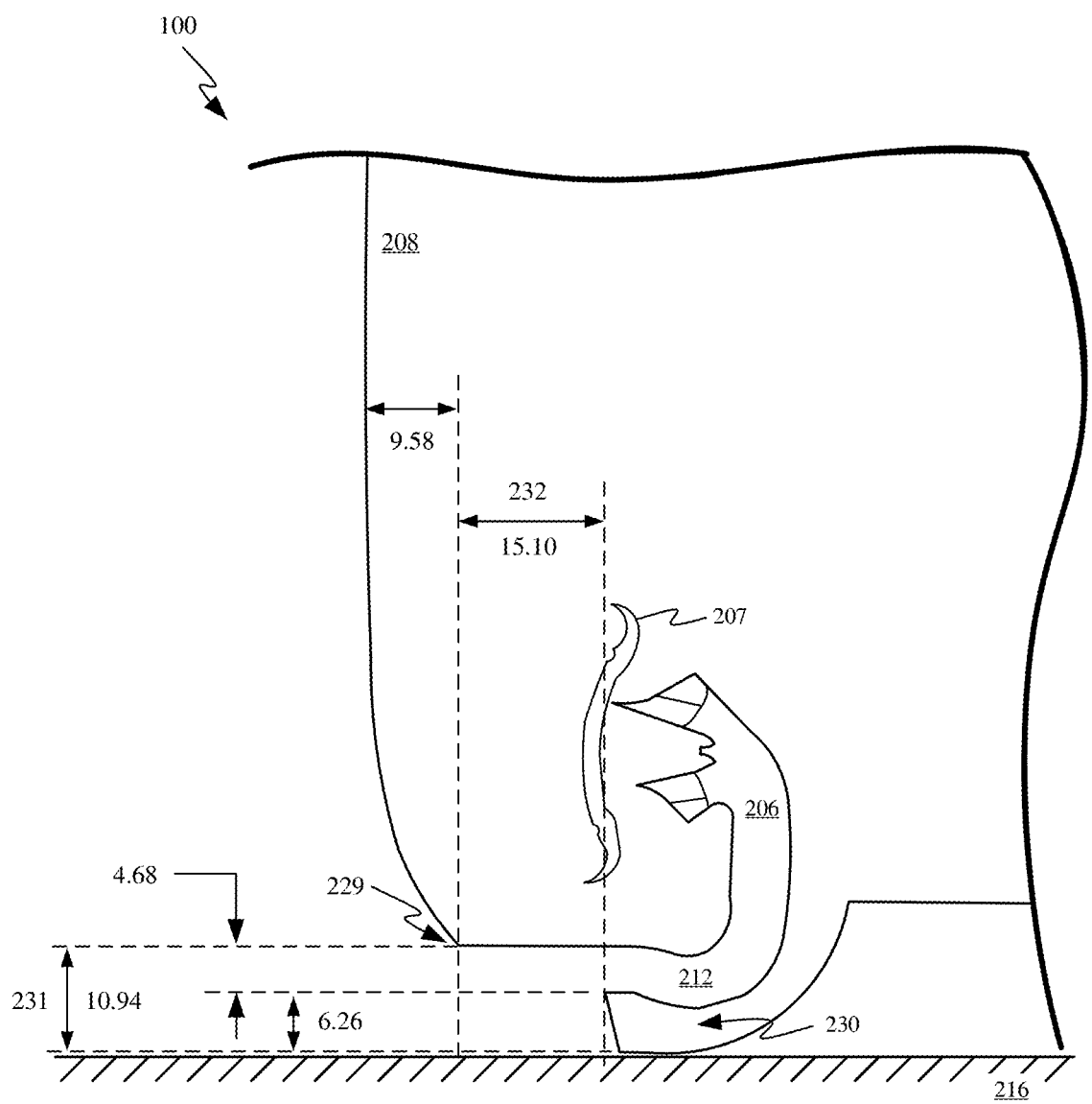
FIG. 2B shows a simplified view of one side of the array speaker and an associated audio exit channel.

FIG. 2B shows an interior cross-sectional view of one side of array speaker 100 depicting diaphragm 207 and an audio exit channel 212 associated with one of audio driver assemblies 202. Various dimensions of the exit of audio exit channel 212 are depicted in millimeters. In particular, the distance between the end of audio exit channel 212 and an edge 229 of a sidewall of lower housing component 208 is about 1.5 times greater than the height of a downward facing surface of array speaker 100 off a support surface supporting array speaker 100. The height of foot 230 just below an outlet region for audio exit channel 212 is about half the distance from supporting surface 216 and the top surface of audio exit channel 212. In some embodiments, a periphery of foot 230 has a thickness that is about 6/11 of distance 231 between a distal end of foot 230 (or supporting surface 216) and the top surface of audio exit channel 212 at the outlet region. This geometry results in high-frequency audio waves moving around a corner of foot 230 and a corner of the outer edge of the housing in such a way that an even vertical directivity is achieved for both low and high-frequency audio waves. Distance 232 between the edge of lower housing component 208 and the periphery of the foot can be slightly longer than distance 231. This allows the downward facing surface of lower housing component 208 to help shape the audio waves as they travel away from the speaker device. In some embodiments, a ratio of distance 231 to distance 232 can be about 11/15.

Figure 2C:
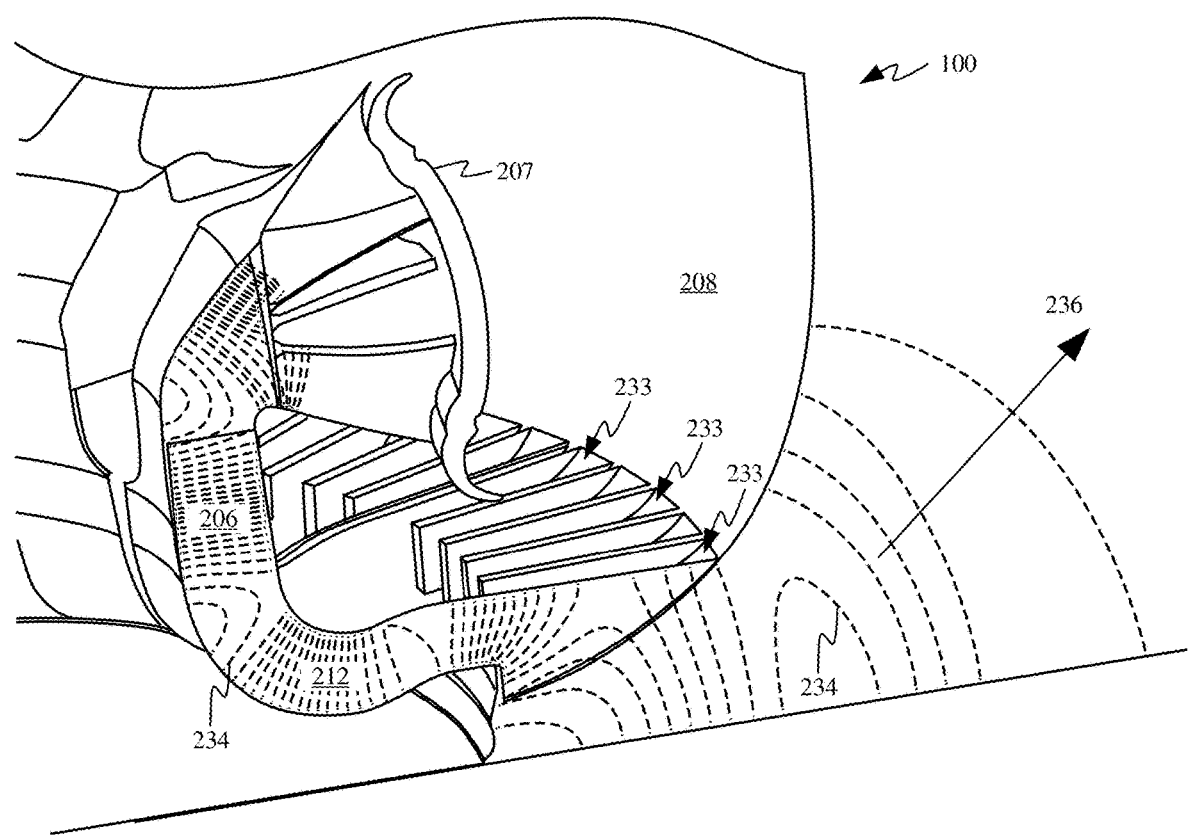
FIG. 2C shows an internal schematic view of the audio exit channel associated with one of the audio drivers of the array speaker and how audio waves are propagated through the audio exit channel.

FIG. 2C shows an interior schematic view of a lower region of array speaker 100. FIG. 2C depicts how diaphragm 207 associated with one of audio driver assemblies 202 can be configured to emit audio through a number of vertical slots 233 defined by lower housing component 208. Dashed lines 234 depicted within rectangular channel 206 and audio exit channel 212 represent sound waves generated by diaphragm 207. In particular, dashed lines 234 are depicted turning within different regions of rectangular channel 206 and audio exit channel 212. These channels are shaped deliberately to minimize destructive interference that could negatively affect the quality and/or volume produced by vibration of diaphragm 207. For example, the turns in the audio channels direct acoustic waves in ways that preserve coherent wave fronts along the length of the audio channels. The shape of the audio channels also helps to direct the audio waves in a direction 236 oriented radially outward and upward, which results in spherically expanding wavefronts moving away from the supporting surface upon which lower housing component 208 rests. While audio waves are depicted two dimensionally by dashed lines 234 it should be appreciated that the audio waves have a three dimensional profile that extends circumferentially within and outside of lower housing component 208. FIG. 2C also shows how audio waves generated by diaphragm 602 turn in a direction substantially orthogonal to an original direction in which the audio waves are initially generated. For example, audio waves could shift 70 to 80 degrees in direction before exiting driver housing 204 through audio exit opening.

Figure 3A:
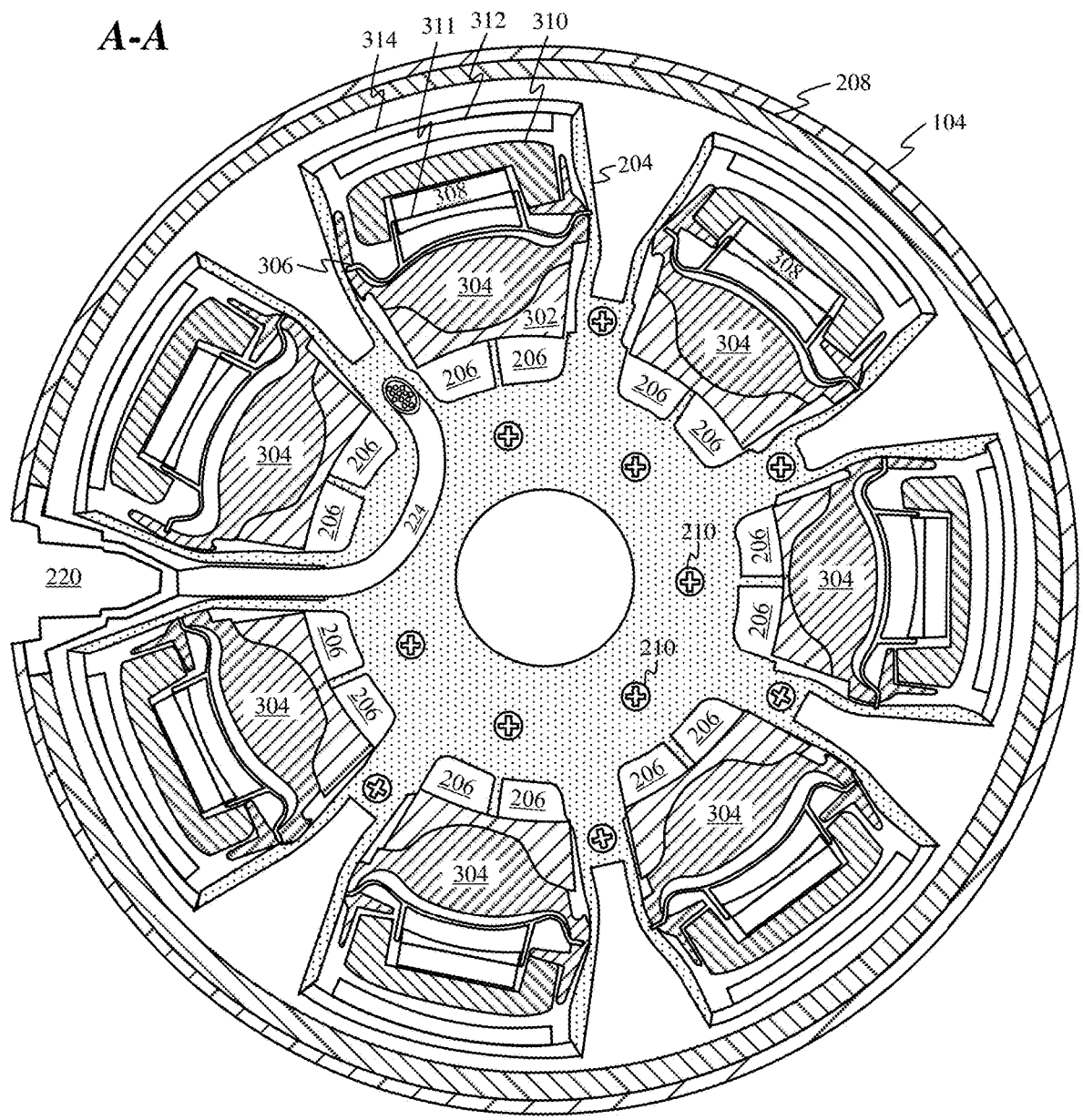
FIGS. 3A-3B show cross-sectional views of the array speaker in accordance with section lines A-A and B-B of FIG. 2, respectively.

FIG. 3A shows a cross-sectional view of array speaker 100 in accordance with section line A-A of FIG. 2A. Each driver assembly includes an adapter 302 configured to position phase plug 304 within driver housing 204. Phase plug 304 reduces destructive interference by guiding audio waves from the large surface area of the diaphragm to the small entrance area of the throat of the horn rather than allowing the audio waves to interact destructively near the diaphragm. Phase plug also helps shape the sound waves leaving audio driver assembly 202 to conform to a non-circular or in some cases more rectangular channel 206 and audio exit channel 212. A periphery of a diaphragm associated with coil assembly 306 is engaged with phase plug 304 as depicted. Coil assembly 306 includes a coil of wire that is affixed to a central portion of the diaphragm and is configured to generate a shifting magnetic field configured to interact with permanent magnet 308, thereby causing waves to be generated by the diaphragm. When the shifting magnetic field interacts with the field generated by permanent magnet 308 the diaphragm vibrates at a rate suitable for generating audio waves associated with a media file being played back by array speaker 100. Behind permanent magnet 308 is a support assembly taking the form of a magnetic motor assembly that includes U-cup 310, top plate 311 and permanent magnet 308. In addition to providing a surface upon which magnet 308 can be mounted, U-cup 310 directs a magnetic field emitted by magnet 308 to the air gap where the coil is positioned. Behind U-cup 310 is a foam layer 312, which can be formed from open-cell foam. Foam layer 312 can enhance the audio performance of audio driver assembly 202. In some embodiments, foam layer 312 can increase the apparent size of a back volume of audio driver assembly 202. Finally, cap 314 is secured to driver housing 204 to close an opening in the back of audio driver assembly 202. This rear opening in driver housing 204 can be used to insert the audio components described above within driver housing 204. FIG. 3A also shows how channels 206 leading out of driver housing 204 can be distributed at a regular radial interval.

Figure 3B:
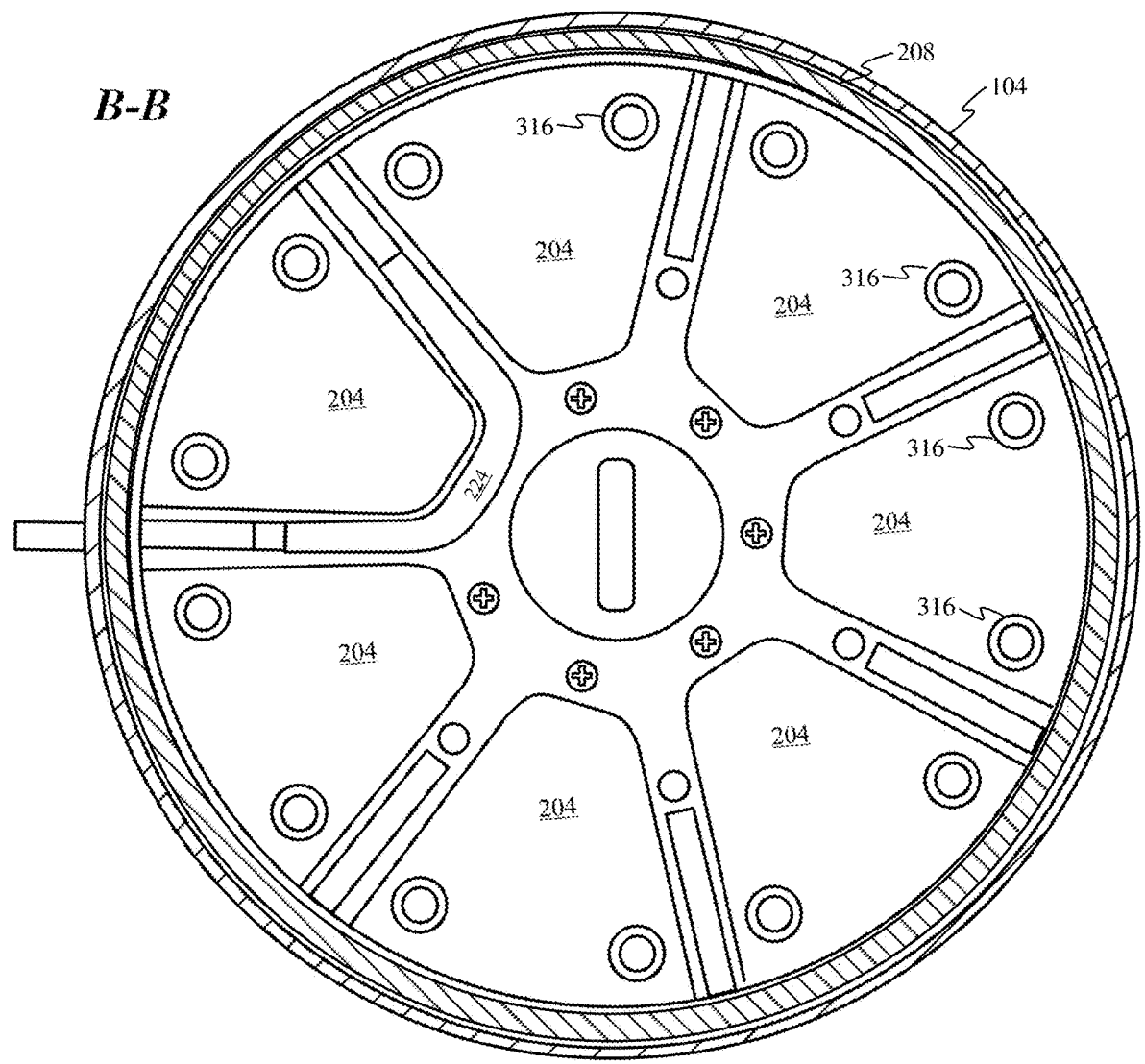

FIG. 3B shows a cross-sectional view of array speaker 100 in accordance with section line B-B of FIG. 2. In this view, top surfaces of driver housings 204 are depicted. Each driver housing has two driver screw terminals 316. Driver screw terminals 316 can be used to create an electrically conductive pathway between the audio components within driver housing 204 and other components of array speaker 100.

Figure 4:
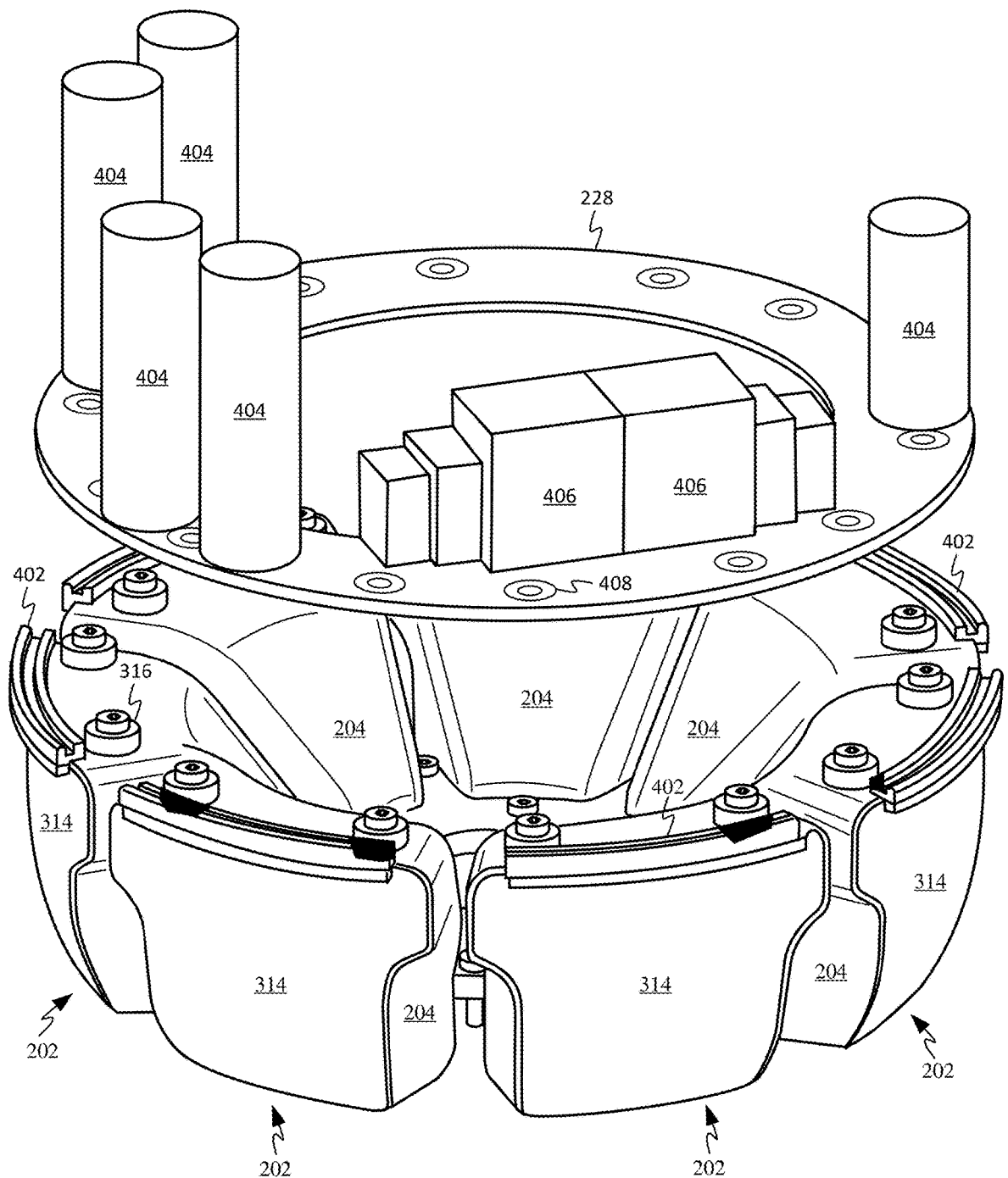
FIG. 4 shows a perspective view of a number of driver assemblies.

FIG. 4 shows a perspective view of each of audio driver assemblies 202. In particular, caps 314 are shown closing rear openings leading into driver housings 204. Each of audio driver assemblies 202 is also depicted with an alignment bracket 402. Alignment bracket 402 can be configured to create a buffer between each of audio driver assemblies 202 and lower housing component 208. Alignment brackets 402 can also be configured to help align amplifier board 228 with driver screw terminals 316. Amplifier board 228 is configured to support capacitors 404 and other electronic components such as electronic components 406. Capacitors 404 are configured to provide power for audio driver assemblies 202. In particular, the power from capacitors 404 can be used to support separate amp channels to power each of audio driver assemblies 202. Amplifier board 228 is also depicted with terminals 408. Each of terminals 408 can be configured to receive a fastener for coupling amplifier board 228 to driver screw terminals 316. In this way, amplifier board 228 can be securely coupled to each of audio driver assemblies 202.

Figure 5A:
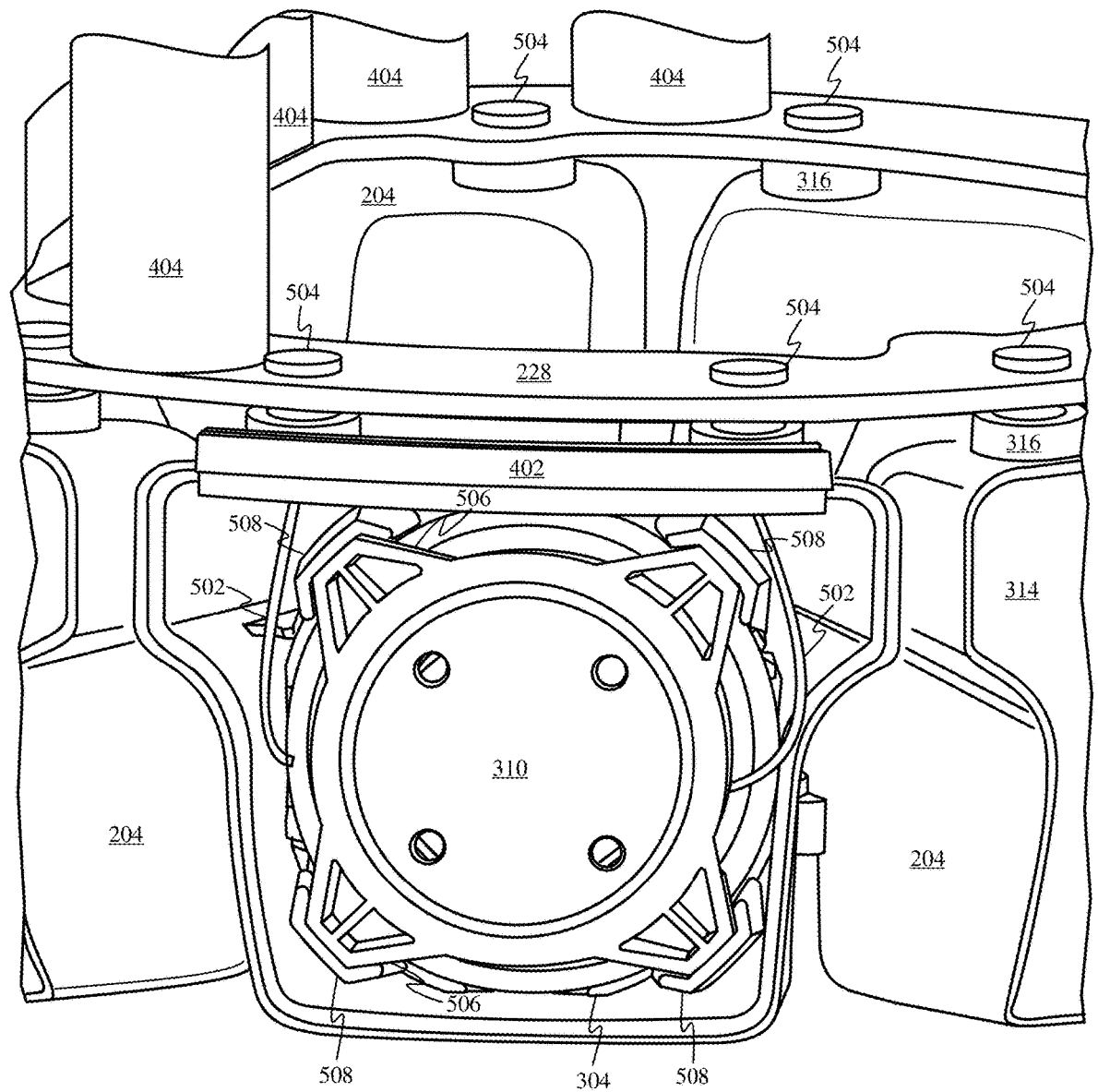
FIG. 5A shows a perspective view of a rear portion of a driver assembly.

FIG. 5A shows a perspective view of a rear portion of audio driver assembly 202. Cap 314 is removed from audio driver assembly 202 to reveal a rear-facing surface of U-cup 310. U-cup 310 is coupled to peripheral tab portions 508 of phase plug 304. Wires 502 are also depicted and can electrically couple audio components of audio driver assembly 202 to respective driver screw terminals 316. Amplifier board 228 is shown secured to audio driver assemblies 202 by fasteners 504, which are depicted engaging driver screw terminals 316. FIG. 5A also shows a rear view of U-cup 310, which includes engaging features 506 that engage tabs 508 of phase plug 304.

Figure 5B:
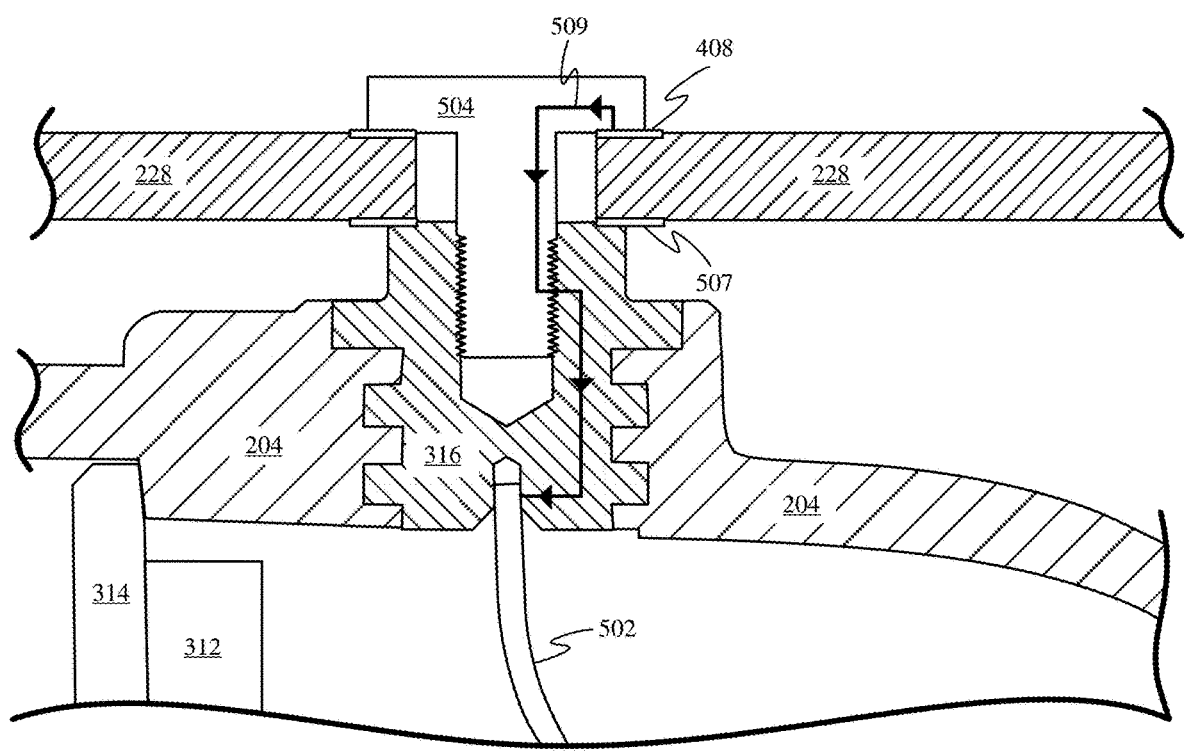
FIGS. 5B-5C show cross-sectional views of different embodiments in which a fastener is used as a portion of an electrically conductive pathway.

FIG. 5B shows a cross-sectional view of fastener 504 engaging driver screw terminal 316. Fastener 504 can be an electrically conductive fastener and can be configured to carry a signal received from terminal 408 disposed upon amplifier board 228. In some embodiments, amplifier board 228 can also include a lower terminal 507 disposed on a lower surface of amplifier board 228. In some embodiments, lower terminal 507 can be compressed against driver screw terminal 316, allowing signals to be transferred or a grounding path to be established between lower terminal 507 and driver screw terminal 316 along electrically conductive pathway 509. Those signals can then be transferred to wire 502, which is soldered to a lower portion of driver screw terminal 316. The signals can include instructions for generating audio using the audio components within driver housing 204. In some embodiments, one of wires 502 can be used to receive instructions and the other can be configured to receive power. In some embodiments, one of wires 502 can function as a grounding pathway.

Figure 5C:
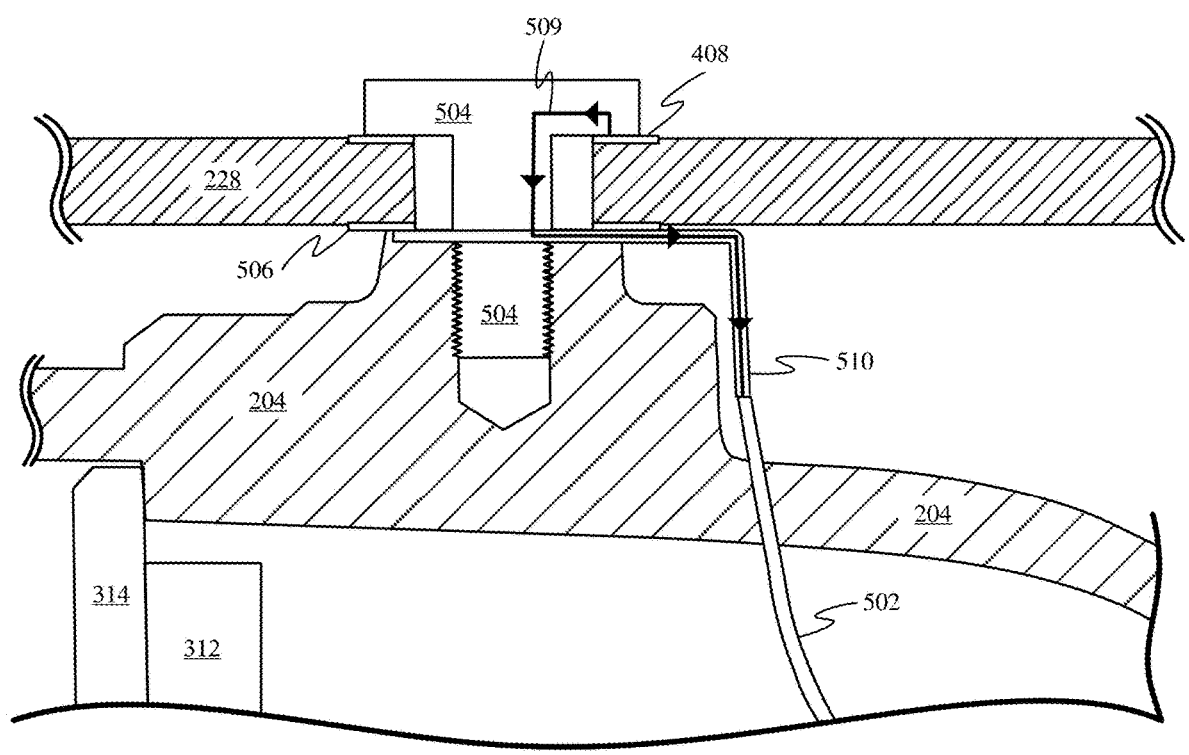

FIG. 5C shows another embodiment in which fastener 504 engages an opening defined by driver housing 204. When driver housing 204 is made of electrically insulating materials, electrical signals and power can be routed into driver housing 204 by one or more of wires 502. In some embodiments, sheet metal 510 can be positioned between driver housing 204 and amplifier board 228. Sheet metal 510 can be bent in order to help define electrically conductive pathway 509 toward an exterior surface of driver housing 204. Sheet metal 510 can also define an opening or a notch configured to accommodate fastener 504. In some embodiments, wire 502 can be soldered to sheet metal 510.

Figure 6:
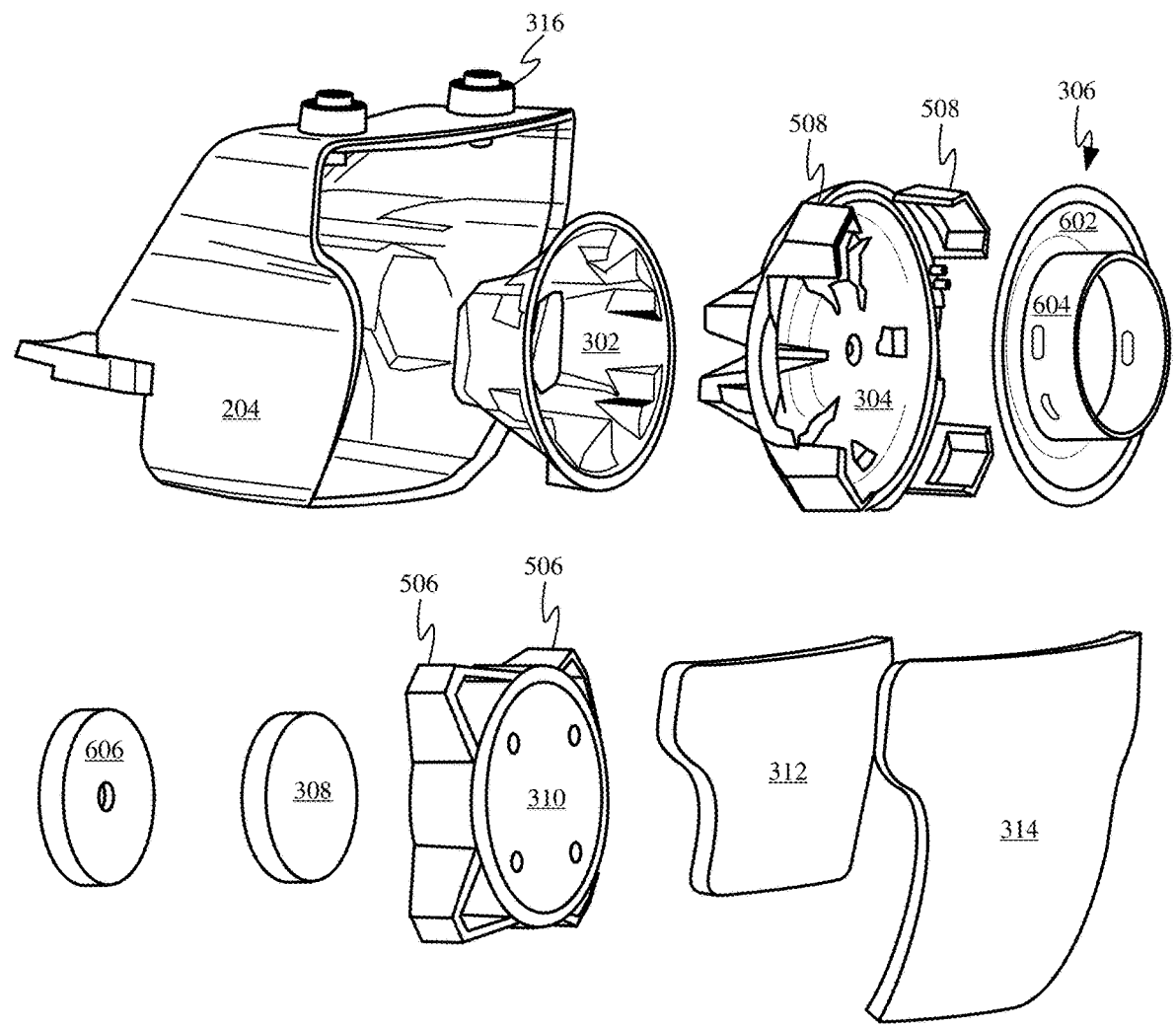
FIG. 6 shows an exploded view of a driver assembly.

FIG. 6 shows an exploded view of audio driver assembly 202. Adapter 302 can be inserted into driver housing 204. Driver housing 204 can include have internal features suited to receive adapter 302. Adapter 302 can define an opening allowing audio waves to pass through adapter 302 and out of driver housing 204. A rear-facing surface of adapter 302 can be configured to receive protrusions of phase plug 304. Phase plug 304 defines a number of openings that shape the audio waves in a manner that prevents destructive interference as the audio waves are being directed toward the exit of driver housing 204. Phase plug 304 is also depicted with tabs 508, which are configured to be engaged by engaging features 506 of U-cup 310.

FIG. 6 also depicts coil assembly 306, which includes diaphragm 602 and coil 604. Coil 604 is electrically coupled with a power source so that it is able to receive alternating current. The alternating current results in coil 604 outputting a shifting magnetic field that interacts with the magnetic field emitted by permanent magnet 308 of the magnetic motor assembly. This interaction results in coil assembly 306 traveling back and forth between phase plug 304 and U-cup 310. The direction of travel of coil assembly 306 can be defined by the direction of the circumferential current flow in the coil and the direction of the radially oriented magnetic flux within the air gap between top plate 606 and U-cup 310 that is generated by permanent magnet 308. The direction of force is perpendicular to both the flow of current in coil 604 and the magnetic flux lines. Motion is permitted in that direction by a compliant surround portion of diaphragm 602. Plate 606 can be coupled to permanent magnet 308 and designed to help shape the flow of magnetic flux emitted by permanent magnet 308. The force applied to coil 604 results in diaphragm 602 moving and generating audio waves that travel through phase plug 304 and then out of driver housing 204.

Figure 7:
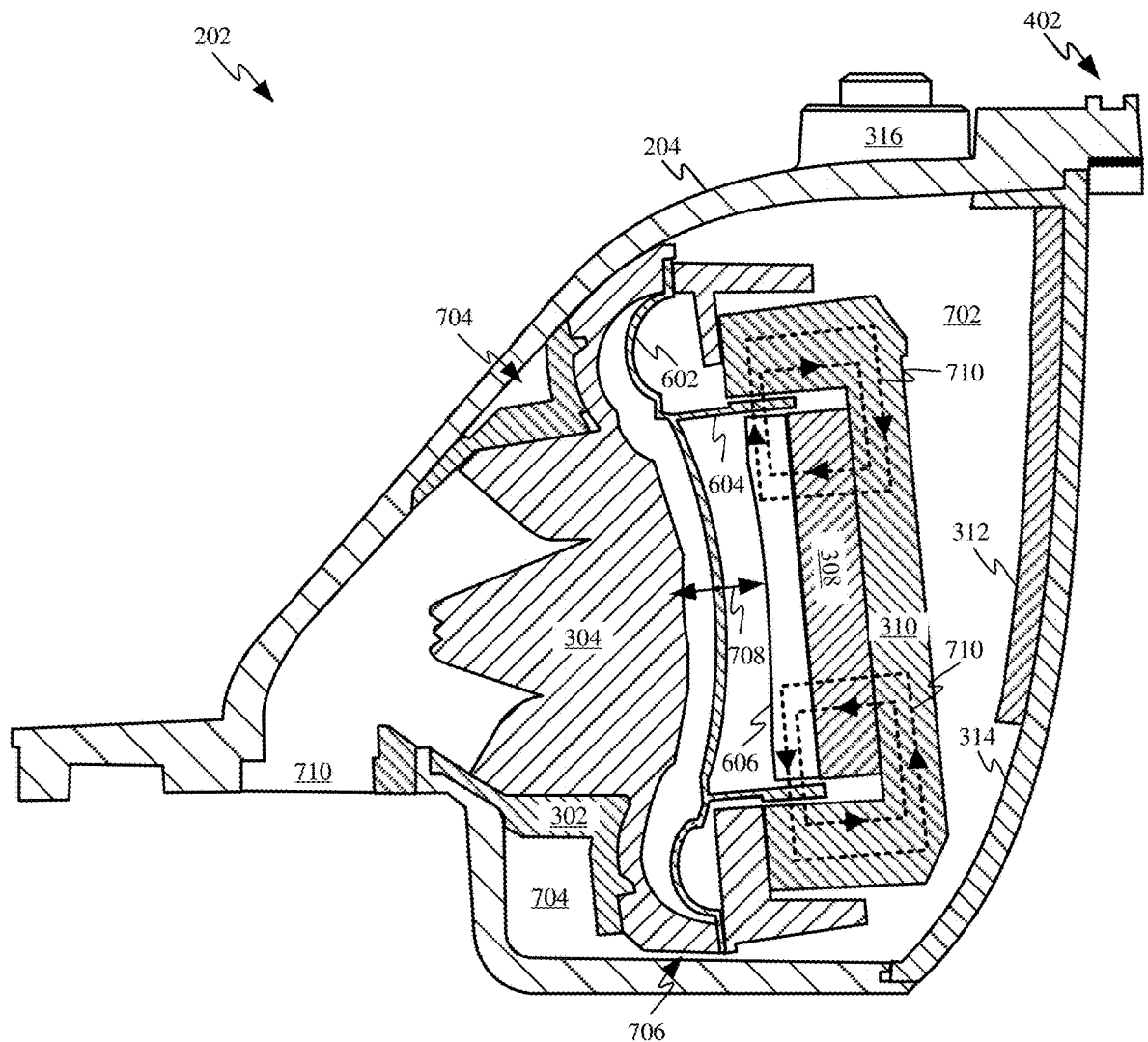
FIG. 7 shows a cross-sectional view of the driver assembly.

FIG. 7 shows a cross-sectional view of audio driver assembly 202. In particular, a back volume 702 of audio driver assembly 202 is depicted. Generally a back volume refers to an open area within the speaker housing containing air that is in fluid communication with a rear-facing surface of a diaphragm and not in fluid communication with a listener. Similarly, a front volume refers to another open area within the speaker housing containing air that is in fluid communication with both a forward-facing surface of the diaphragm and the listener. A larger back volume 702 increases the amount of air behind diaphragm 602 helping to increase low frequency output at a given power output for audio driver assembly 202. An apparent size of back volume 702 can be increased by foam layer 312, which by slowing air down within the back volume increases the apparent volume of back volume 702. Back volume 702 can also be enlarged by a portion of back volume 704 that is forward of the diaphragm. By leaving a gap 706 between phase plug 304 and driver housing 204, the additional open space can be added on to the total volume of back volume 702. In some embodiments, this additional volume forward of diaphragm 602 can substantially improve audio performance when diaphragm 602 oscillates in the direction indicated by arrow 708. In some embodiments, back volume 702 and forward back volume 704 can add up to about 17 CCs. FIG. 7 also shows magnetic flux flow lines 710 and how both U-cup 310 and plate 606 cooperate to define a flux flow path for the magnetic field emitted by permanent magnet 308. In this way, the magnetic field can be concentrated around the path along which coil 604 traverses during operation of audio driver assembly 202.

Figure 8:
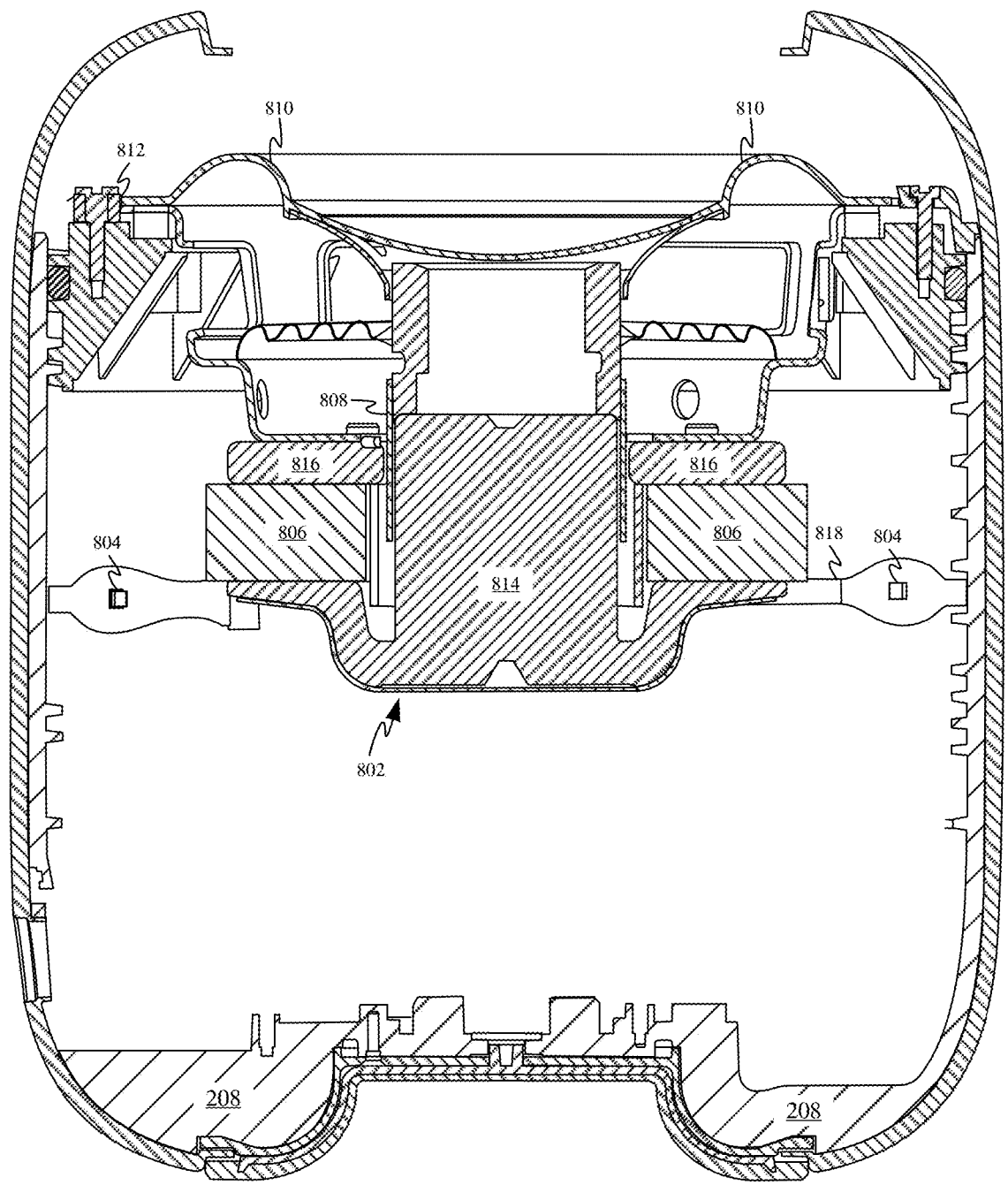
FIG. 8 shows a cross-sectional view of the array speaker that includes only components within a central portion of the array speaker.

FIG. 8 shows a cross-sectional view of array speaker 100 that includes only components within a central portion of array speaker 100. FIG. 8 depicts both subwoofer 802 and microphones 804. Subwoofer 802 includes a permanent ring magnet 806 for driving a coil 808 and a diaphragm 810 of subwoofer 802. It should be noted that diaphragm 810 can also be referred to as a cone. While the cone terminology often refers to a rigid oscillating member associated with a subwoofer, for the purposes of this description, the oscillating member of the subwoofer will be described generally as a diaphragm. Subwoofer 802 can be mounted to lower housing component 208 by damped coupling 812, which can minimize an amount of force and/or vibration transferred to lower housing component 208 from subwoofer 802. A magnetic field emitted by ring magnet 806 can be shaped by pole structure 814 and plate structure 816. An air gap between pole structure 814 and plate structure 816 can help localize the magnetic field emitted by ring magnet 806 around coil 808.

The position of subwoofer 802 in the upper portion of the housing allows the region beneath subwoofer 802 to be used as a back volume for enhancing the audio produced by subwoofer 802. While not depicted this back volume area includes audio driver assemblies 202. This works well since the audio waves generated by audio driver assemblies 202 are isolated by housings 204 of audio driver assemblies 202 and the audio generated by audio driver assemblies 202 exits out the bottom end of the device housing.

FIG. 8 also shows how microphones 804 can be distributed radially as depicted in FIG. 8. In some embodiments, a flexible ribbon cable or flexible PCB 818 can be utilized to electrically couple together each of microphones 804. In some embodiments, microphones 804 can be configured to detect both internal audio sources and external audio sources. In some embodiments, microphones 804 can be configured to monitor the inside of array speaker 100 for distortion or overdriving to prevent speaker damage. In some embodiments, microphones 804 can be configured to relay audible user commands to a processor of array speaker 100. For example, microphones 804 can be aligned with and sealed across an opening in the sidewall of the device housing, thereby allowing multiple microphones 804 to cooperatively triangulate the location of any audio detected by two or more of microphones 804.

Figure 9A:
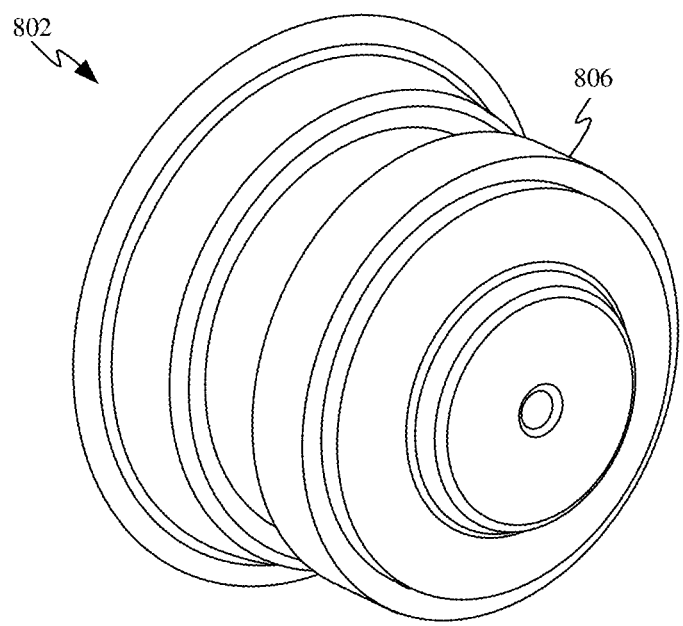
FIG. 9A shows a subwoofer that includes a magnet, which extends radially from the subwoofer.
Figure 9B:
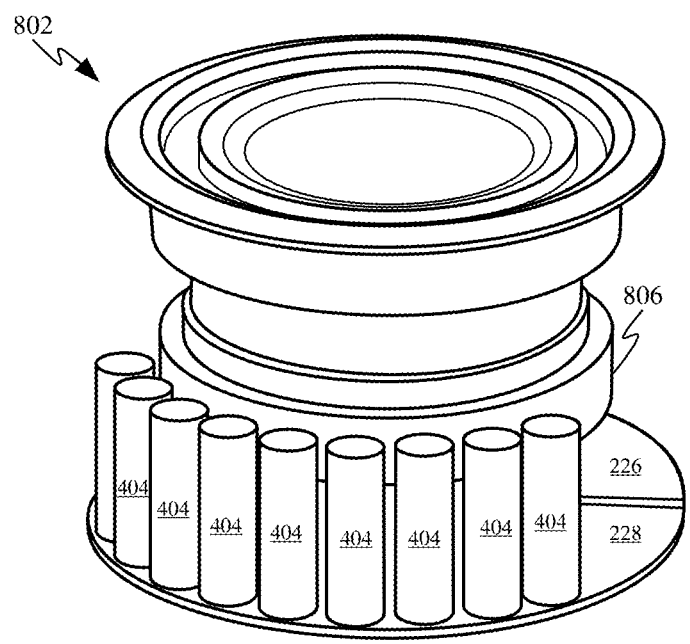
FIG. 9B shows the subwoofer depicted in FIG. 9A and a number of capacitors arranged around the subwoofer.

FIG. 9A shows how magnet 806 of subwoofer 802 can extend radially around a periphery of subwoofer 802 according to an embodiment. Because magnet 806 extends radially from subwoofer 802, capacitors 404 are limited in diameter. For this reason, as depicted in FIG. 9B, more capacitors 404 can be needed to power audio driver assemblies 202 than would be needed with a greater diameter capacitor. Generally, using a greater number of capacitors 404 tends to be more expensive and takes up a larger amount of space on amplifier board 228.

Figure 9C:
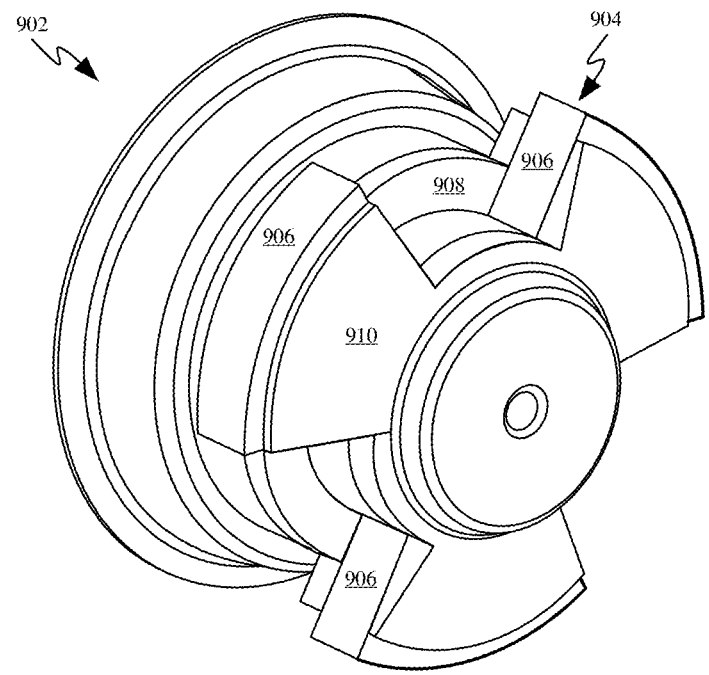
FIG. 9C shows a subwoofer with a magnet having a number of protruding lobes.
Figure 9D:
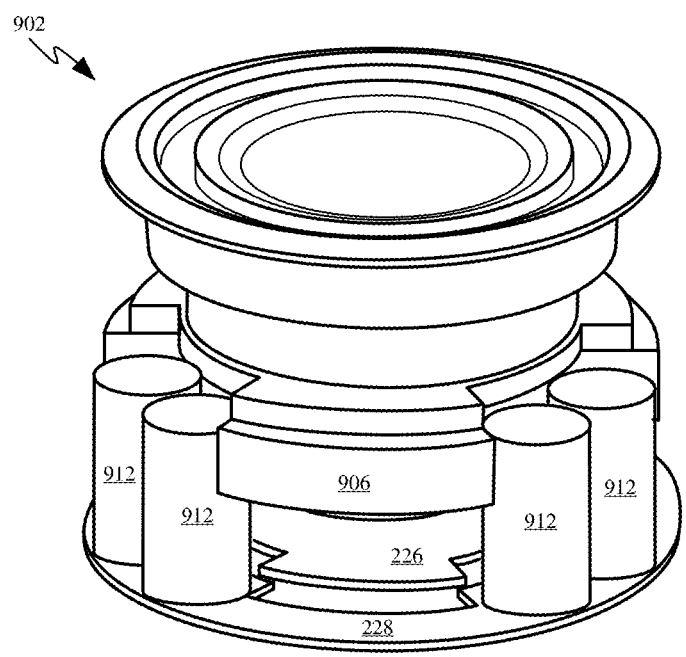
FIG. 9D shows the subwoofer depicted in FIG. 9C and a number of capacitors arranged between the lobes of the magnet.

FIG. 9C shows a subwoofer 902 according to some embodiments of the disclosure that includes a magnet 904 instead of magnet 806. Magnet 904 includes a number of protruding lobes 906 that can extend radially near or in some cases all the way out to the interior facing surfaces of lower housing component 208. While magnet 904 is depicted having three lobes 906 it should be appreciated that magnet 904 could have any number of lobes 906 as long as they are distributed at an even interval about magnet 904. For example, four narrower lobes could also be utilized. The even distribution of the lobes helps to keep the magnetic field emitted by magnet 904 from becoming asymmetric. In addition to lobes 906 it should be appreciated that an upper plate 908 directly above magnet 904 and a lower plate directly below magnet 904 can also be shaped to conform with lobes 906 of magnet 904. FIG. 9D shows how lobes 906 of magnet 904 leaves sufficient room for larger diameter capacitors 912. This configuration would allow audio driver assemblies 202 (not depicted) to be powered by larger diameter capacitors 912. In some embodiments, this can allow more power to be delivered to audio driver assemblies 202 allowing for higher quality and/or louder audio output of driver assemblies 202.

Figure 10A:
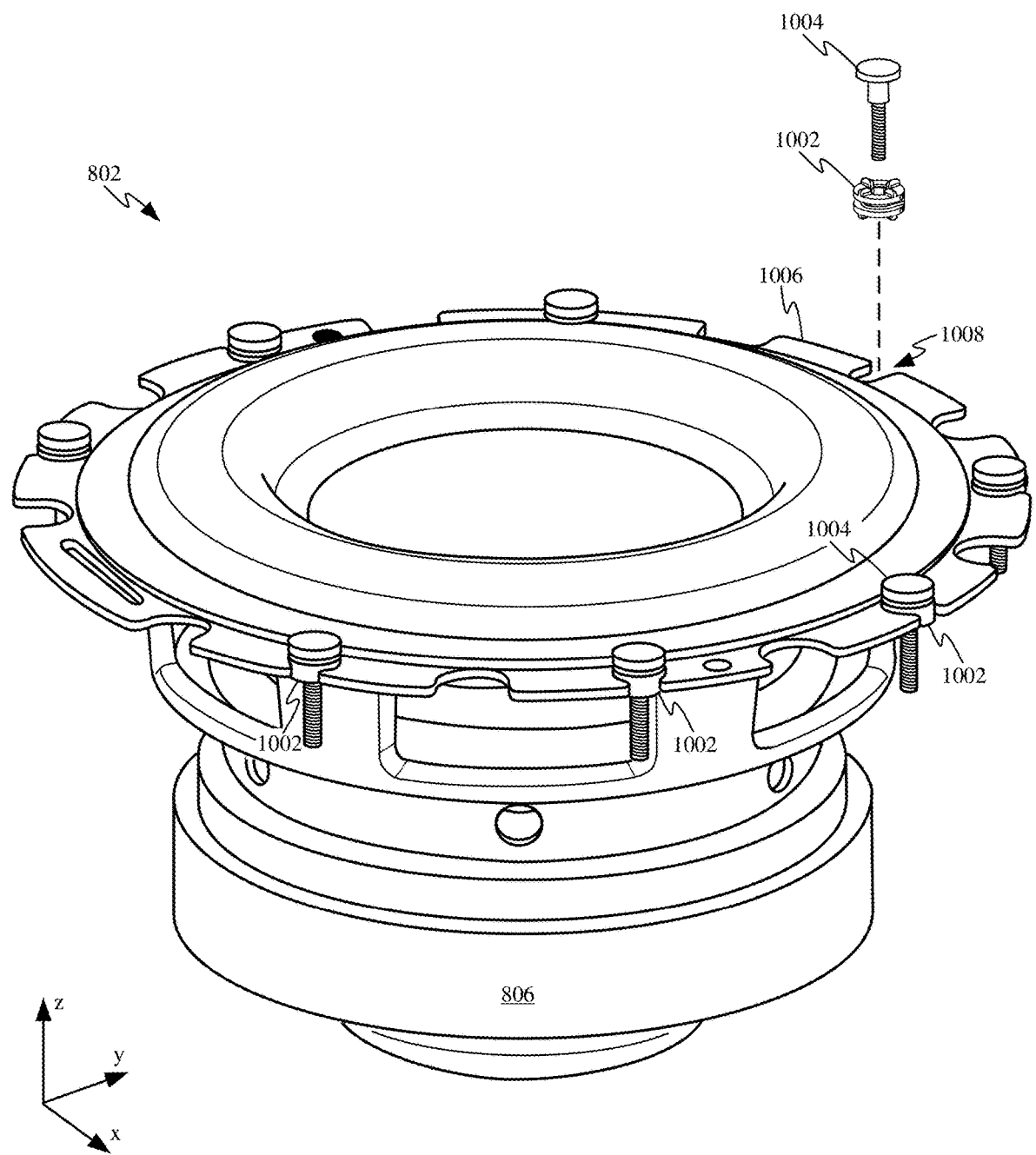
FIG. 10A shows a perspective view of a subwoofer with a lip having multiple notches configured to receive fasteners.

FIG. 10A shows a perspective view of subwoofer 802. Subwoofer 802 includes a lip with multiple notches configured to receive fasteners. The lip is used to secure subwoofer 802 to a housing of array speaker 100. Unfortunately, the inertia of the moving mass of subwoofer 802 creates forces in the Z axis and moments about the X and Y axes, which can lead to visible shaking and hopping of array speaker 100. This could lead array speaker 100 to move laterally while playing music and become a drop hazard. The motion generated by subwoofer 802 can also create vibrations throughout the system, which can cause audible buzzing noises and potentially result in premature component failure or disconnection. Vertical motion of array speaker in the Z axis can also make a touch interface positioned on the top of array speaker 100 more difficult to use. For example, vertical motion of array speaker 100 could cause a user to touch the wrong portion of the touch interface or to make an input earlier than otherwise desired.

FIG. 10A shows a solution to this problem. A number of elastomeric grommets 1002 and shoulder screws 1004 can be used to secure a flange 1006 of subwoofer 802 to a mounting feature within array speaker 100. This can be accomplished by sliding each grommet 1002 into a notch 1008 defined by flange 1006. Once secured within notch 1008, shoulder screw 1004 can be inserted through an opening defined by grommet 1002. A shoulder portion of shoulder screw 1004 can be positioned within the opening defined by grommet 1002 and a threaded portion of shoulder screw 1004 can be used to engage the mounting feature.

Figure 10B:
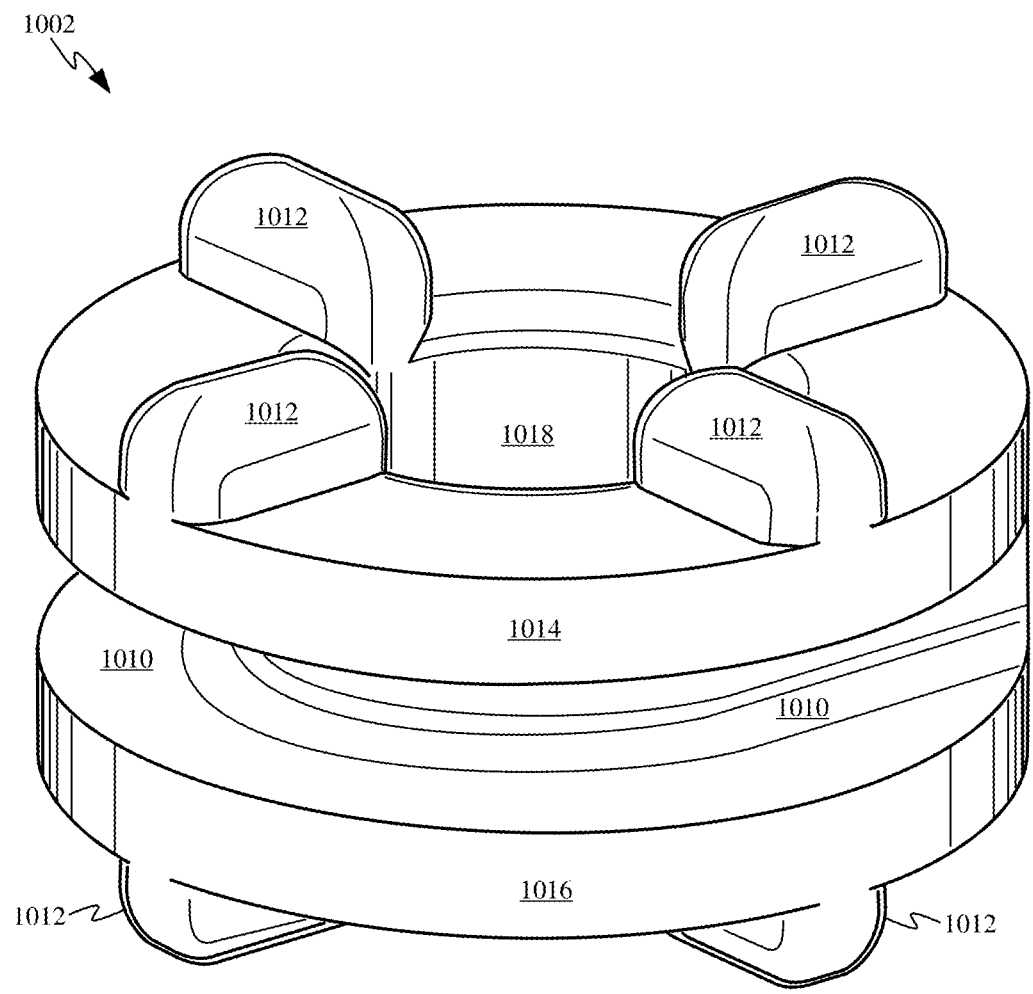
FIG. 10B shows a grommet suitable for mounting the subwoofer.

FIG. 10B shows a perspective view of grommet 1002, which can be made from highly damped rubber and have a specific geometry to achieve optimal stiffness properties to damp oscillations generated by subwoofer 802. Grommet 1002 can define a U-shaped channel 1010 configured to allow grommet 1002 to slide into one of notches 1008. When flange 1006 is engaged within U-shaped channel 1010, the shape of U-shaped channel 1010 acts as an anti-rotation feature that prevents rotation of grommet 1002 within notch 1008. This can be helpful when driving shoulder screws 1004 into an attachment feature. Grommet 1002 also includes protrusions 1012 protruding from upper flange 1014. Protrusions 1012 also protrude from lower flange 1016. Protrusions 1012 can also be configured to compress more easily when shoulder screw 1004 engages grommet 1002 through opening 1018. The height and/or width of protrusions 1012 can be tuned to adjust the overall stiffness provided by grommet 1002.

Figure 11A:
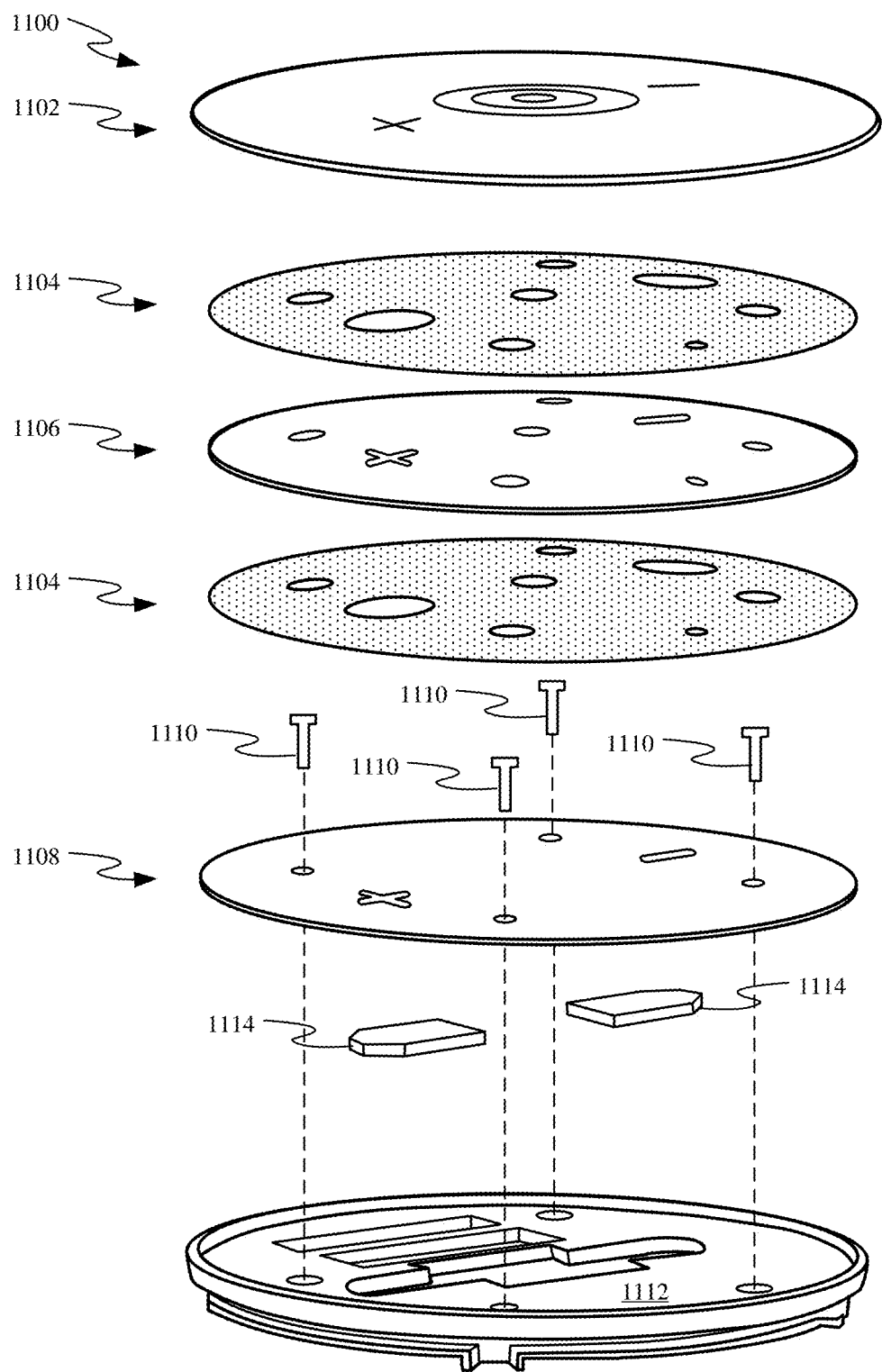
FIG. 11A shows an exploded view of a convex user interface.

FIG. 11A shows an exploded view of a convex user interface 1100. Cosmetic layer 1102 can be formed from glass or plastic and be configured to provide a smooth surface upon which a user can comfortably make inputs. The depicted pattern on cosmetic layer 1102 includes symbols corresponding to increasing and decreasing a setting. In some embodiments, the plus and minus signs can apply to raising the volume or skipping tracks in a song. For example, a long press of the plus can be configured to increase volume while a short press could skip to the next track of a media playlist. Cosmetic layer 1102 can be coupled to adhesive layer 1104. Adhesive layers 1104 can join cosmetic layer to wedge 1106 and wedge 1106 to touch/LED board 1108. Adhesive layers 1104 can define a number of openings configured to reduce any attenuation in the touch signals caused by adhesive layers 1104. Wedge 1106 can define the convex geometry of user interface 1100. A dielectric constant of wedge 1106 can be tuned to efficiently pass touch inputs from cosmetic layer 1102 to touch/LED board 1108. It should be noted that some of the openings defined by adhesive layers 1104 and wedge 1106 can be designed to accommodate fasteners 1110, which secure touch/LED board 1108 to mounting frame 1112. Light guides 1114 can be configured to direct light emitted by light sources coupled to touch/LED board 1108 toward cosmetic layer 1102 of user interface 1100. In some embodiments, the openings defined by the different openings can be configured to allow light from LEDs disposed on touch/LED board 1108 to illuminate portions of cosmetic layer 1102.

Figure 11B:
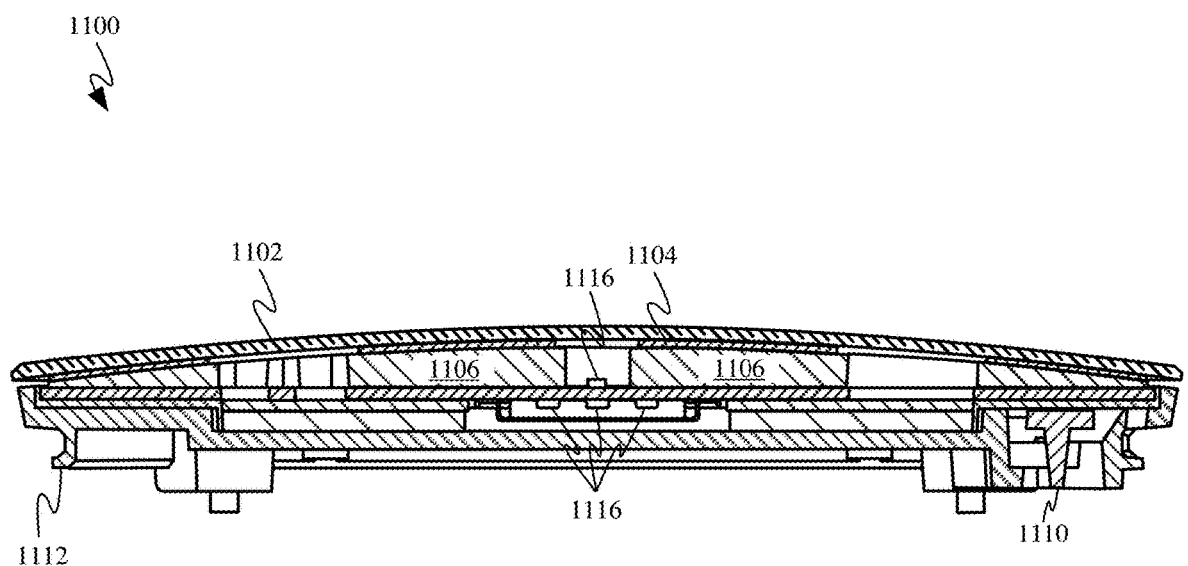
FIG. 11B shows a cross-sectional view of the convex user interface assembled.

FIG. 11B shows a cross-sectional view of assembled convex user interface 1100. LEDs 1116 are depicted on upper and lower surfaces of touch/LED board 1108. In this way, upper LED 1116 can shine light directly toward cosmetic layer 1102. Lower LEDs 1116 shine light into a recess defined by mounting frame 1112. The light emitted by lower LEDs 1116 can then be redirected by light guides 1114 toward other openings situated below the plus and minus indicators of cosmetic layer 1102.

Figure 11C:
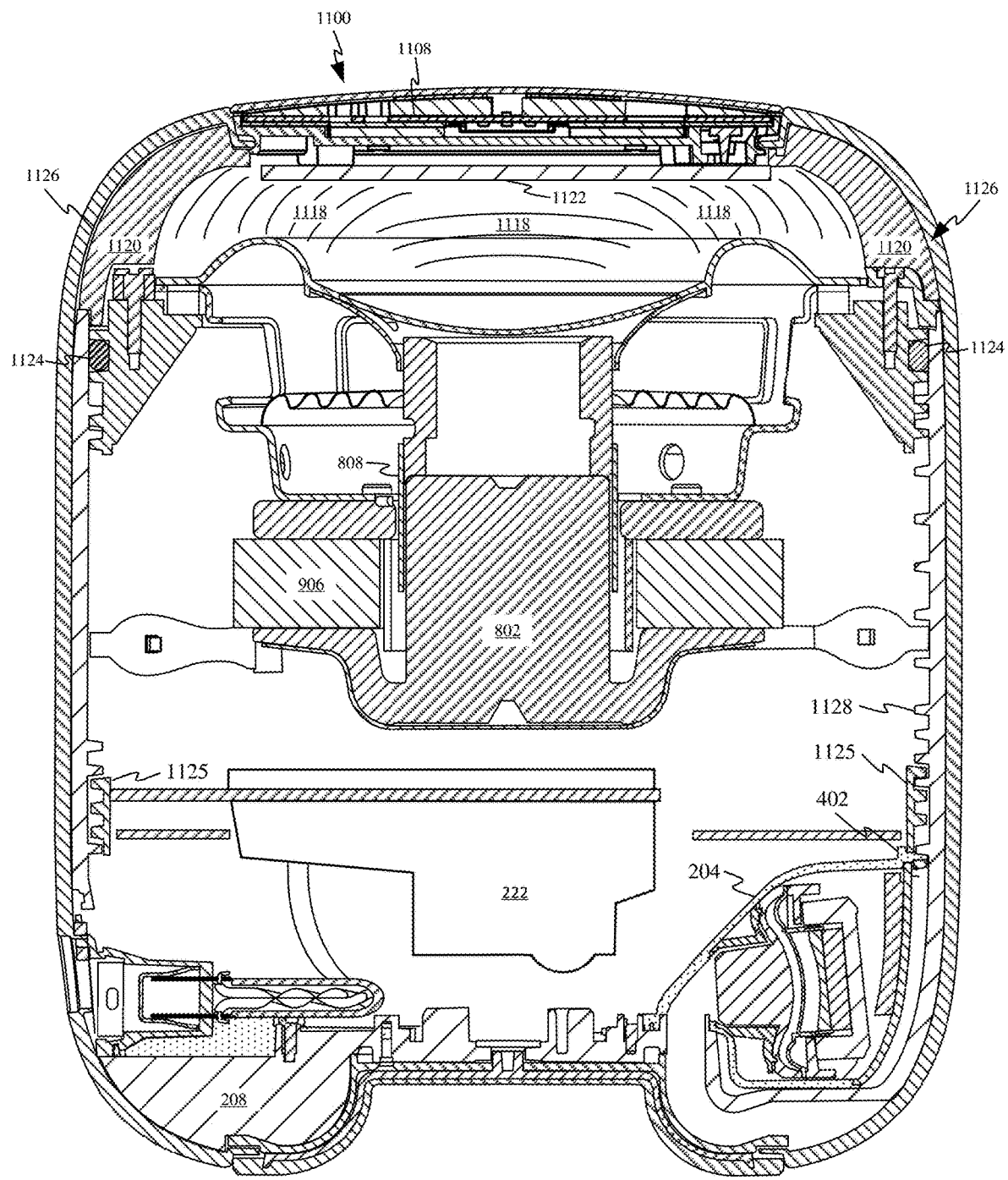
FIG. 11C shows a cross-sectional view of the convex user interface installed within an array speaker.

FIG. 11C shows a cross-sectional view of array speaker 100 with convex user interface 1100 disposed at the top. Audio waves 1118 are shown being generated by the oscillation of subwoofer 802 in a vertical direction. In some embodiments, the oscillation can be aligned with a longitudinal axis of lower housing component 208. In this instance, the term aligned is used to mean that the direction of motion is substantially parallel to the longitudinal axis of lower housing component 208. Audio waves 1118 are configured to exit array speaker 100 through vents 1120. Main logic board 1122 is shown secured to a bottom surface of convex user interface 1100. Main logic board 1122 can include one or more heat generating components such as a processor. Audio waves 1118 incident to main logic board 1122 can dissipate heat generated by the heat generating components of main logic board 1122. In some embodiments, heat generated by touch/LED board 1108 can be conducted to main logic board 1122, where the heat can be convectively dissipated by the air displaced by audio waves 1118. In some embodiments, subwoofer 802 can be configured to operate at a sub-sonic frequency designed to maximize the amount of air pushed past main logic board 1122, when heat dissipation is a priority. In some embodiments, array speaker 100 can include various sensors within above subwoofer 802 that identify high heat loading conditions that could result in heat dissipation becoming a priority. For example, a heat sensor could be affixed to a surface of main logic board 1122. Furthermore, various flow rate sensors could be positioned between subwoofer 802 and vents 1120 to identify any vent blockages. Subwoofer 802 can also be configured to oscillate at a frequency that generates haptic feedback along an exterior surface of convex user interface 102. For example, subwoofer 802 could be commanded to operate at the frequency that generates the haptic feedback in response to one or more different types of user inputs.

FIG. 11C also shows seal 1124, which is configured to seal the back volume of subwoofer 802. Seal 1124 can be useful in preventing upper housing component 1126 from buzzing against lower housing component 208. FIG. 11C also shows vibration ring 1125, which twists along threads 1128. Vibration ring 1125 formed of polymeric material that twists down until it engages channels defined by alignment brackets 402 of driver housings 204 of each driver in order to discourage vibration of audio driver assemblies 202. In some embodiments, vibration ring 1125 can include at least three rows of threads around the periphery of vibration ring 1125.

Figure 12A:
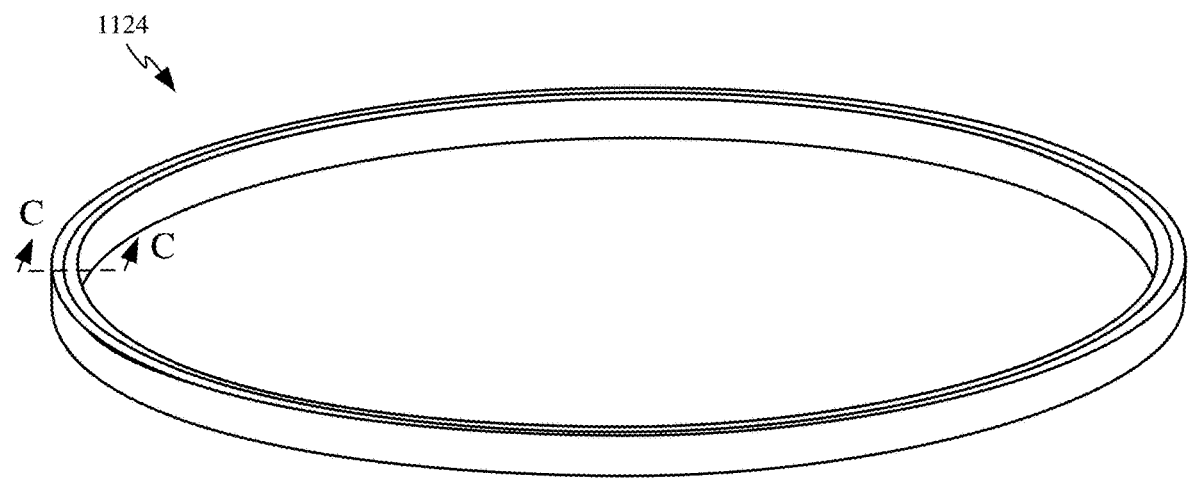
FIGS. 12A-12C show various views of a seal for sealing a first interior portion of the device from a second interior portion of the device.
Figure 12B:
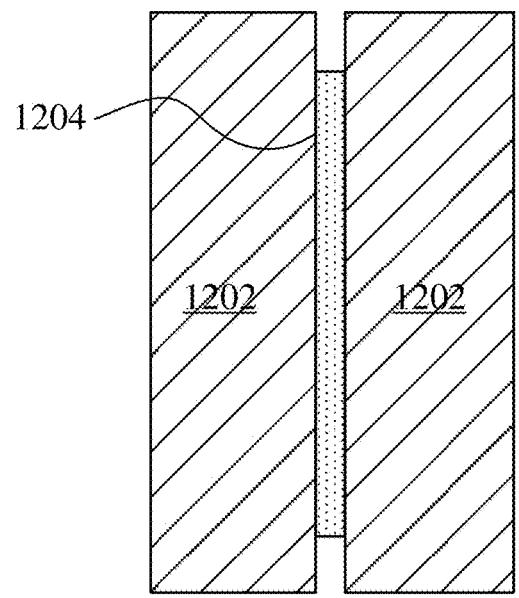
Figure 12C:
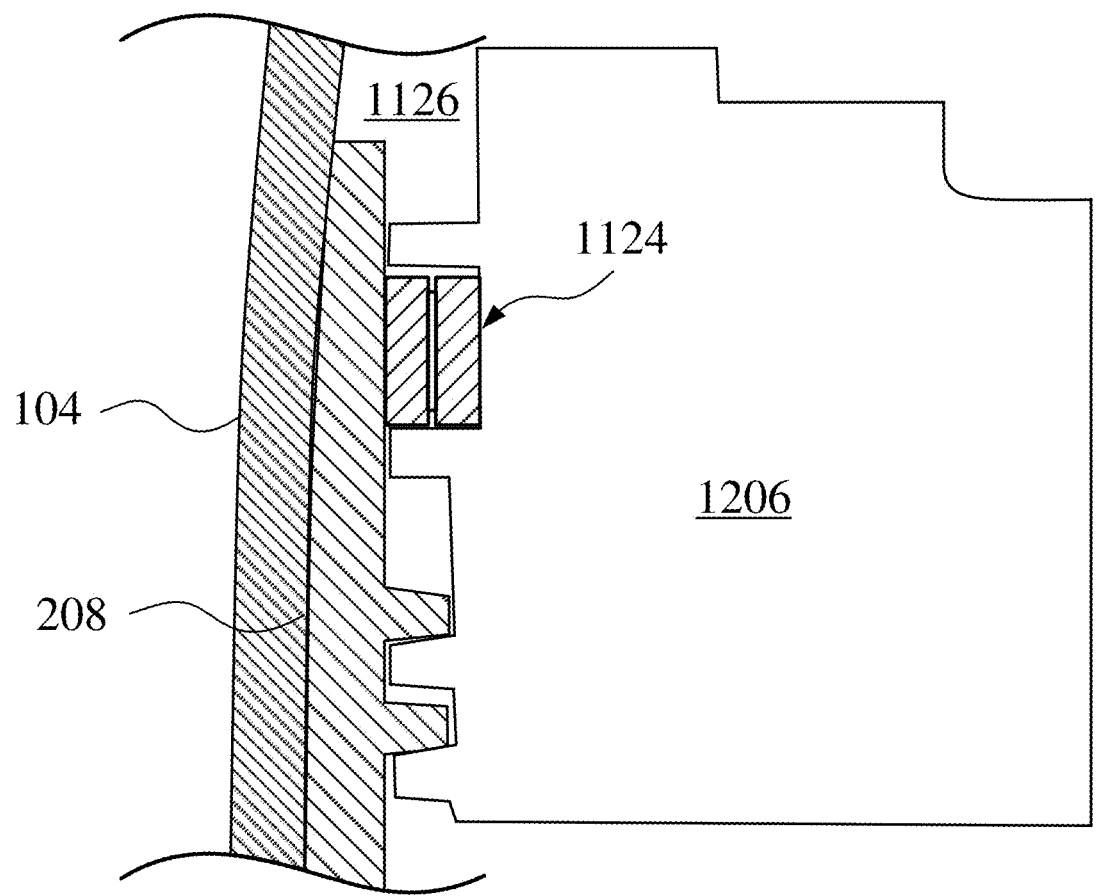

FIG. 12A shows a perspective view of seal 1124. Seal 1124 is arranged in a loop and capable of forming a seal around an audio component secured to lower housing component 208. Seal 1124 is configured to seal across parting lines and absorb tolerances of injection molded plastic parts. Seal 1124 can be made up of multiple layers. FIG. 12B shows a cross-sectional view of seal 1124 in accordance with section line C-C. The cross-sectional view shows how two compliant foam layers 1202 can be joined together by a stiff plastic layer 1204. The stiff plastic layer 1204 can make the installation more reliable by helping to retain the shape of seal 1124. This design can provide better performance at lower cost than a typical O-ring. FIG. 12C shows a close-up view of seal 1124 arranged between upper housing component 1126 and support halo 1206.

Figure 13A:
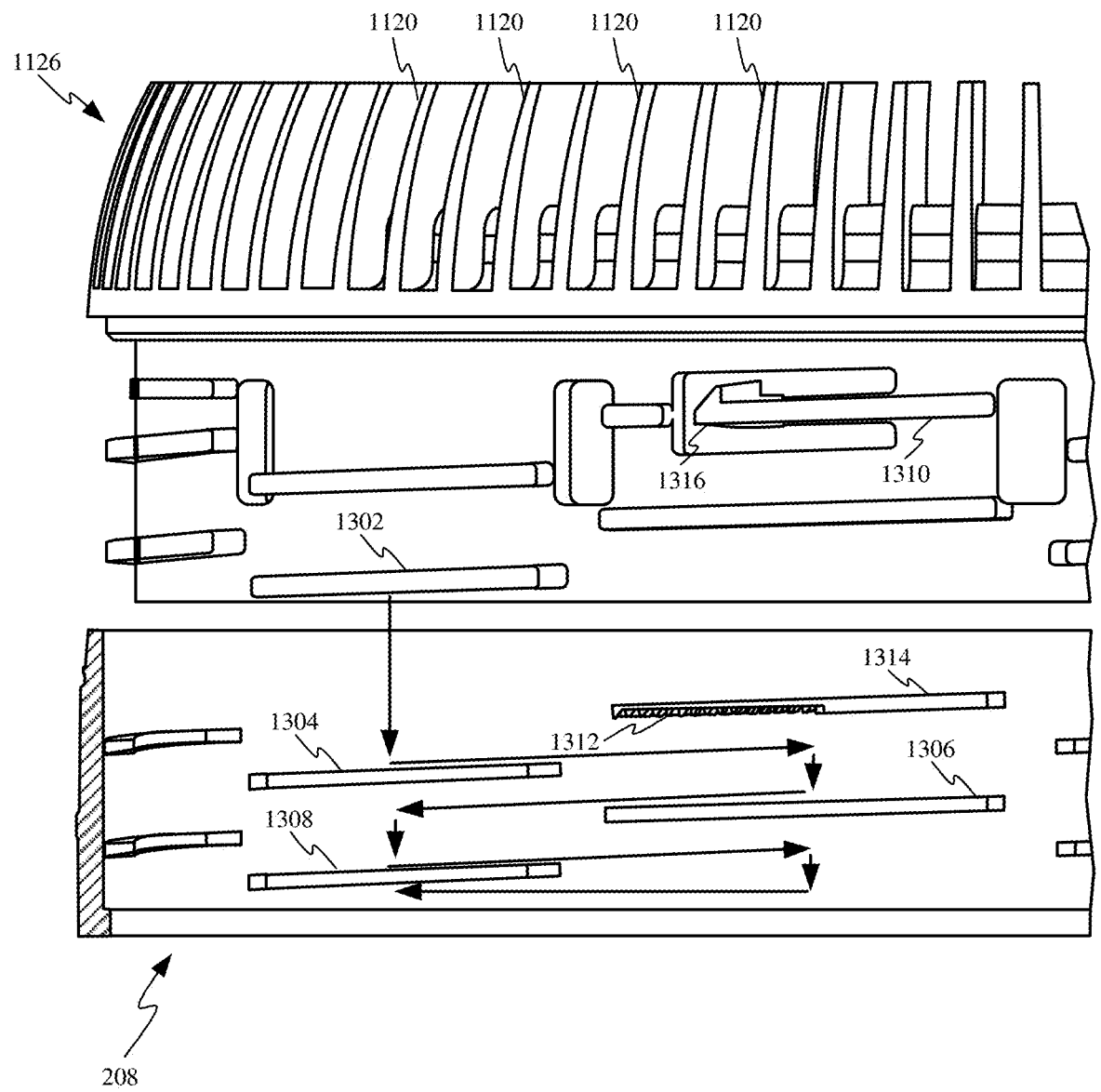
FIGS. 13A-13B show how an upper housing component can be attached to a lower housing component.
Figure 13B:
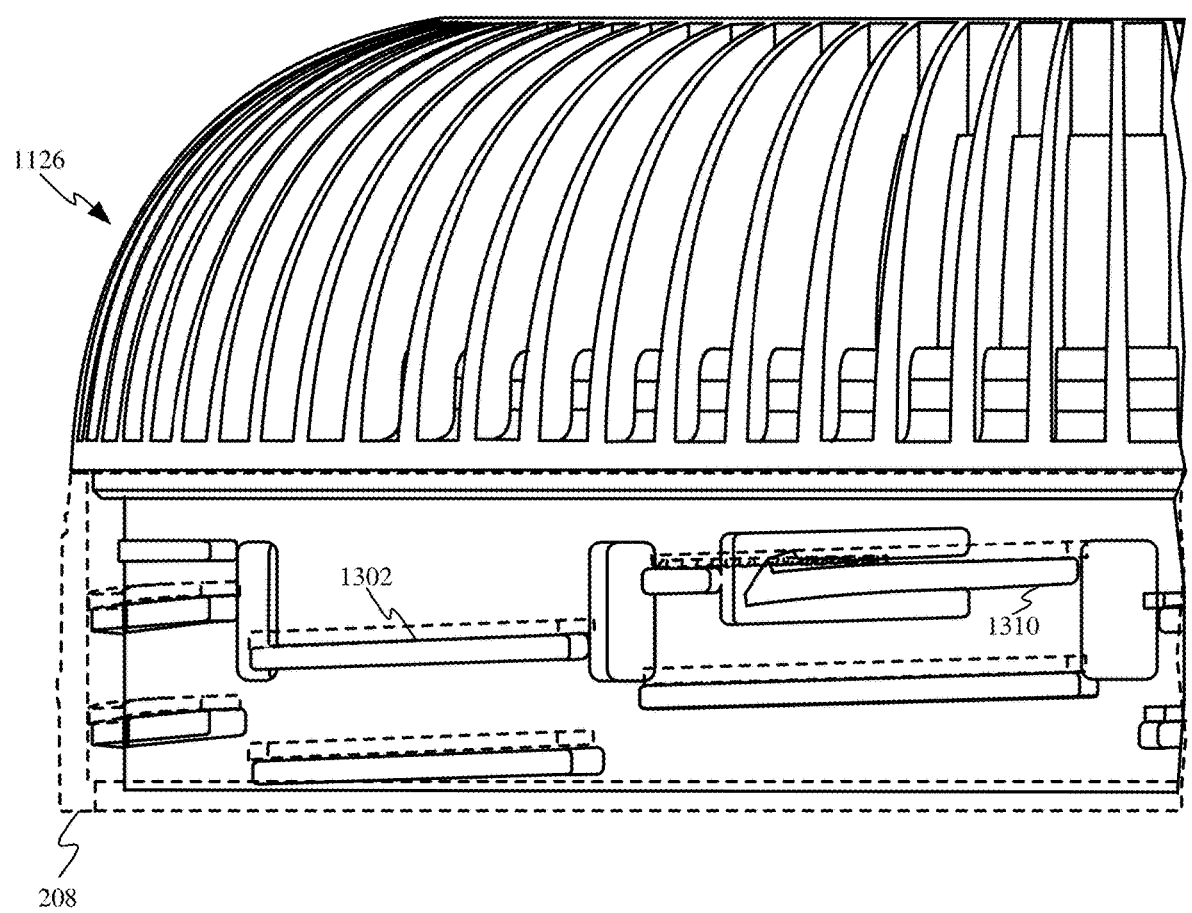

FIGS. 13A-13B show how upper housing component 1126 can be attached to lower housing component 208. Both upper and lower housing components 1126 and 208 include a number of discrete threading segments. The threading segments are arranged on an exterior-facing surface of upper housing component 1126 and an interior-facing surface of lower housing component 208. In order to attach upper and lower housing components 1126 and 208 together, threading segment 1302 of upper housing component 1126 can be aligned with threading segment 1304 of lower housing component 208. Upper housing component 1126 can then be lowered until the threading segments 1302 and 1304 contact each other. Upper housing component 1126 can then be twisted to shift threading segment 1302 to the right until threading segment 1302 clears threading segment 1304 and then contacts threading segment 1306. Once threading segment 1302 contacts threading segment 1306 upper housing component 1126 can be twisted in the opposite direction to move threading segment 1302 to the left until threading segment 1302 clears threading segment 1306 and contacts threading segment 1308. Upper housing component 1126 can continue to move in alternating directions until threading segment 1310 is secured against locking surface 1312 of threading segment 1314. Threading segment 1310 can have a locking feature 1316 configured to engage locking surface 1312. Locking feature 1316 is able to deflect due to an area surrounding locking feature 1316 being removed from upper housing component 1126. FIG. 13B shows upper housing component 1126 locked against lower housing component 208 by interaction between locking surface 1312 and locking feature 1316.

Figure 14A:
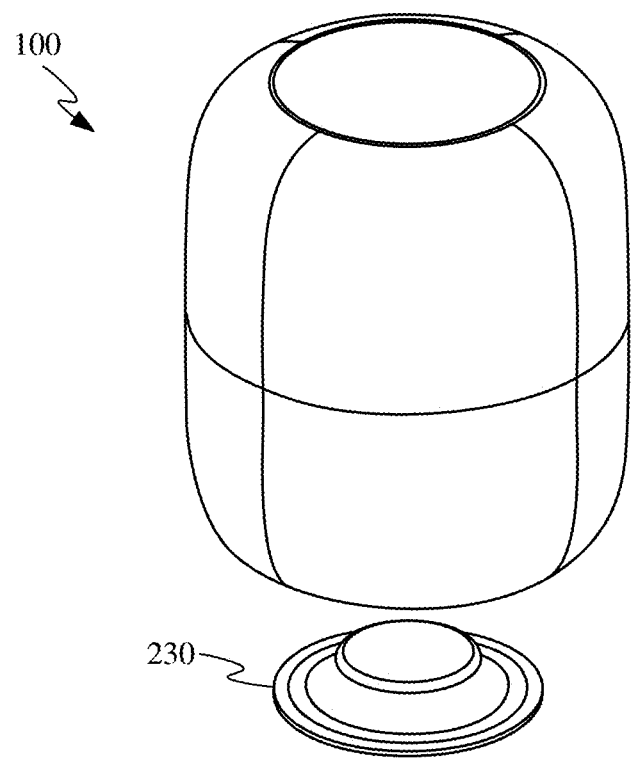
FIGS. 14A-14D show various views of a cantilevered foot.
Figure 14B:
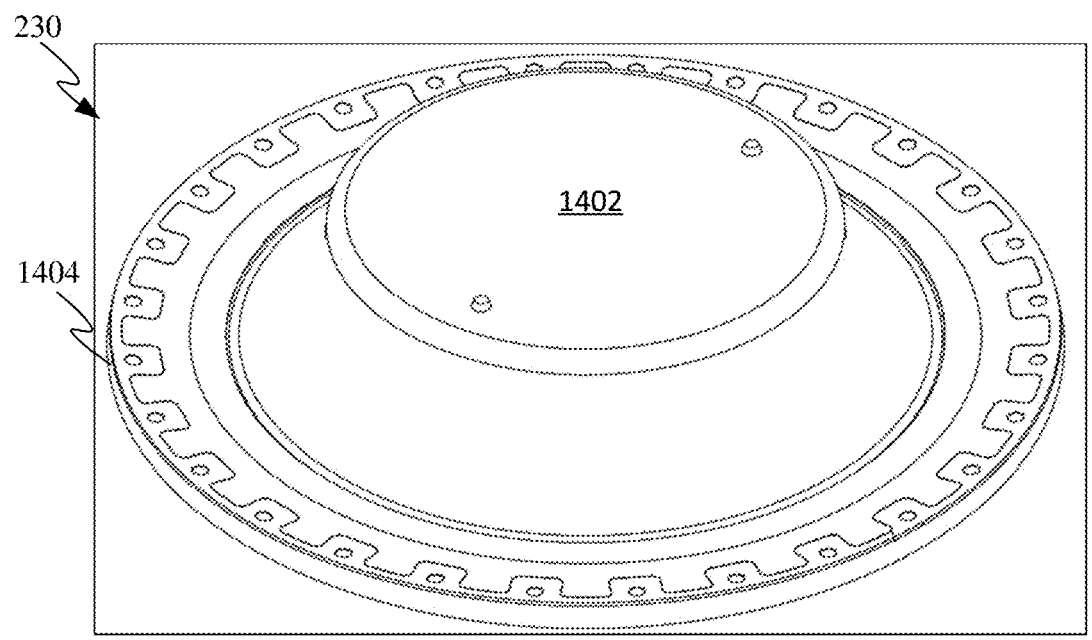

FIGS. 14A-14D show cantilevered foot 230. FIG. 14A shows cantilevered foot 230 just below array speaker 100. Cantilevered foot 230 is configured to support the weight of array speaker 100 above a support surface and to dissipate any vibrations propagating through array speaker 100. FIG. 14B shows a perspective view of cantilevered foot 230. An interior layer 1402 of cantilevered foot 230 can be formed of a somewhat rigid but deflectable material such as polycarbonate. An exterior layer 1404 formed of a more compliant material such as silicone can be configured to dissipate vibrations transmitted to cantilevered foot 230. Unfortunately, sometimes vibrations can be severe enough to cause bouncing or lateral shifting to occur with more standardized vibration dissipating feet.

Figure 14C:
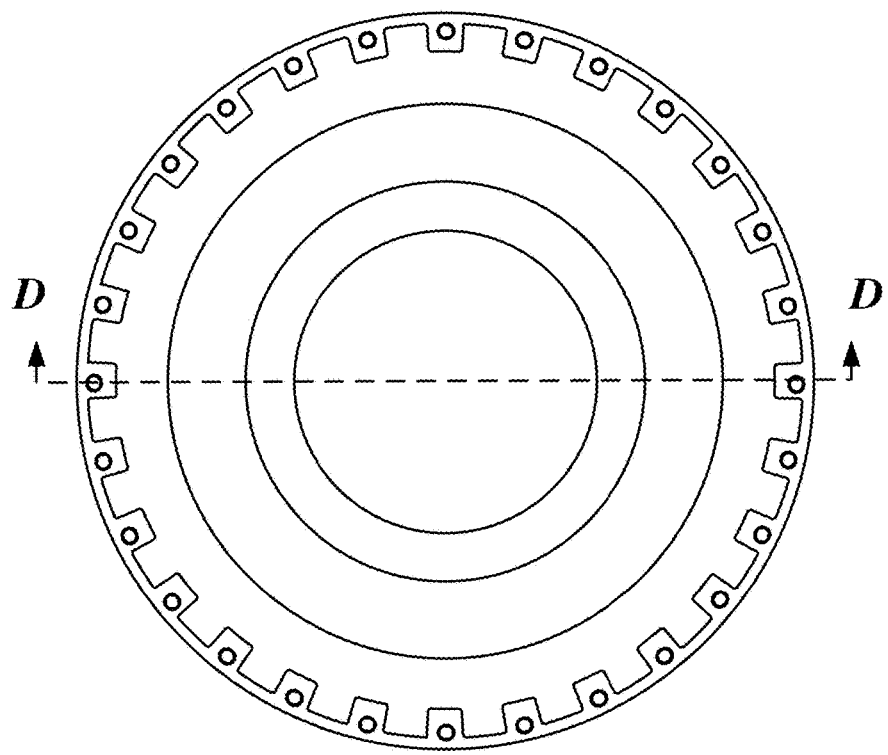
Figure 14D:
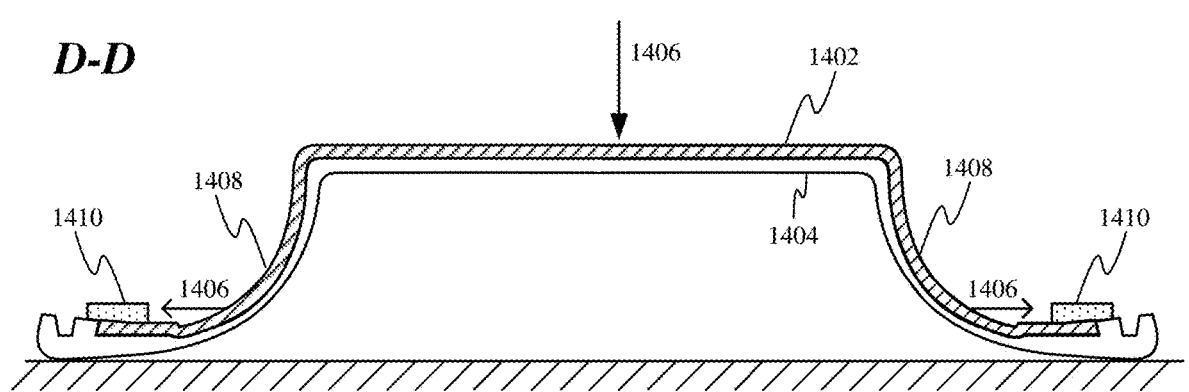

FIG. 14C shows a top view of cantilevered foot 230 and in particular, a section line D-D bisecting cantilevered foot 230. FIG. 14D shows interior layer 1402 and exterior layer 1404. When a force 1406 acts upon cantilevered foot 230, instead of a thickness of exterior layer 1404 being solely responsible for dissipating any vibrations propagated to cantilevered foot 230, cantilevered arms 1408 flex radially to absorb some of force 1406 associated with the vibrations as depicted. This radial flexing results in the vertical vibrations being translated horizontally and substantially reducing the vertical vibrations. The other positive effect of the radial flexing is it places more of exterior layer 1404 in contact with the support surface, increasing the friction between cantilevered foot 230 and the support surface and consequently the resistance of array speaker to lateral shift. In some embodiments, cantilevered foot 230 and grommets 1002 work together to attenuate undesirable vibration of array speaker 100. In some embodiments, annular foam 1410 can be added along a periphery of cantilevered foot 230, which can be configured to prevent unwanted vibration of the periphery of cantilevered foot 230. In this way, foam 1410 is positioned to prevent vibrations that would otherwise generate distracting vibration when the speaker device generates audio waves likely to resonate within cantilevered foot 230.

Figure 15:
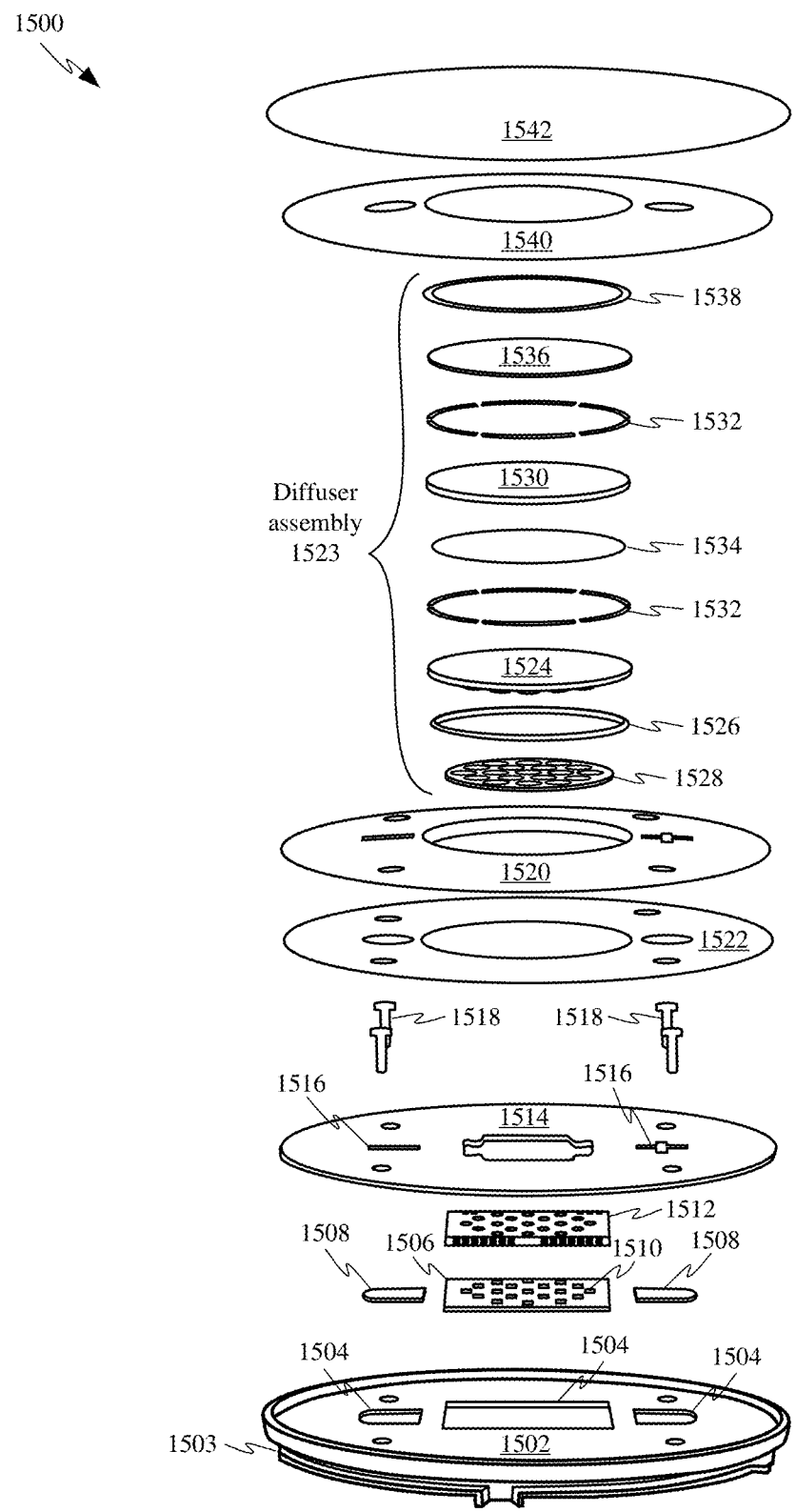
FIG. 15 shows an exploded view of another convex user interface.

FIG. 15 shows an exploded view of an alternative convex user interface 1500 that differs in some respects from the user interface depicted in FIGS. 11A-11C. In particular, convex user interface 1500 includes two distinct illuminated, touch interface regions. User interface 1500 includes a mounting frame 1502, which defines a channel 1503 running along a circumference of mounting frame 1502. Channel 1503 can be configured to receive a drawstring associated with acoustic fabric covering array speaker 100. Channel 1503 allows each end of the drawstring to be conveniently wrapped around mounting frame 1502 along channel 1503. Mounting frame 1502 also defines multiple recesses 1504 configured to receive and accommodate light emitting components. In particular, the light emitting components include LED array board 1506 and light sources 1508. LED array board 1506 includes an array of LEDs 1510. Each of LEDs 1510 can be configured to emit three or more colors of light. LEDs 1510 can also be configured to cooperatively generate various designs associated with a first touch interface region. Light sources 1508 can each include one or more LEDs for emitting one or more colors of light associated with a second touch interface region. Interposer board 1512 can be configured to set a standoff distance between LED array board 1506 and touch printed circuit board (PCB) 1514. Interposer board 1512 can define openings that allow light generated by LEDs 1510 to pass through interposer board 1512. Interposer board 1512 can take the form of an electrically insulating layer having electrically conductive edge plating arranged along its periphery for routing power and signals between touch PCB 1514 and LED array board 1506. In this way, light emitted by LEDs 1510 can be modulated in accordance with touch inputs processed by components associated with touch PCB 1514. Touch PCB 1514 defines a number of apertures through which light generated by the light emitting components generate. In particular, volume control openings 1516 can have the shape of plus and minus symbols associated with increasing and decreasing respectively the volume of the speaker system associated with user interface 1500.

FIG. 15 also shows fasteners 1518, which can be configured to secure touch PCB 1514 to mounting frame 1502. In some embodiments, fasteners 1518 can be self-tapping screws that form threads within openings defined by mounting frame 1502. Touch PCB 1514 can be coupled to wedge 1520 by adhesive layer 1522. Both adhesive layer 1522 and wedge 1520 can include openings through which light emitted by the light-emitting components can pass. Adhesive layer 1522 and wedge 1520 can also include openings to accommodate the head portions of fasteners 1518. Wedge 1520, which has a substantially thicker central region than its peripheral region, can be configured to give user interface 1500 its curved or convex exterior geometry. The central region of wedge 1520 includes an opening for accommodating a diffuser assembly 1523 configured to spread light received from LEDs 1510. Diffuser assembly 1523 includes a lens array 1524 having discrete diffusing optics for each of LEDs 1510. In some embodiments, lens array 1524 can take the form of a single piece of glass spreading the light from each of LEDs 1510. In other embodiments, lens array 1524 can include multiple discrete lenses that spread the light. Lens array 1524 can be secured to touch PCB 1514 by adhesive foam ring 1526. In some embodiments, touch plate 1528 can be secured to a downward facing surface of lens array 1524. Openings defined by touch plate 1528 can accommodate lens protrusions of lens array 1524. Touch plate 1528 can take the form of a thin, electrically conductive plate that improves the capacitive coupling for touch inputs received by user interface 1500. Touch plate can be electrically coupled to touch PCB 1514. In some embodiments, the flat surface of touch plate 1514 can include a touch sensor that is optimized for reading the inputs made at the convex cosmetic touch surface of user interface 1500. For example, a density of a sensing grid associated with touch plate 1514 can have a varied density that allows inputs made to be adjusted for the curvature at the exterior surface. In this way, a consistent user input can be achieved across the entire exterior touch surface of user interface 1500, thereby avoiding the situation in which touch inputs are read at a different speed in the center than along a periphery of the touch sensor. An upward-facing surface of lens array 1524 can be secured to a first diffuser plate 1530 by adhesive strips 1532 arranged along the periphery of lens array 1524. A layer of diffuser film 1534 for additional light spreading can be positioned between first diffuser plate 1530 and lens array 1524. First diffuser plate 1530 can also be configured to increase the amount of diffusion of the light emitted by LEDs 1510.

In some embodiments, first diffuser plate 1530 can be formed from a clear polycarbonate resin that is doped with particles having a different index of refraction than the clear polycarbonate resin. For example, the polycarbonate resin could be doped with Titanium Oxide particles that both give a white appearance to first diffuser plate 1530 and help to further diffuse the light passing through first diffuser plate 1530. First diffuser plate 1530 is secured to a second diffuser plate 1536 by adhesive strips 1532 arranged along the periphery of first diffuser plate 1530. Adhesive strips 1532 can be sized to create a small air gap between the first and second diffuser plates. Second diffuser plate 1536 can have a dome-shaped surface helping diffuser assembly 1523 achieve the same curvature as wedge 1520. Finally a fade film 1538 can be applied to an upward facing surface of second diffuser plate 1536. Fade film can take the form of a radially graduated filter that feathers the intensity of light along a periphery of the light emitted by LEDs 1510. In this way, fade film 1538 prevents adhesive layer 1540 from abruptly shifting from illuminated to unilluminated in a central region of a top cap 1542. Top cap 1542 can take the form of a layer of glass or transparent polymer material such as a polycarbonate material. In some embodiments, top cap 1542 can include a layer of ink that further diffuses light passing through top cap 1542. In some embodiments, light emitted by LEDs 1510 and diffused by the aforementioned diffusive elements can cooperatively generate a mix of light having a diameter of about three centimeters.

Figure 16A:
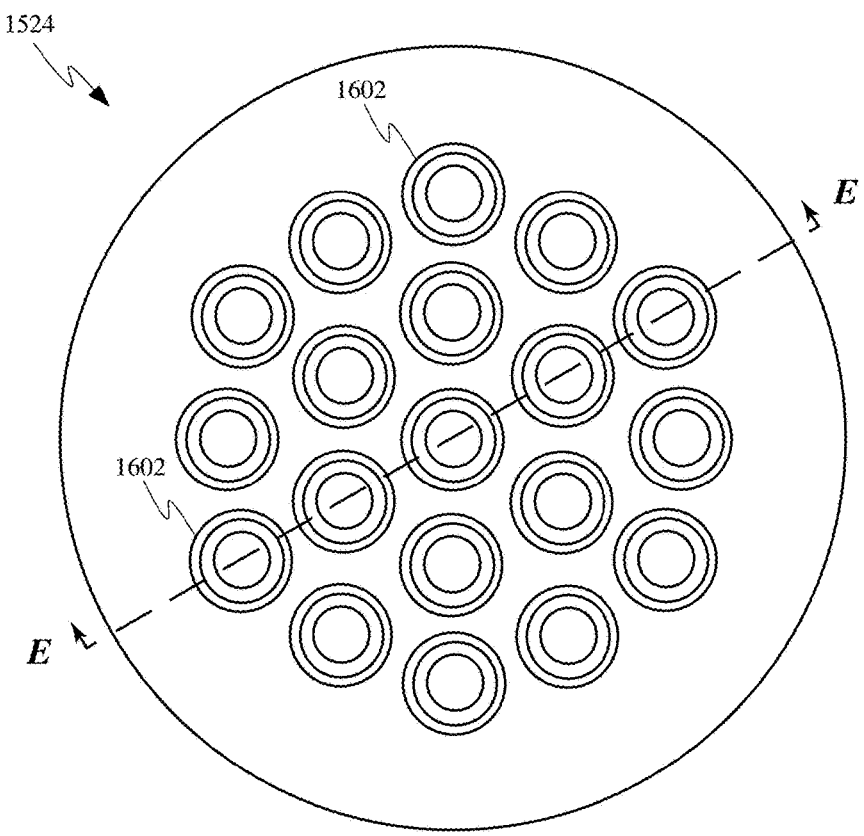
FIG. 16A shows a downward facing surface of a lens array depicted in FIG. 15.

FIG. 16A shows a downward facing surface of lens array 1524. As depicted, lens array 1524 takes the form of a single piece of shaped glass having discrete optics for multiple different light sources. In particular, lens array 1524 includes protruding lenses 1602 for diffusing light from 19 LEDs 1510 that are arranged in a honeycomb pattern. It should be appreciated that a larger or smaller number of LEDs 1510 could be accommodated by lens array 1524. Furthermore, protruding lenses 1602 could be arranged in an irregular pattern or a different regular pattern such as a rectangular grid.

Figure 16B:
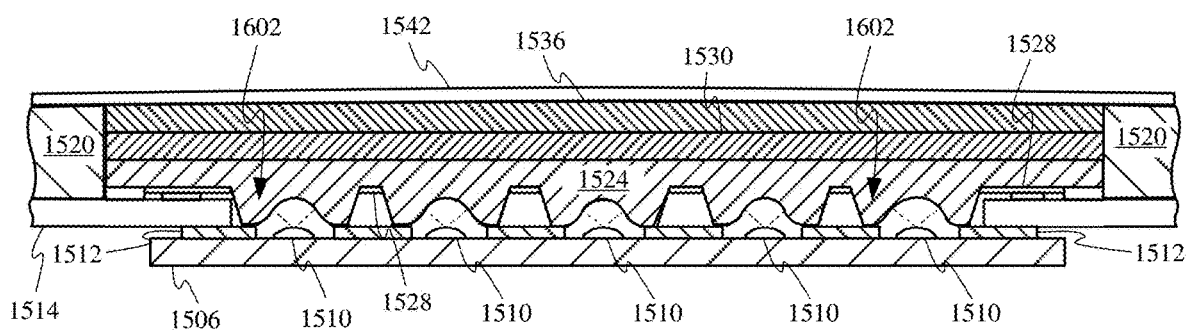
FIG. 16B shows a cross-sectional side view of a portion of the convex user interface depicted in FIG. 15 that includes the lens array in accordance with section line E-E depicted in FIG. 16A.

FIG. 16B shows a cross-sectional side view of a portion of convex user interface 1500 that includes lens array 1524 in accordance with section line E-E. It should be noted that the adhesive layers have been omitted from this view for clarity. In particular LEDs 1510 are shown attached to LED array board 1506. Five LEDs 1510 are shown emitting light into lens array 1524. Protruding lenses 1602 of lens array 1524 diffuse the light received from LEDs 1510 prior to the light entering first and second diffuser plates 1530 and 1536. As depicted, each of protruding lenses 1602 include a concave surface oriented toward a respective one of LEDs 1510. The diffuser plates can be configured to further diffuse this light prior to the light exiting through top cap 1542. By the time the light exits through top cap 1542, the light emitted from each LED 1510 can be mixed with light from adjacent ones of LEDs 1510. In this way, a relatively small number of LEDs can cooperate to produce a mixed pattern of lights at an exterior surface defined by top cap 1542. In some embodiments, the light appearing along the surface can have a total diameter of about 30 mm and light from each LED 1510 can be spread across a diameter of about 7 mm.

Figure 17A:
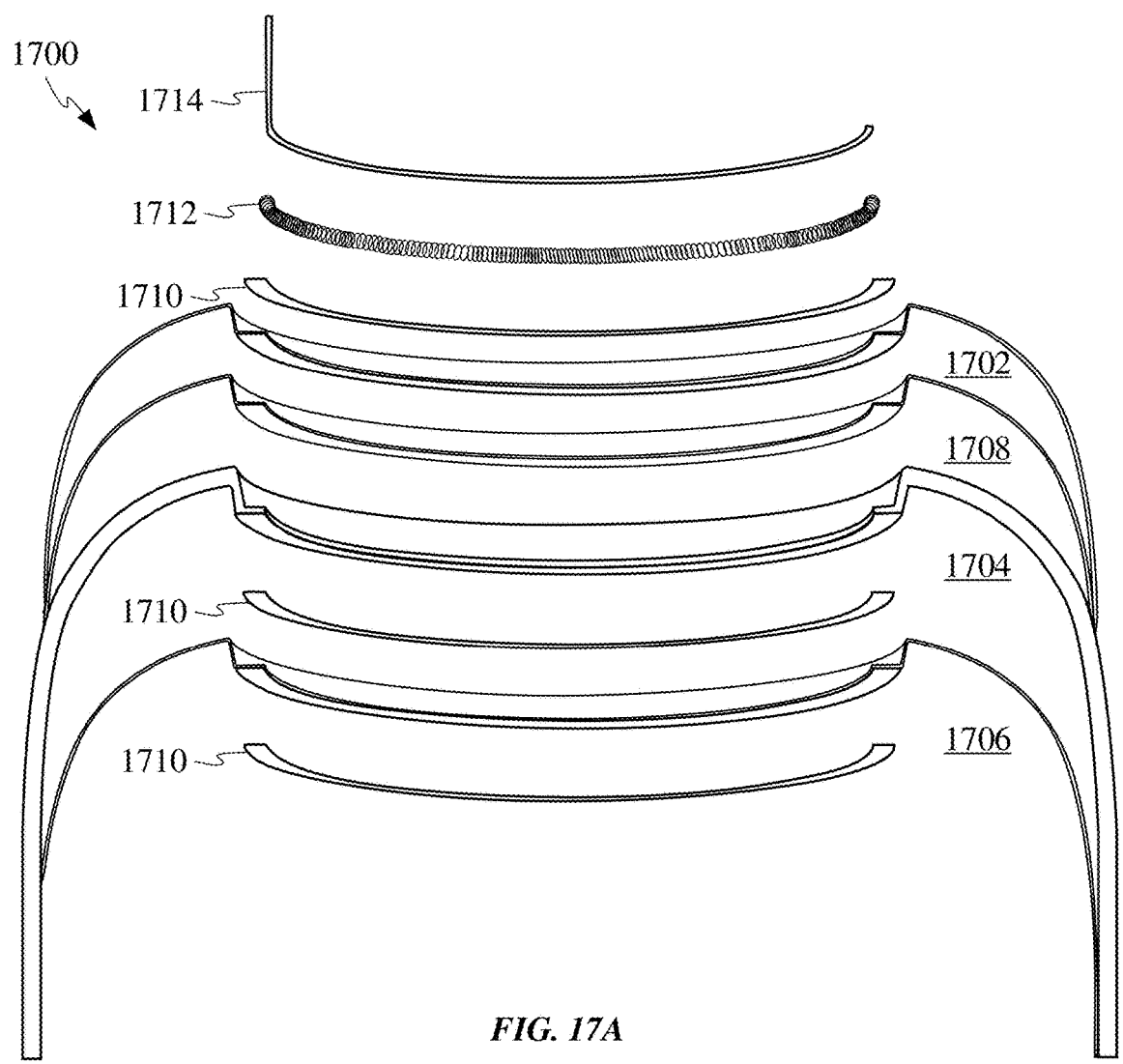
FIG. 17A shows a cross-sectional, exploded view of an expandable opening defined by one end of an exterior cosmetic fabric.

FIG. 17A shows a cross-sectional, exploded view of an expandable opening defined by one end of fabric 1700. Fabric 1700 can take the form of a tube having a fixed size opening at a first end and elastic and/or expandable second end. FIG. 17A depicts the second expandable end. Fabric layers 1702, 1704 and 1706 can be configured to provide a cosmetically pleasing exterior surface for a speaker device without inhibiting the passage of audio waves generated by the speaker device. Fabric layers 1702, 1704 and 1706 can be formed of materials such as polyester, nylon and polyurethane. In some embodiments, fabric layer 1702 can have a diamond shaped pattern defining an array of diamond shaped openings that limit the amount of resistance generated by fabric layer 1702. Fabric layer 1702 can be adhered to fabric layer 1704 by adhesive layer 1708. While adhesive layer 1708 is depicted as a solid layer it should be appreciated that the adhesive can be formed to have the same pattern as fabric layer 1702. In this way, an exterior surface of fabric 1700 can be free of exposed adhesive material. An inner lip of fabric layer 1704 can be coupled to fabric layer 1706 by adhesive ring 1710. Fabric layer 1706 can then be secured to upper housing component 1126 (not shown, see FIG. 13B). In this way, fabric 1700 can be securely coupled to the speaker device.

FIG. 17A also shows stitched threading 1712. In some embodiments, stitched threading 1712 can be sewn to a lip of fabric layer 1702. Stitched threading 1712 can take the form of a fiber arranged in a number of loops arranged along a lip of fabric 1700 and sized to accommodate drawstring 1714. Drawstring 1714 can be threaded through the openings defined by the loops of stitched threading 1712. By pulling on or releasing both ends of drawstring 1714 the lip of fabric 1700 the opening can be expanded or contracted in order to respectively install and remove fabric 1700 from the speaker device.

Figure 17B:
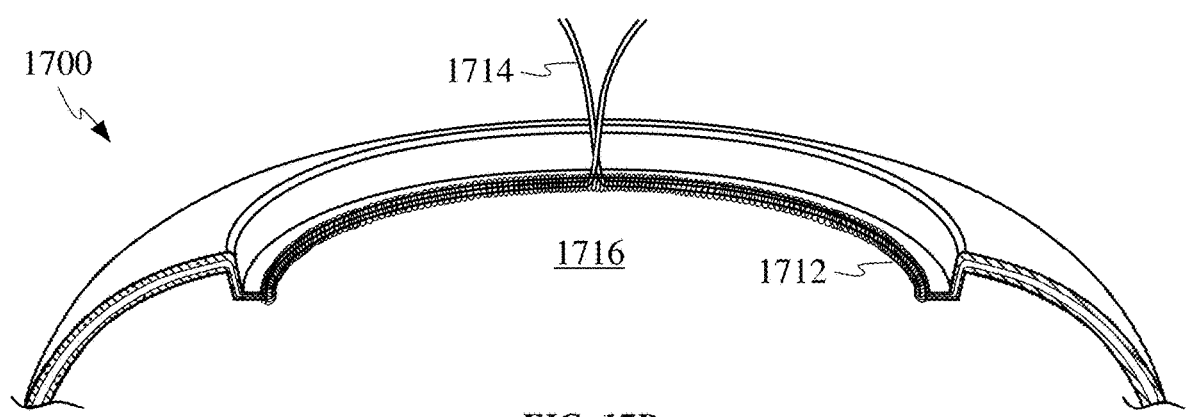
FIG. 17B shows a cross-sectional view of the exterior cosmetic fabric fully adhered together and how both ends of a drawstring can protrude from the same radial position of the exterior cosmetic fabric.

FIG. 17B shows a cross-sectional view of fabric assembly 1700 fully adhered together and how both ends of drawstring 1714 can protrude from the same radial position of fabric assembly 1700. Drawstring 1714 can be long enough to wrap around a mounting frame associated with a user interface of the speaker device, which allows for the drawstring to smoothly contract the opening 1716 defined by fabric 1700. In some embodiments, stitched fabric 1712 and drawstring 1714 can be replaced by an elastic loop insert-molded around the lip of fabric 1700. The elastic loop can act similarly to a rubber band and have the resilience to securely keep the fabric in place while also allowing the fabric defining opening 1716 to be expanded for removal of fabric assembly 1700 off of the speaker device.

Figure 17C:
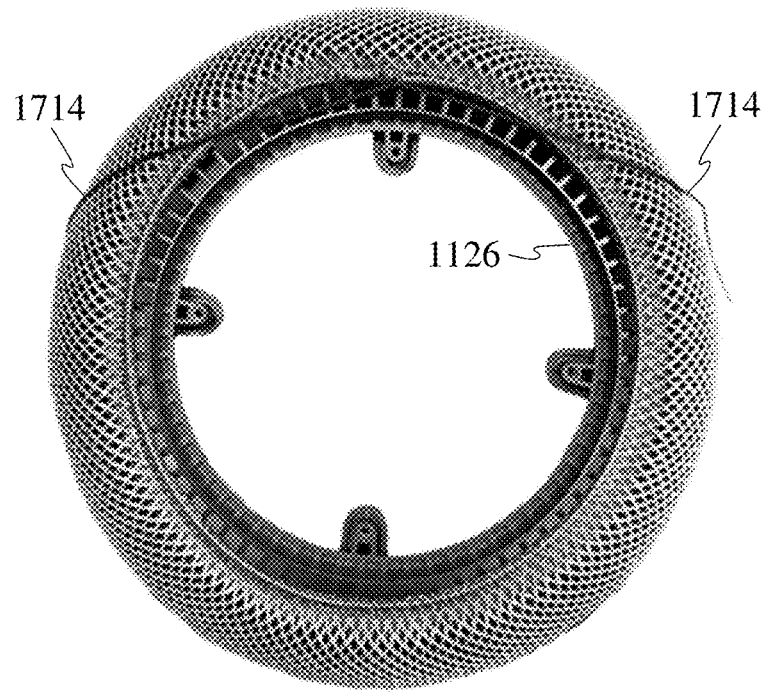
FIGS. 17C-17D show top views of the exterior cosmetic fabric installed around an upper housing component of the array speaker.
Figure 17D:
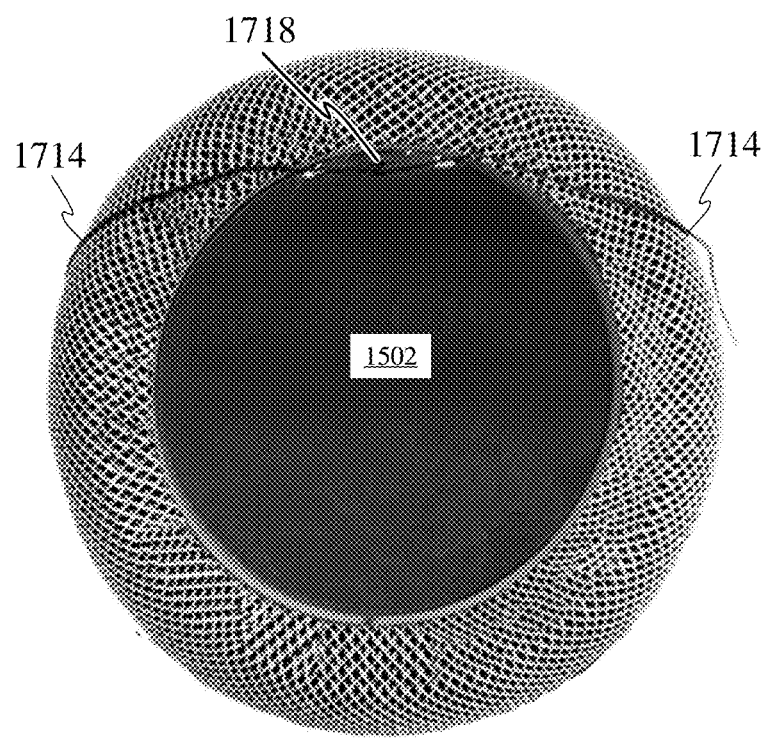

FIG. 17C shows a top view of fabric assembly 1700 installed around a portion of upper housing component 1126. FIG. 17C shows drawstrings 1714 only partially tightened, leaving an annular gap between the opening defined by fabric assembly 1700 and the opening defined by upper housing component 1126. FIG. 17D shows how drawstring 1714 can be routed through an opening 1708 defined by mounting frame 1502 and then tightened causing fabric assembly 1700 to cinch evenly around a periphery of mounting frame 1502.

Figure 18:
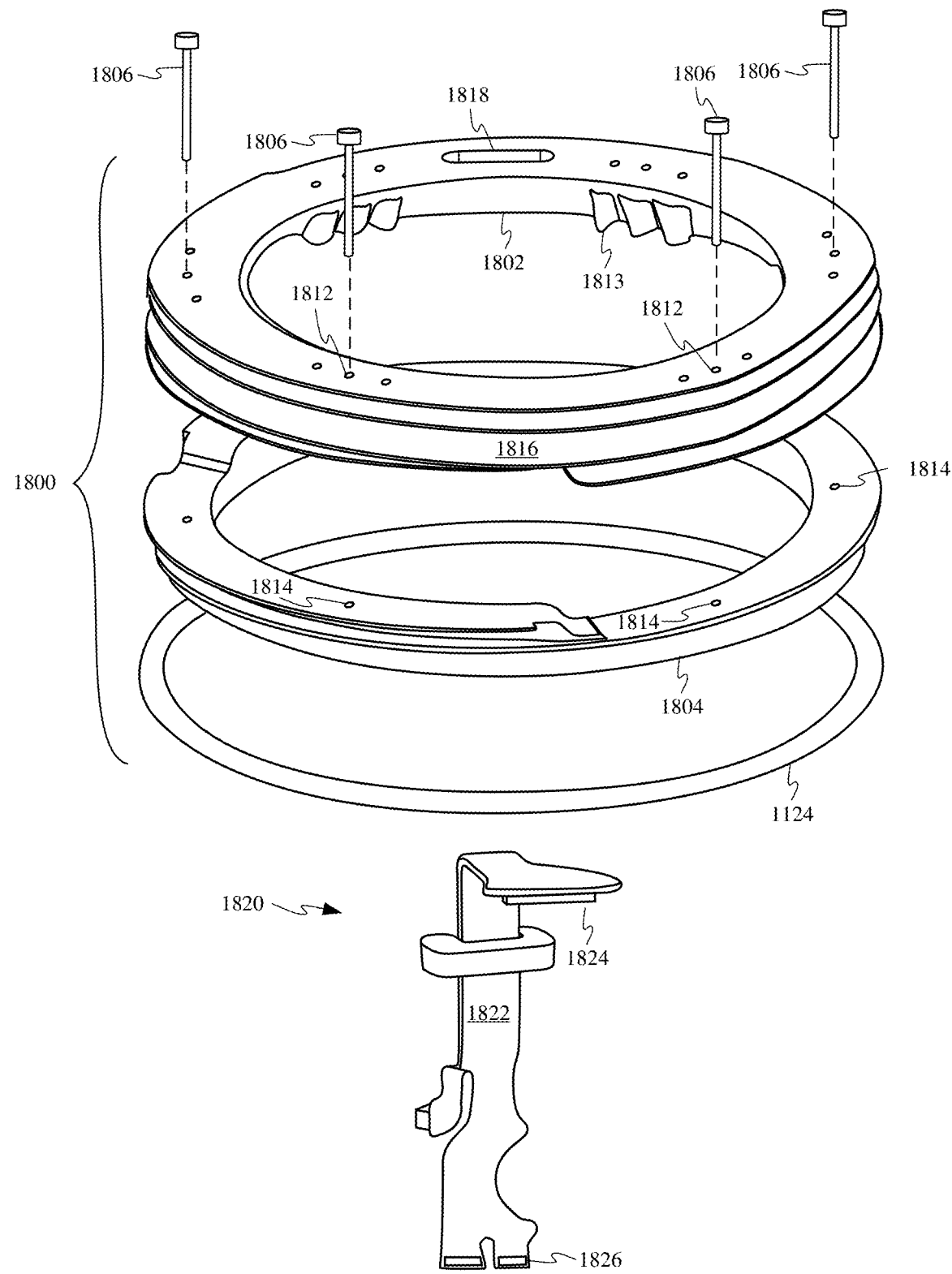
FIG. 18 shows an exploded view of a halo assembly.

FIG. 18 shows an exploded view of a halo assembly 1800. Halo assembly includes an upper ring 1802 and a lower ring 1804 that are coupled together by fasteners 1806. Both upper and lower rings 1802 and 1804 respectively define cooperatively define threading around their periphery. The threading allows the rings to twist into place within an interior volume of a speaker housing. The bottom surface of upper ring 1802 and the top surface of lower ring 1804 have complementary geometries that allow the two rings to be radially aligned. Furthermore, when the rings are radially aligned the peripheral threading continues smoothly across the interface between the two rings. For example, lower ring includes ramp feature 1808, which aligns with recessed feature 1810, when the two rings are radially aligned. Radial alignment of rings 1802 and 1804 also results in fastener openings 1812 being aligned with fastener openings 1814. Upper ring 1802 can include additional openings adjacent to each of openings 1812, which are configured to receive additional fasteners for securing other internal components to halo assembly 1800. An interior facing surface of upper ring 1802 can include protrusions helping to thicken portions of upper ring 1802 that include openings configured to receive fasteners. Halo assembly 1800 also includes seal 1124, which can be positioned within groove 1816 and function to prevent audio waves from propagating around the periphery of halo assembly 1800.

FIG. 18 also depicts flex connector 1820. Flex connector assembly 1820 can be configured to electrically couple components distributed throughout a speaker enclosure. In particular, flex connector assembly can extend through opening 1818 in upper ring 1802 to reach electrical component connectors disposed above halo assembly 1800. In some embodiments, ring 1804 can also include an opening aligned with opening 1818 to allow for the passage of flex connector substrate 1822. Flex connector substrate 1822 can take the form of a polyimide substrate. In some embodiments, flex connector assembly 1820 includes board to board connector 1824 that is configured to electrically couple with an electrical component such as touch PCB 1514 (see FIG. 15). Flex connector assembly 1820 can include other connectors such as connector 1826 that is configured to be electrically coupled with speaker drivers at the lower end of an associated speaker device.

Figure 19:
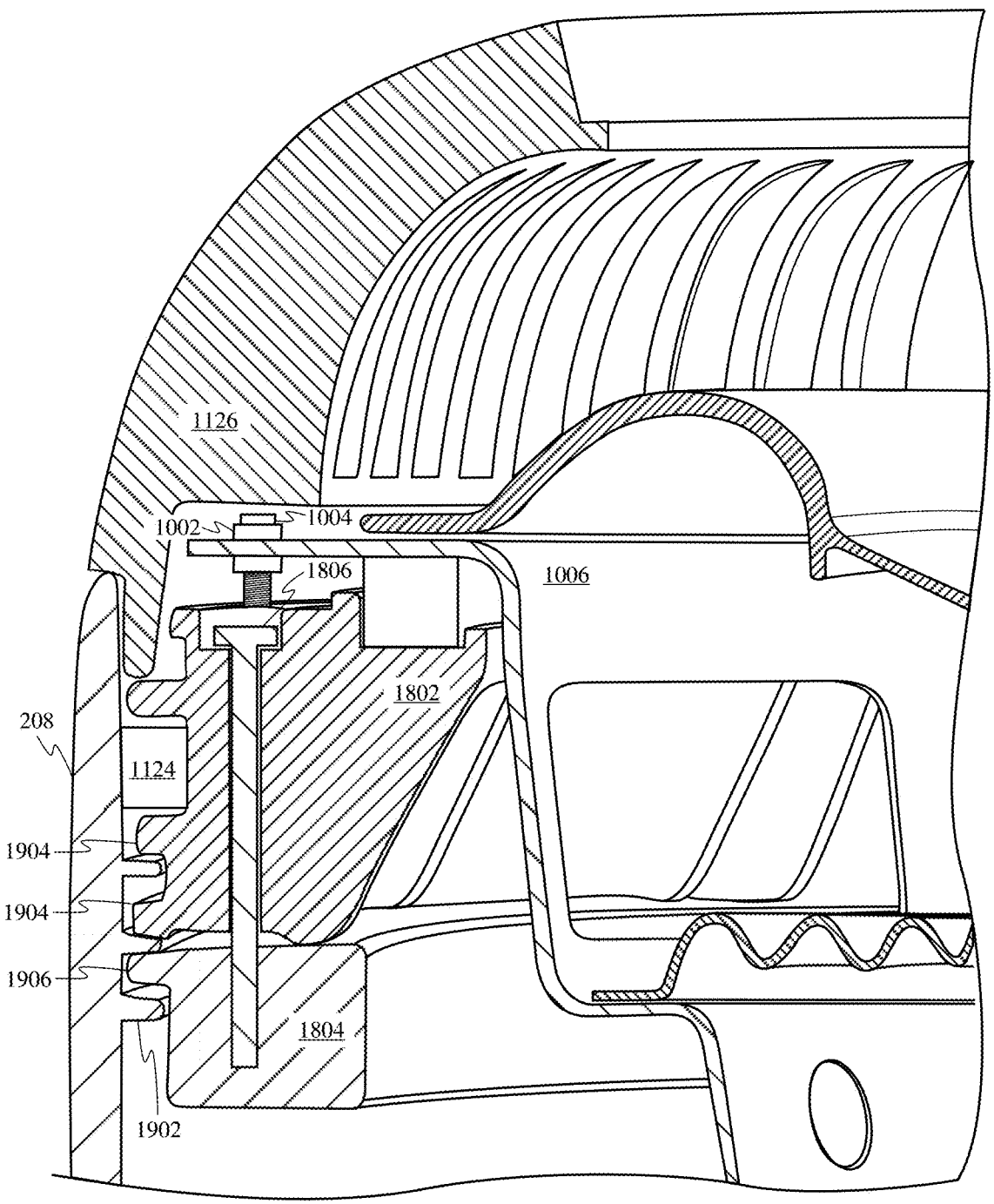
FIG. 19 shows a partial cross-sectional view of a speaker device with the halo assembly installed therein.

FIG. 19 shows a partial cross-sectional view of a speaker device with halo assembly 1800 installed therein. Upper ring 1802 is depicted in direct contact with lower ring 1804. Fastener 1806 is shown securing upper ring 1802 and lower ring 1804 together after rotating the two rings along threads 1902 of housing component 208. Prior to fastener 1806 securing the upper and lower rings 1802 and 1804 together, threading 1904 and 1906 could fit somewhat loosely between threading 1902. In this way, halo assembly is configured to rotate easily into housing component 208. Once the correct position has been achieved, fastener 1806 causes threading 1904 and 1906 to bear against threading 1902, which secures halo assembly in place and prevents vibration of halo assembly 1800 relative to housing component 208. FIG. 19 also shows how fastener 1004 associated with flange 1006 secures flange 1006 of subwoofer 802 to upper ring 1802 of halo assembly 1800.

Figure 20:
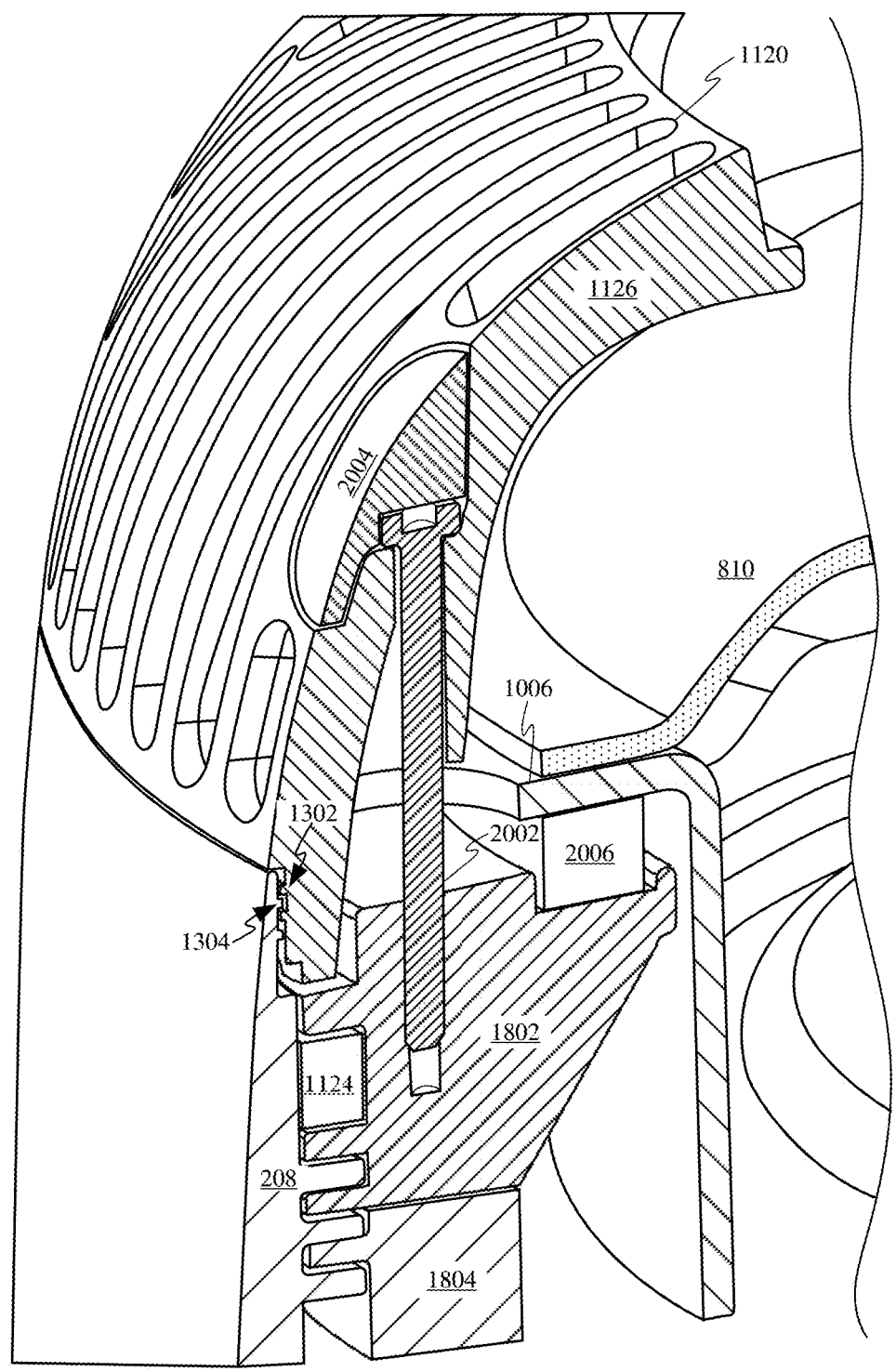
FIG. 20 shows how an upper housing component can be secured to the halo assembly by a fastener.

FIG. 20 shows how upper housing component 1126 can be secured to halo assembly 1800 by fastener 2002. Upper housing component 1126 can include a fastener opening allowing fastener 2002 to extend vertically through upper housing component 1126 and engage upper ring 1802 of halo assembly 1800. A cosmetic plug 2004 can be inserted in a recess that surrounds the opening configured to accommodate fastener 2002. Cosmetic plug 2004 prevents a fabric covering from protruding into the recess and adversely affecting the cosmetic appearance of the speaker device. FIG. 20 also shows how seal 1124 can be positioned between upper ring 1802 and lower housing component 208, which is operative to prevent audio waves from propagating around a periphery of upper ring 1802. The speaker can also include seal 2006, positioned between upper ring 1802 and flange 1006, that can help prevent audio waves from propagating through a central opening of upper ring 1802. FIG. 20 also illustrates the relative position of stepped threading 1302 of upper housing component 1126 and stepped threading 1304 of lower housing component 208.

Figure 21:
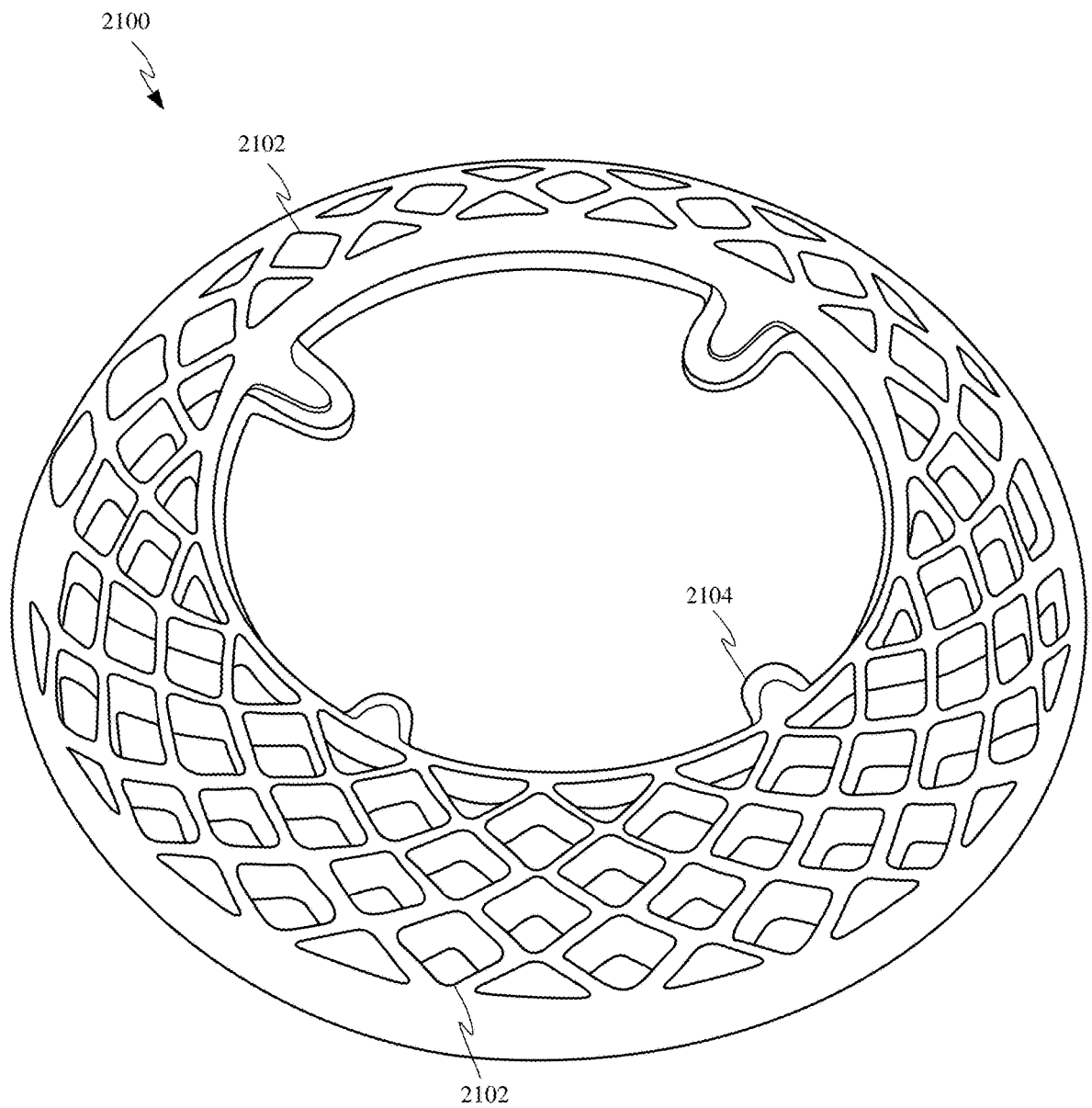
FIG. 21 shows a perspective view of an alternative upper housing component defining diamond shaped vents.

FIG. 21 shows a perspective view of an alternative upper housing component. Upper housing component 2100 includes diamond shaped vents 2102. Diamond shaped vents 2102 can have a shape similar to a pattern of acoustic fabric covering upper housing component 2100. Even when diamond shaped vents 2102 are substantially larger than the pattern of the acoustic fabric, having a similar pattern results in the pattern contours being aligned. This alignment can make the vent openings beneath the acoustic fabric substantially less likely to be seen by a user of a speaker device associated with upper housing component 2100. In some embodiments, the pattern of the acoustic fabric could be aligned with vents 2102. For example, the acoustic fabric could be aligned so that a pattern of 4 or 16 diamond patterns is aligned within each of vents 2102. In this way the edges of the patterns could be aligned, further reducing the likelihood of vents 2102 being visible to a user. Upper housing component 2100 can also include protruding support members 2104 configured to support a convex user interface along the lines of convex user interface 1500 as depicted in FIG. 15.

Figure 22:
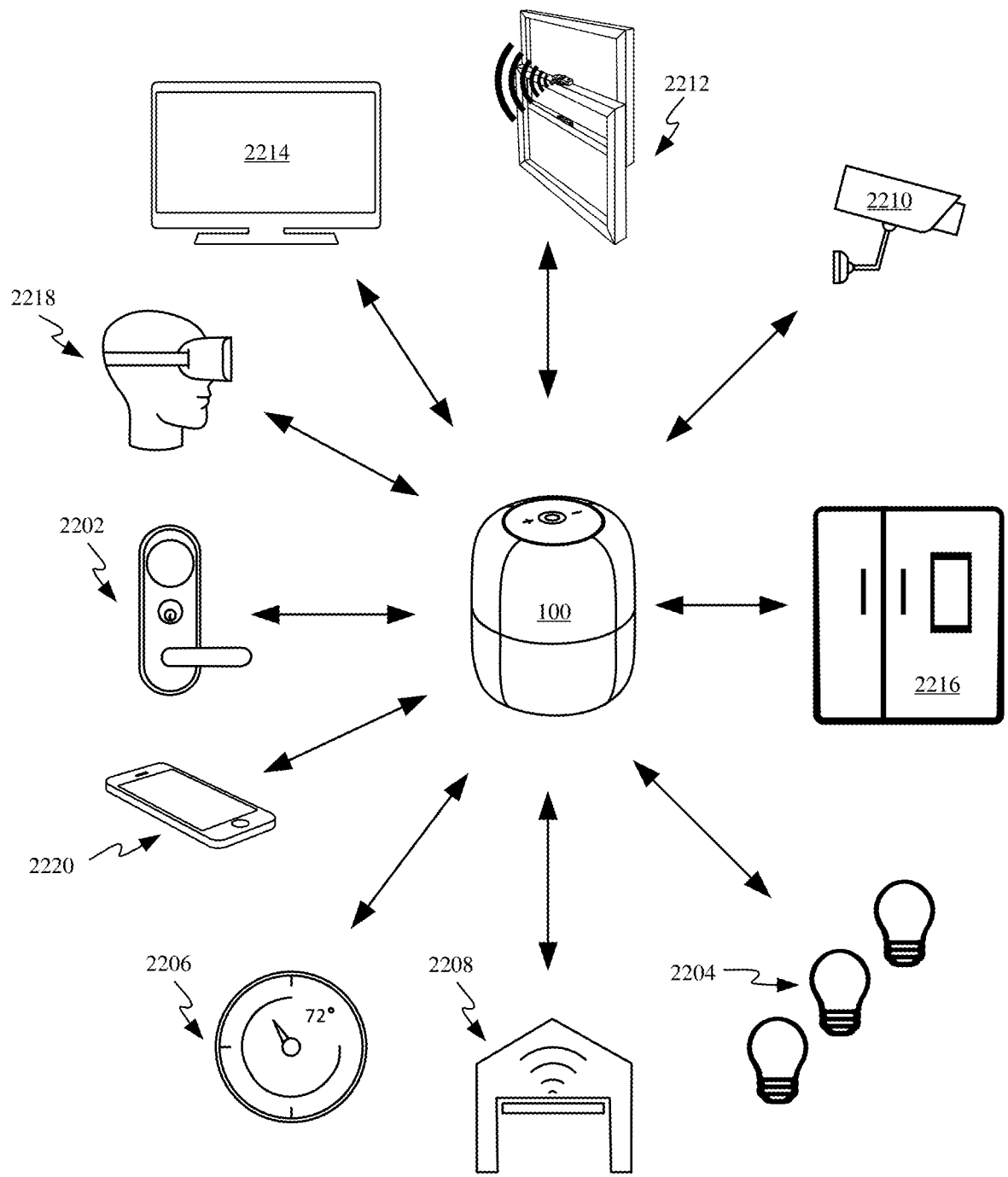
FIG. 22 shows a diagram indicating different types of connected electronics that can communicate and/or interact with array speaker.

FIG. 22 shows a diagram indicating different types of connected electronics that can communicate and/or interact with array speaker 100. In some embodiments, array speaker 100 can act as a central hub to facilitate home automation. Memory on-board array speaker 100 or memory accessible through a network, which is accessible by array speaker 100, can be used to store rules governing the interaction of the various depicted device types. Array speaker can then send instructions to the disparate devices in accordance with the stored rules. Microphones disposed within array speaker 100 can be configure to receive voice commands to carry out specific actions related to connected electronics within a user's home. In some embodiments, convex user interface can receive commands for adjusting various settings on a particular connected electronic device. For example, array speaker 100 can be configured to receive commands to make adjustments to smart locking device 2202. In some embodiments, array speaker 100 can include instructions allowing it to lock and unlock smart locking device 2202 in response to a voice command. Furthermore, array speaker 100 can be configured to alert occupants within a house that smart locking device 2202 has been unlocked. In some embodiments, array speaker 100 can announce the identity of the user who unlocked smart locking device 2202. In such a circumstance, smart locking device 2202 can be configured to open in response to a command received from an electronic device such as a mobile phone. Array speaker 100 can then identify the user when a user is associated with that mobile phone. In some embodiments, array speaker 100 can be configured to interact with other devices in response to actuation of smart locking device 2202. For example, array speaker could direct the illumination of one or more of lights 2204 and adjust a temperature of an HVAC system associated with smart thermometer 2206 in response to the unlocking event.

FIG. 22 also shows communication between array speaker 100 and smart garage opener 2208. In response to detecting an opening event of smart garage opener 2208, array speaker could be configured to perform similar actions described above with respect to the operation of smart locking device 2202. In some embodiments, different ones of lights 2204 could be illuminated in anticipation of the user entering the housing from a different direction.

Array speaker 100 could also be configured to operate different smart devices in accordance with various calendar events associated with an electronic calendar. For example, array speaker could be configured to disable surveillance camera 2210 during an event located in the same room as surveillance camera 2210 when that event is marked as private. Array speaker could also be configured to notify one or more users if window sensor 2212 indicates a window remains open after a particular time of day or night. In some embodiments, array speaker 100 can act as a media hub cooperating with other components such as television/monitor 2214 to present both video and audio content in response to various user inputs and/or smart device activities. For example, televisions/monitor 2214 could present a status screen and/or progress monitor indicating the status and/or activity being performed by other components that may or may not have the ability to present a graphical interface to a user of array speaker 100. In some embodiments, array speaker could be configured to remotely direct refrigerator 2216 to send the user images of interior areas of refrigerator 2216 shortly before a user has a grocery shopping trip scheduled. While these various operations could be stored in internal memory of array speaker 100, array speaker 100 can also be in communication with a cloud service provider helping to coordinate various activities with users that may or may not be connected with a local area network with array speaker 100. For example, a user could connect remotely with array speaker 100 with a device such as a smart phone to activate certain tasks for smart components with which array speaker 100 is in communication.

In some embodiments, array speaker can be configured to interact with wearable display 2218. Wearable display 2218 can take the form of augmented reality or virtual reality goggles that present digital content to a user. When wearable display 2218 is an augmented reality display, wearable display 2218 can overlay various control interfaces around array speaker 100. For example, virtual content could overlay convex user interface atop array speaker 100 to make the user interface larger. In some embodiments, the enlarged user interface could include an expanded display and enlarged control manipulation regions that allow a user to control array speaker 100 with more efficiently and/or with a greater degree of options. For example, user interface could be configured to display a virtual graphics equalizer allowing a user to increase or reduce treble and/or bass output associated with the audio being generated by array speaker 100. In some embodiments, a user could be presented with an overlay that visualized the various regions of the room covered by each of a number of speaker drivers contained within array speaker 100. The user could then be able to adjust audio output specific to a particular region associated with one or more speaker drivers. For example, the user could identify only the depicted regions containing individuals listening to the audio output from array speaker 100. Furthermore, the user could reduce the audio output for a first user positioned in a first region of the array speaker associated with a first audio driver and increase the audio output for a second user positioned in a second region of the array speaker associated with a second audio driver. In this way, listeners can enjoy audio at a desired volume and the virtual interface allows the user to quickly identify the regions within which various listeners are located. In some embodiments, array speaker 100 can include various indicia that help circuitry and sensors associated with wearable display 2218 to orient the virtual content relative to array speaker 100. For example, since array speaker 100 is cylindrical it could be difficult to determine a radial position of each of the speaker drivers within array speaker 100. Small indicia such as decorative symbols could be embedded within acoustic fabric covering array speaker 100. In this way, the various listening zones could be more accurately associated with array speaker 100. In some embodiments, array speaker 100 can include optical sensors configured to identify the position of various listeners in a room and then change the audio output to improve the audio experience for the identified listeners.

In some embodiments, wearable display device can be configured to receive optical commands from array speaker 100. For example, a display associated with a user interface can be configured to output particular patterns of light. Optical sensors of wearable display device 2218 can identify the patterns of light and in response vary the display in some manner. For example, the type, size and orientation of virtual controls displayed by wearable display 2218 can be varied in accordance with the output of the display associated with the user interface.

Figure 23:
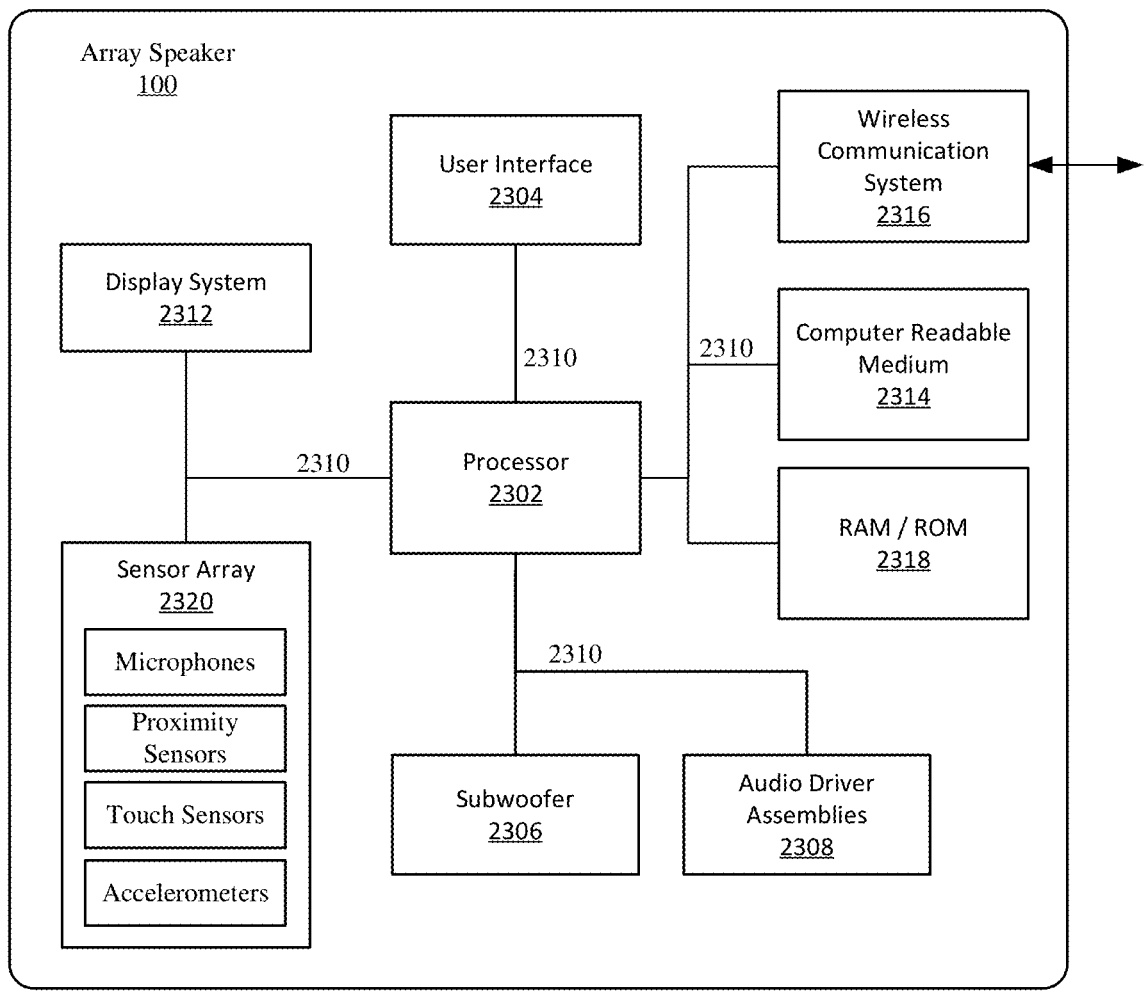
FIG. 23 shows a block diagram illustrating communication and interoperability between various electrical components of an array speaker.

FIG. 23 shows a block diagram illustrating communication and interoperability between various electrical components of array speaker 100. Processor 2302 can be in communication with the depicted electrical components. User interface 2304 can receive user inputs that are then received by processor 2302. In response to the user inputs, processor 2302 can interpret and relay signals corresponding to the received user inputs to other electrical components. For example, user interface can receive user inputs directing an increase in output of both subwoofer 2306 and audio driver assemblies 2308. In some embodiments, the electrical components can all be linked together by electrically conductive pathways established by components such as flex connector 1820, which is able to route electrical signals to various electrical components distributed throughout a device housing of array speaker 100. Array speaker 100 can also include display system 2312. Display system 2312 can be configured to provide visual feedback to a user of array speaker 100. For example, the visual feedback can be provided in response to interaction with a voice assistant such as the Ski® voice assistant produced by Apple Inc., of Cupertino, Calif. In some embodiments, an array of colorful mosaic patterns could be presented while a voice request is being processed and/or as the voice assistant is waiting for the voice request. Array speaker can also include a computer-readable medium 2314. Computer-readable medium 2314 can be configured to store or at least cache an amount of media files for playback by subwoofer 2306 and audio driver assemblies 2308. In some embodiments, the media files stored on computer-readable medium 2314 can include, e.g., movies, TV shows, pictures, audio recordings and music videos. In some embodiments, a video portion of a media file can be transmitted to another device for display by wireless communication system 2316. This could be desirable even when display system 2312 is showing the video portion since another device may have a larger or more easily viewable display for a particular user. For example, the other display device could be selected in accordance with a user's position within a room.

FIG. 23 also shows RAM/ROM component 2318. RAM/ROM component 2318 can include RAM (random access memory) for short term caching of frequently used information and/or information cued just prior to playback. ROM (read only memory) can be used to store computer code such as device drivers and lower level code used in the basic operation of array speaker 100. In some embodiments, RAM/ROM component 2318 can take the form of two separate components.

FIG. 23 also shows how array speaker 100 can also include a sensor array 2320 that includes microphones, proximity sensors, touch sensors, accelerometers and the like. Microphones of sensor array 2320 could be configured to monitor for voice commands. In some embodiments, the microphones could be configured to process voice commands only after recognizing a command phrase indicating the user's intent to issue a voice command. Microphones can be interspersed radially along the outside of the device housing so that the housing doesn't mask or obscure the voice commands. Multiple microphones can also be utilized to triangulate a position of a user within the room. In certain instances it may be desirable to optimize audio output or cue additional smart devices (see FIG. 22) in accordance with a determined location of the user.

In addition to identifying a user's location by triangulation with spatially dispersed microphones, proximity sensors can be distributed along the exterior surface of array speaker 100 in order to help identify the presence of users and/or obstructions surrounding array speaker 100. In some embodiments, the proximity sensors can be configured to emit infrared pulses that help characterize objects surrounding array speaker 100. The pulses reflected back to the sensor can be processed by processor 2302, which can then make a characterization of any objects surrounding array speaker 100. In some embodiments, an audio output of array speaker 100 can be adjusted in situations where surrounding objects substantially change the expected audio output of array speaker 100. For example, if array speaker 100 is positioned against a wall or column the infrared sensors could identify the obstruction and attenuate or cease output of speaker drivers pointed toward the wall or column. The reflected pulses and audio triangulation data can be combined to further refine the position of a user delivering instructions to array speaker 100. Sensor array 2320 can also include touch sensors that allow a user to input commands along an exterior surface of array speaker 100. For example, touch PCB 1514 of the convex user interface depicted in FIG. 15 is configured to detect user gestures made along top cap 1542 and interpret the gestures as various instructions to be carried out by one or more components of array speaker 100.

Sensor array 2320 can also include one or more accelerometers. The accelerometers can be configured to measure any tilt of array speaker 100 with respect to a gravitational reference frame. Since array speaker 100 is optimized to evenly distribute audio content in a room when positioned on a flat surface, placing array speaker 100 on an inclined or declined surface could negatively impact the acoustic output of array speaker 100. In response to the accelerometer determining array speaker 100 is tilted at an angle of greater than 2 degrees, array speaker could be configured to prompt the user to find a flatter surface to place array speaker on. Alternatively, array speaker can be configured to alter the sound output to compensate for the tilted angle. In some embodiments, accelerometers could also be configured to monitor for any resonant vibrations within array speaker 100. Processor 2302 could then be configured to adjust the audio output to help subwoofer 2306 and/or audio driver assemblies 2308 avoid or reduce the generation of frequencies that cause array speaker 100 to vibrate at one or more resonant frequencies.

The various aspects, embodiments, implementations or features of the described embodiments can be used separately or in any combination. Various aspects of the described embodiments can be implemented by software, hardware or a combination of hardware and software. The described embodiments can also be embodied as computer-readable code on a computer-readable medium for controlling operation of the array speaker. In some embodiments, the computer-readable medium can include code for interacting with other connected devices within a user's home. For example, the array speaker could be configured to use its ambient light sensor to identify human activity and to learn when to activate and deactivate certain devices within the user's home. The computer-readable medium is any data storage device that can store data, which can thereafter be read by a computer system. Examples of the computer-readable medium include read-only memory, random-access memory, CD-ROMs, HDDs, DVDs, magnetic tape, and optical data storage devices. The computer-readable medium can also be distributed over network-coupled computer systems so that the computer-readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A voice-controlled electronic device comprising:
a device housing having a longitudinal axis bisecting opposing top and bottom surfaces and a side surface extending between the top and bottom surfaces;
a computer-readable memory disposed within the device housing;
a microphone disposed within the device;
a processor disposed within the device housing and coupled to the computer-readable memory, the processor configured to execute computer instructions stored in the computer-readable memory for interacting with a user and processing voice commands received by the microphone after recognizing a command phrase indicating a user's intent to issue a voice command;
a main logic board disposed within the device housing and having the processor mounted thereon;
a first transducer disposed within the device housing and configured to generate sound waves within a first frequency range;
a second transducer disposed within the device housing and configured to generate sound waves within a second frequency range lower than the first frequency range, the microphone being configured to received sound reflected off an obstruction in vicinity of the device and the processor configured to adjust an audio output of the first transducer or the second transducer based on the received sound reflected off the obstruction;
an outer cover having a pattern formed thereon and disposed over the side surface of the device housing concealing audio components positioned beneath the outer cover, wherein the outer cover provides a consistent exterior surface of the voice-controlled electronic device and allows audio waves generated by the first transducer and second transducer to pass through the outer cover;
a touch-sensitive user interface disposed at the top surface of the device housing, the touch-sensitive user interface including first and second touch buttons symmetrically positioned on opposite sides of the longitudinal axis, the first touch button enabling a user to increase speaker volume and the second touch button enabling a user to decrease speaker volume;
a second circuit board disposed within the device housing along a plane that is spaced apart from the touch-sensitive user interface and perpendicular to the longitudinal axis; and
a power supply unit disposed within the device housing and configured to supply power to the voice-controlled electronic device.

2. The voice-controlled electronic device set forth in claim 1 wherein the device is configured to identify a position of a user by triangulation with a plurality of proximity sensors.

3. The voice-controlled electronic device set forth in claim 1 wherein the second circuit board comprises a plurality of LEDs formed thereon that are aligned to illuminate one or more portions of the touch-sensitive user interface.

4. The voice-controlled electronic device set forth in claim 1 wherein the touch-sensitive user interface comprises capacitive touch sensors.

5. The voice-controlled electronic device set forth in claim 4 further comprising one or more light emitting diodes arranged to illuminate different regions of the touch-sensitive user interface.

6. The voice-controlled electronic device set forth in claim 1 further comprising a wireless communication system disposed within the device housing.

7. The voice-controlled electronic device set forth in claim 1 further comprising circuitry configured to implement beamforming techniques to improve audio performance.

8. The voice-controlled electronic device set forth in claim 7 wherein the beamforming techniques generate constructive interference.

9. The voice-controlled electronic device set forth in claim 1 further comprising a plurality of proximity sensors configured to emit pulses of radiation that the processor uses to characterize objects surrounding the voice-controlled electronic device.

10. The voice-controlled electronic device set forth in claim 9 wherein the plurality of proximity sensors emit pulses of infrared radiation.

11. The voice-controlled electronic device set forth in claim 9 wherein the processor is configured to alter an output of the first transducer or the second transducer based on feedback from the proximity sensors.

12. The voice-controlled electronic device set forth in claim 1 further comprising an amplifier board electrically coupled to the power supply unit and configured to provide power to the first and second transducers.

13. The voice-controlled electronic device set forth in claim 1 wherein the top and bottom surfaces of the device housing are parallel to each other and generally perpendicular to the side surface.

14. The voice-controlled electronic device set forth in claim 1 wherein the first transducer is part of a transducer array that comprises a plurality of transducers radially distributed around the device housing.

15. The voice-controlled electronic device set forth in claim 14 wherein each transducer in the transducer array includes two adjacent transducers and is equally spaced from each of the two adjacent transducers.

16. A voice-controlled electronic device comprising:
a device housing having a longitudinal axis bisecting opposing top and bottom surfaces and a side surface extending between the top and bottom surfaces;
a computer-readable memory disposed within the device housing;
a microphone disposed within the device housing;
a processor disposed within the device housing and coupled to the computer-readable memory, the processor configured to execute computer instructions stored in the computer-readable memory for interacting with a user via a voice assistant by processing voice commands received by the microphone;
a wireless communication system disposed within the device housing;
a first transducer disposed within the device housing and configured to generate sound waves within a first frequency range;
a second transducer disposed within the device housing and configured to generate sound waves within a second frequency range lower than the first frequency range, the microphone being configured to received sound reflected off an obstruction in vicinity of the device and the processor configured to adjust an audio output of the first transducer or the second transducer based on the received sound reflected off the obstruction;
an outer cover having a pattern formed thereon and disposed over the side surface of the device housing concealing audio components positioned beneath the outer cover, wherein the outer cover provides a consistent exterior surface of the voice-controlled electronic device and allows audio waves generated by the first transducer and the second transducer to pass through the outer cover;

a touch-sensitive user interface disposed at the top surface of the device housing, the touch-sensitive user interface comprising capacitive touch sensors arranged to implement first and second touch buttons symmetrically positioned on opposite sides of the longitudinal axis, the first touch button enabling a user to increase speaker volume and the second touch button enabling a user to decrease speaker volume;

a main logic board disposed within the device housing and having the processor mounted thereon;

a second circuit board disposed within the device housing along a plane that is spaced apart from the touch-sensitive user interface and perpendicular to the longitudinal axis, the second circuit board having a plurality of LEDs formed thereon that are aligned to illuminate one or more portions of the touch-sensitive user interface;

a power supply unit disposed within the device housing and configured to supply power to the voice-controlled electronic device; and an amplifier board electrically coupled to the power supply unit and configured to provide power to the first and second transducers.

17. The voice-controlled electronic device set forth in claim 16 further comprising a wireless communication system disposed within the device housing.

18. The voice-controlled electronic device set forth in claim 17 further comprising circuitry configured to implement beamforming techniques to improve audio performance.

19. The voice-controlled electronic device set forth in claim 18 wherein the beamforming techniques generate constructive interference.

20. The voice-controlled electronic device set forth in claim 16 further comprising a plurality of proximity sensors configured to emit pulses of infrared radiation that the processor uses to characterize objects surrounding the voice-controlled electronic device and wherein the processor is further configured to alter an output of the first transducer or the second transducer based on feedback from the proximity sensors.

* * * * *